US010371877B2

(12) United States Patent
Uno et al.

(10) Patent No.: US 10,371,877 B2
(45) Date of Patent: Aug. 6, 2019

(54) LIGHTING DEVICE, DISPLAY DEVICE, AND TELEVISION DEVICE

(71) Applicant: SHARP KABUSHIKI KAISHA, Sakai, Osaka (JP)

(72) Inventors: Makoto Uno, Sakai (JP); Akira Gotou, Sakai (JP); Keitaro Matsui, Sakai (JP); Masanobu Harada, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 0 days.

(21) Appl. No.: 15/744,855

(22) PCT Filed: Sep. 23, 2016

(86) PCT No.: PCT/JP2016/077955
§ 371 (c)(1),
(2) Date: Jan. 15, 2018

(87) PCT Pub. No.: WO2017/051845
PCT Pub. Date: Mar. 30, 2017

(65) Prior Publication Data

US 2018/0210129 A1 Jul. 26, 2018

(30) Foreign Application Priority Data

Sep. 24, 2015 (JP) ................................ 2015-186901
Sep. 24, 2015 (JP) ................................ 2015-186958
Sep. 25, 2015 (JP) ................................ 2015-188571

(51) Int. Cl.
*F21V 8/00* (2006.01)
*F21S 2/00* (2016.01)
(Continued)

(52) U.S. Cl.
CPC .............. *G02B 6/0023* (2013.01); *F21S 2/00* (2013.01); *G02B 5/08* (2013.01); *G02B 5/20* (2013.01);
(Continued)

(58) Field of Classification Search
CPC .. G02B 6/0023; G02B 6/0088; G02B 6/0061; G02B 6/0055; G02B 6/005;
(Continued)

(56) References Cited

U.S. PATENT DOCUMENTS 8,436,388 B2 * 5/2013 Lim .................... G02B 6/0028 257/294
8,585,273 B2 * 11/2013 Pokrovskiy .......... G02B 6/0028 362/231
(Continued)

FOREIGN PATENT DOCUMENTS

EP 2476952 A2 7/2012
JP 3114805 B 12/2000
(Continued)

*Primary Examiner* — Kevin Quarterman
(74) *Attorney, Agent, or Firm* — ScienBiziP, P.C.

(57) ABSTRACT

A lighting device includes a light source array, a wavelength converting member, and a light guide plate. The light source array includes light sources configured to emit primary light rays. The wavelength converting member includes a wavelength converting portion, a holding portion, and non-wavelength converting portions. The wavelength converting portion contains phosphors configured to emit secondary light rays when excited by the primary light rays. The wavelength converting member is disposed between the light guide plate and the light source array. The light guide plate includes a light entering surface, a light exiting surface, an opposite surface that is on an opposite side from the light exiting surface, and a light reflecting and scattering pattern. The light reflecting and scattering pattern includes complementary color dots formed in sections of the opposite
(Continued)

surface on non-wavelength converting portion sides. The complementary color dots absorb the primary light rays.

11 Claims, 54 Drawing Sheets

(51) Int. Cl.
*G02B 5/08* (2006.01)
*G02B 5/20* (2006.01)
*H01L 33/50* (2010.01)

(52) U.S. Cl.
CPC .......... *G02B 6/005* (2013.01); *G02B 6/0043* (2013.01); *G02B 6/0055* (2013.01); *G02B 6/0061* (2013.01); *G02B 6/0088* (2013.01); *H01L 33/50* (2013.01); *G02B 6/0068* (2013.01)

(58) Field of Classification Search
CPC .......... G02B 6/0043; G02B 5/20; G02B 5/08; G02B 6/0068; H01L 33/50; F21S 2/00
See application file for complete search history.

(56) References Cited

U.S. PATENT DOCUMENTS

| | | | | |
|---|---|---|---|---|
| 9,199,842 | B2 * | 12/2015 | Dubrow ................ | B82Y 20/00 |
| 9,500,796 | B2 * | 11/2016 | An ...................... | G02B 6/0023 |
| 9,784,900 | B2 * | 10/2017 | Miki .................... | G02B 6/0026 |
| 9,864,121 | B2 * | 1/2018 | Nick .................... | G02B 6/0001 |
| 2006/0255711 | A1 * | 11/2006 | Dejima ................ | G02B 6/0023 313/485 |
| 2012/0182762 | A1 | 7/2012 | Hu et al. | |
| 2013/0294107 | A1 | 11/2013 | Ohkawa et al. | |
| 2014/0036203 | A1 | 2/2014 | Guillou et al. | |
| 2016/0327723 | A1 | 11/2016 | Ohkawa et al. | |

FOREIGN PATENT DOCUMENTS

| | | |
|---|---|---|
| JP | 2006-291064 A | 10/2006 |
| JP | 2013-218954 | 10/2013 |
| JP | 2014-225379 A | 12/2014 |

* cited by examiner

10TV
10Cb
10S
10P
10T
Y
X
Z
A
A
10
10Ca 10
11
12
13
14b
15
16
161
162
17
17a
18
18a
19
190
19c
20
21
22b (22)
22b (22)
22b (22)
22b (22)
30
31
33 (32)
L
Y
Z

R2
19f
193
35
(32)
Y
X
18
17
170
30
33
(32)
31
19c
190
L
R22
19
191
19a
19d
130
R11
R1
19e
192
34
(32)

S4
19e
192
22a
(22)
34
(32)
18
19b
17
30
19
191
170
19d
220
19c
190
22a
(22)
33
(32)
22b
(22)
31
S3
S5
19f
S2
193
S1
35
(32)
Y
X

R2
19f
193
R22
19A
30A2
33 (32)
31
19c
R3
R33
19a
19d
130
30A1
R11
R1
19e
192
34 (32)
35 (32)
18A1
18A2
17
170A1
170A2
X
Y 19b
191
19d
220A
22a (22)
22b (22)
19f
22a
(22)
193
19e
22a
(22)
192
34
(32)
18A1
33
(32)
17
30A1
31
19c
190
35
(32)
34
(32)
31
17
33
(32)
17
17
30A2
18A2
35
(32)
X
Y 10B
15
11
19a
19
20
14
12B
22b (22)
19b
14a
21
190
19c
61
161
60
13
63
16
64
33 (32)
31
30B
62
17a
17
18a
18
162
14b
Y
Z 19F
23
24
19b
22Fa
(22F)

8010
8013
8016
8019d
8014b
80162
80161
80191
8021
8019b
8019a
8012
8020
8011
8019
8015
8014a
8014
80190
8019c
8033
(8032)
8030
8031
8017
8018
Y
Z

R2
8019f
80193
8035
(8032)
8018
Y
X
R22
8017
8017
8030
8017
8033
(8032)
8017
8019
80191
8019c
8017
8019a
80190
80170
8017
8031
8019d
8017
L
8017
80130
8017
R11
8017
R1
8019e
80192
8034
(8032)

8019b
8019e
8022
80192
8022a
8034
(8032)
8018
8019
8017
8030
80191
8019c
8019d
80190
80170
8033
(8032)
8022a
8031
8019f
80193
8035
(8032)
X
Y 8023
8019f
80193
8018
Y
X
8017
8019a
8019
8019c
80191
80190
8019d
8020
C
B
8019e
80192

8010
8011
8015
8021
8013
80161
8016
80162
8014b
8023
8019e
80192
8014
8014a
8019b
12
8020
8019
8019a
Z
X 8012B
8023
8019f
80193
8021
8019
8023B
8019a
8019d
8023
8019e
80192
8035A2
(8032A2)
8018
Y
X
8017
8031A2
8030A2
8033A2
(8032A2)
8019c
8034A2
(8032A2)
80170
8035A1
(8032A1)
8030A1
8031A1
8033A1
(8032A1)
8034A1
(8032A1)

8010C
8011
8015
8019a
8019
8020
8012C
8014a
8014
8021
8031C
8061
8060
8016
8013
8019c
8032C
8030C
8017a
8018
8063
162
8064
8014b
8017
Y
Z 9012
9014c
9019d2 (9019d)
9034
9032
9020EP1 (9020EP)
9031
9017
9019b
9017a
9020b
9020a
9014c
9020CP
9018a
9018
9030
9020
9019a
9019
9019d1 (9019d)
9014
9020EP2 (9020EP)
9030a
X
Y 9010
9012
9011
9013
9014
9014a
9014c
9015
9016
9016a
9016b
9017
9017a
9018
9018a
9019
9019a
9019b
9019c
9019d1
(9019d)
9020
9020a
9020b
9021
9022
9023
9024
9025
9029
9030
viii
Y
Z 9010
9011
9012
9013
9014
9014a
9014c
9015
9016
9016a
9016b
9019
9019a
9019c
9019d2
(9019d)
9021
9022
9023
9024
9025
9032
9034
X
Z 9010
9012
9014a
9014
9019
9019a
9015
9021
9022
9023
9019c
9025
9011
9019b
9024
9020b
9020
9016a
9029
9030
9020a
9016
9013
9014c
9018
9018a
9017
9017a
9016b
Y
Z 9012
9014c
9019d2
(9019d)
9034
9032
9020EP1
(9020EP)
9031
9017
9017a
9019a
9019
9029
9020b
9020a
9020CP
9018a
9018
9030
9020
9019d1 (9019d)
9014
9019b
9020EP2
(9020EP)
9030a
X
Y 90112
90119
90119d2
90134
90132
90120EP1
90117
90129
90130
90120
90119b
90120EP2
90130a
X
Y 90119
90134
90132
90119d2
90119b
90130
90120
90120EP1
90117
90129
90112
90117
90120EP2
90119d2
90134
90132
90130a
X
Y 90219
90219d2
90232
90234
90231
90220EP1
(90220EP)
90220
90229
90219b
90217
90218
90220EP2
(90220EP)
90230
90230a
90212
X
Y 90319
90319d2
90332
90334
90320EP1
(90320EP)
EA
90320
90319b
90330
90320EP2
(90320EP)
9036
(9037)
xvi
90317
90329
90330a
NEA
X
Y EA
NEA
90319a
90319
9036
90319b
9037
90320EP2
(90320EP)
90320
90330a
90317
90318
Y
Z 90812
90819
90819b
9040
9038a
9038
9039
90820b
9038b
90820
9038a
9038b
90818a
90820a
90818
90817
90817a
Y
Z 901020EP2
901034
901032
901019d2
(901019d)
901019
901020EP1
901017
901012
901018
901014c
901019b
901020
901014
X
Y 901112
901120EP1
901117
901120
901119b
901118
901114c
901119
901119d2
(901119d)
901132
901134
901114
Y
X 901212
901234
901232
901219d
(901219d1,
901219d2)
901217
901219
901214c
901218
901219b
901220
901214
X
Y 901332
901331
901320EP1
(901320EP)
XXIX
XXIX
901319
901319b
901329
901320
X
Y

LIGHTING DEVICE, DISPLAY DEVICE, AND TELEVISION DEVICE

TECHNICAL FIELD

The present invention relates to a lighting device, a display device, and a television device.

BACKGROUND ART

A liquid crystal display device includes a liquid crystal panel and a lighting unit (a backlight unit) configured to supply light to the liquid crystal panel. A so-called edge light type (or a light side type) lighting unit including light emitting diodes (LEDs) disposed along an end surface of a light guide plate has been known as a lighting unit of this kind. The lighting unit is disposed behind the liquid crystal panel and configured to emit planar light toward the back surface of the liquid crystal panel.

In recent years, an edge light type lighting unit including a phosphor tube as a wavelength converting member (e.g., Patent Document 1). The phosphor tube includes quantum dot phosphors dispersed in a resin and a glass tube that is filled with the resin and sealed. In such a lighting unit, a longitudinal phosphor tube is disposed between LEDs and an end surface of a light guide plate through which light enters (a light entering surface).

When primary light rays emitted by the LEDs (e.g., blue light rays) are supplied to the phosphor tube, some of the light rays excite the quantum dot phosphors inside the phosphor tube and the rest of the light rays pass through the phosphor tube. When the quantum dot phosphors are excited by the primary light rays, the quantum dot phosphors emit secondary light rays with wavelengths different from the wavelength of the primary light rays (e.g., green light rays and red light rays). Namely, the quantum dot phosphors have a function to convert the primary light rays into the secondary light rays. The secondary light rays emitted by the phosphor tube are mixed with the primary light rays that pass through the phosphor tube. Therefore, white light rays are emitted by the phosphor tube.

Another example of a backlight is described in Patent Document 2. A planer light source, that is, the backlight described in Patent Document 2 includes LEDs, a wavelength converting member, and a light guide plate. The LEDs are configured to emit blue light rays. The wavelength converting member includes phosphors that produce fluorescence when excited by the light rays emitted by the LEDs. The light guide plate is disposed such that the wavelength converting member is between the LEDs and the light guide plate. The light rays emitted by the LEDs and the light rays emitted by the phosphors are mixed together. The mixed light rays enter the light guide plate through an end surface of the light guide plate and exit through a light emitting view surface.

RELATED ART DOCUMENT

Patent Document

Patent Document 1: Unexamined Japanese Patent Application Publication No. 2014-225379

Patent Document 2: Japanese Patent publication No. 3114805

Problem to be Solved by the Invention

In the lighting unit described in Patent Document 1, ends of the phosphor tube in the longitudinal direction are made of a material having light transmissivity (e.g., glass) and do not contain the quantum dot phosphors. The primary light rays from the LEDs supplied to the ends of the phosphor tube pass through the ends without wavelength conversion. Namely, light rays exiting from the ends of the phosphor tube and traveling toward the light guide plate include the primary light rays with a higher percentage. The light rays enter the light guide plate through the light entering surface, linearly travel through the light guide plate, and exit through a plate surface of the light guide plate on the front side. In such a case, that is, in which the light rays including the primary light rays with the higher percentage travel through the light guide plate and exit the light guide plate, planar light emitted by the lighting unit may include light rays exiting from areas of the light guide plate which linearly extend from ends of the phosphor tube in an emitting direction of the light rays from the LEDs tinted with a color of the primary light rays from the light sources more than the light rays exiting from other areas.

The wavelength converting member described in Patent Document 2 extends along a longitudinal direction of an end surface of the light guide plate. The ends of the wavelength converting member in the longitudinal direction include sections that do not include the phosphors. If a frame size of the backlight unit is further decreased, the sections of the wavelength converting member which do not include the phosphors are more likely to be located at positions that overlap the LEDs. As a result, the light rays from the LEDs enter the light guide plate through ends of the end surface of the light guide plate in the longitudinal direction without wavelength conversion by the phosphors. This may cause color unevenness.

DISCLOSURE OF THE PRESENT INVENTION

An object of the present invention is to provide a technology for reducing color unevenness in light that is emitted by an edge light type lighting device using a wavelength converting member, where the color unevenness may result from light rays exiting from areas that linearly extend from ends of the wavelength converting member in an emitting direction of the light rays from light sources and being tinted with a color of the primary light rays from the light sources more than light rays exiting from other areas.

Means for Solving the Problem

A first aspect of the present invention is a lighting device including a light source array, at least one wavelength converting member, and a light guide plate. The light source array includes light sources configured to emit primary light rays in a predefined wavelength range and arranged in line. The at least one wavelength converting member is disposed along a length direction of the light source array to be opposed to the light source array. The at least one wavelength converting member includes a wavelength converting portion, a holding portion, and a non-wavelength converting portion. The wavelength converting portion contains phosphors configured to emit secondary light rays in a wavelength range different from the wavelength range when excited by the blue light rays. The holding portion holds the wavelength converting portion to surround the wavelength converting portion. The holding portion has light transmissivity and an elongate shape. The non-wavelength converting portion is formed at an end of the holding portion with respect to a longitudinal direction of the holding portion. The non-wavelength converting portion is configured to pass the primary light rays emitted by the light sources. The at least one wavelength converting member is disposed between the light guide plate and the light source array. The light guide plate includes a light entering surface through which light rays enter, a light exiting surface through which the light rays exit, an opposite surface, and a light reflecting and scattering pattern. The light rays include the primary light rays and the secondary light rays that are converted from the primary light rays emitted by the light sources and travel through the at least one wavelength converting member from a light source side to a light guide plate side. The opposite surface is disposed on an opposite side from the light exiting surface. The light reflecting and scattering pattern has light reflectivity and a light scattering property. The light reflecting and scattering pattern includes dots that are formed to be two-dimensionally dispersed on the opposite surface. Some of the dots are complementary color dots that are disposed along a light emitting direction of the light source on a light guide plate side of the non-wavelength converting portion and configured to absorb the primary light rays and exhibit a complementary color of a reference color exhibited by the primary light rays. With the above configuration, in the lighting device according to the present invention, the light rays exiting from a section that linearly extends from the end portion of the wavelength converting member along the light emitting direction of the light sources are less likely to be tinted with a color of the primary light rays emitted by the light sources more than the light rays from other sections. Namely, color unevenness of the exiting light rays can be reduced.

A second aspect of the present invention is a lighting device including a light source array, at least one wavelength converting member, a light guide plate, a reflection member, and a complementary color member. The light source array includes light sources that are configured to emit primary light rays in a predefined wavelength range and arranged in line. The at least one wavelength converting member is disposed along a length direction of the light source array to be opposed to the light source array. The at least one wavelength converting member includes a wavelength converting portion, a holding portion, and a non-wavelength converting portion. The wavelength converting portion contains phosphors that are configured to secondary light rays in a wavelength range different from the wavelength range when excited by the blue light rays. The holding portion holds the wavelength converting portion to surround the wavelength converting portion. The holding portion has light transmissivity and an elongated shape. The non-wavelength converting portion is formed at an end of the holding portion with respect to a longitudinal direction of the holding portion and configured to pass the primary light rays that are emitted by the light sources. The at least one wavelength converting member is disposed between the light guide plate and the light source array. The light guide plate includes a light entering surface through which light rays enter, a light exiting surface through which the light rays exit, and an opposite surface that is disposed on an opposite side from the light exiting surface. The light rays include the primary light rays and the secondary light rays. The secondary light rays are converted from the primary light rays emitted by the light sources and travel through the at least one wavelength converting member from a light source side to a light guide plate side. The reflection member is disposed to cover the opposite surface and configured to reflect light rays. The complementary color member is configured to exhibit a complementary color of a reference color that is exhibited by the primary light rays. The complementary color member is disposed between the opposite surface and the reflection member to overlap a section of the opposite surface that extends from the non-wavelength converting portion in a light emitting direction of the light source. With the above configuration, in the lighting device according to the present invention, the light rays exiting from a section that linearly extends from the end portion of the wavelength converting member along the light emitting direction of the light sources are less likely to be tinted with a color of the primary light rays emitted by the light sources more than the light rays from other sections. Namely, color unevenness of the exiting light rays can be reduced.

A third aspect of the present invention is a lighting device including a light source, a light guide plate, a main wavelength converting member, and a sub wavelength converting member. The light guide plate includes peripheral end surfaces and a pair of plate surfaces. One of the peripheral end surfaces is defined as a light entering end surface through which light rays from the light source enter. One of the plate surfaces is defined as a light exiting surface through which the light rays exit. The main wavelength converting member extends along a length direction of the light entering end surface. The main wavelength converting member is disposed between the light source and the light entering end surface. The main wavelength converting member is disposed between the light source and the light entering end surface. The main wavelength converting member includes phosphors that are configured to convert a wavelength of the light rays from the light source. The sub wavelength converting member is disposed at least one of a section of the light guide plate overlapping an end portion of the main wavelength converting member with respect to the length direction and a second of the light guide plate disposed outer than the end portion with respect to the length direction. The end portion of the main wavelength converting member is located at an end thereof in the length direction. According to the configuration, the light rays emitted by the light source enter the light guide plate through the light entering end surface after wavelength conversion by the phosphors in the main wavelength converting member that is disposed between the light source and the light entering end surface. The light rays travel through the light guide plate and exit through the light exiting plate surface. The main wavelength converting member extends along the length direction of the light entering end surface and includes a section in which the phosphors are not disposed at an end in the length direction. When a frame size of the lighting device is reduced, the section of the main wavelength converting member in which the phosphors are not disposed is more likely to overlap the light source. Therefore, the light rays from the light source may enter an end section of the light entering end surface of the light guide plate at an end in the length direction without wavelength conversion by the phosphors. The sub wavelength converting member configured to convert the wavelength of the light rays from the light source is disposed in at least one of the section of the light guide plate overlapping the end portion of the main wavelength converting member at the end in the length direction of the main wavelength converting member with respect to the length direction and the section of the light guide plate disposed outer then the end portion with respect to the length direction. Even if the main wavelength converting member includes the portion in which the phosphors are not disposed at the end in the length direction and the light rays that have passed through the end portion of the main wavelength converting member include the light rays without the wavelength conversion by the phosphors due to the positional relationship in which the portion overlaps the light source with respect to the length direction, the wavelength of such light rays is converted by the sub wavelength converting member. Therefore, a difference in color is less likely to be produced between the light rays exiting from the end section of the light exiting plate surface of the light guide plate at the end in the length direction of the light entering end surface and the light rays exiting from the middle section of the light exiting plate surface of the light guide plate in the middle in the length direction of the light entering end surface. Even if the frame size is reduced, color unevenness is less likely to occur in the light rays exiting from the light exiting plate surface.

A display device according to present invention includes the lighting device and a display panel configured to display an image using the light rays from the lighting device. In the display device, the display panel may be a liquid crystal display panel. A television device according to the present invention includes the display device.

Advantageous Effect of the Invention

According to the present invention, a technology is provided for reducing color unevenness that may be caused by light rays exiting from a section that linearly extends from an end of the wavelength converting member in a light emitting direction of a light source tinted with a color of primary light rays emitted by the light source more than light rays exiting from other area in an edge light type lighting device including a wavelength converting member.

MODE FOR CARRYING OUT THE INVENTION

<First Embodiment>

Figure 1:
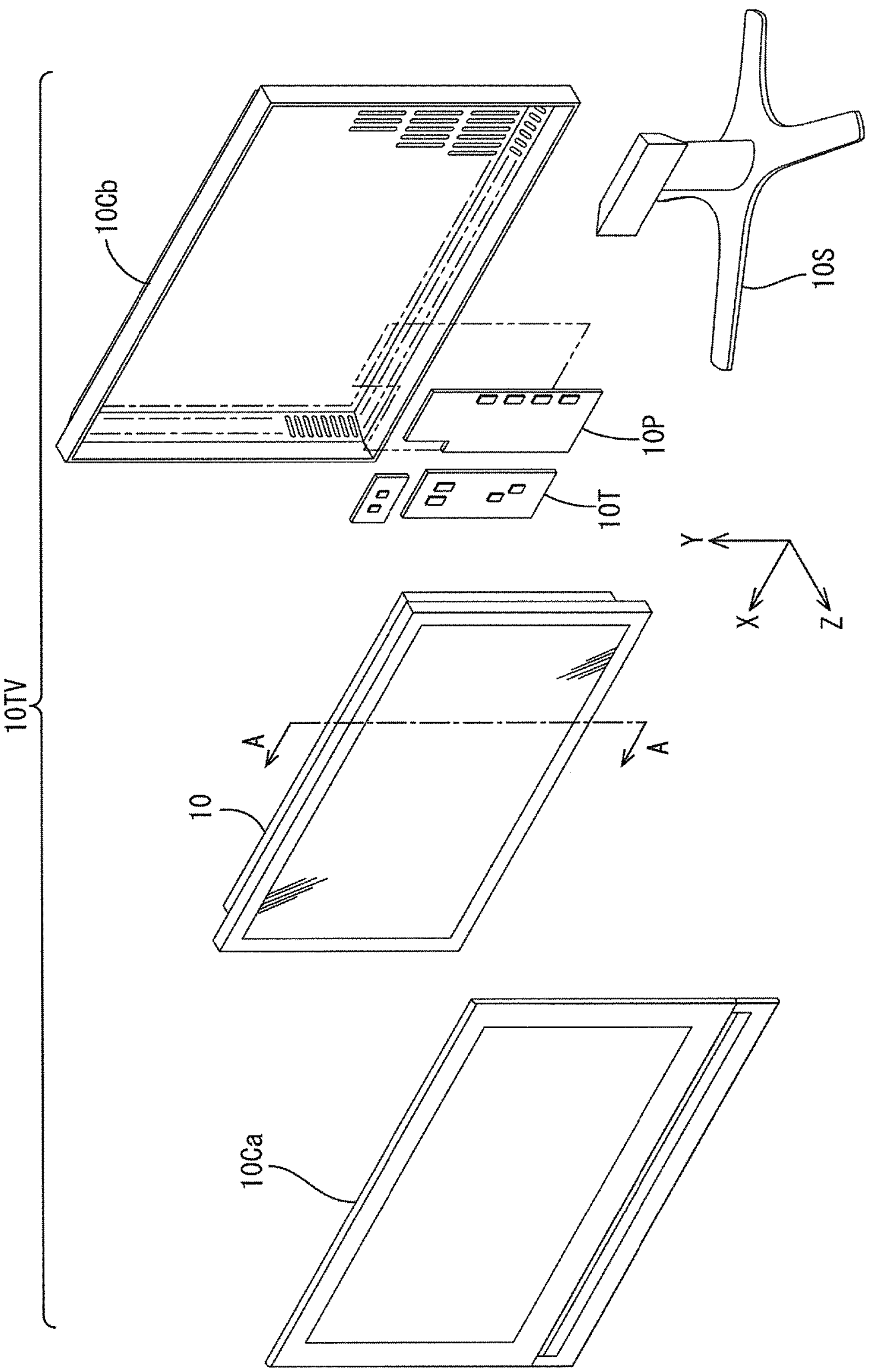
FIG. 1 is an exploded perspective view illustrating a general configuration of a television device according to a first embodiment of the present invention.
Figure 2:
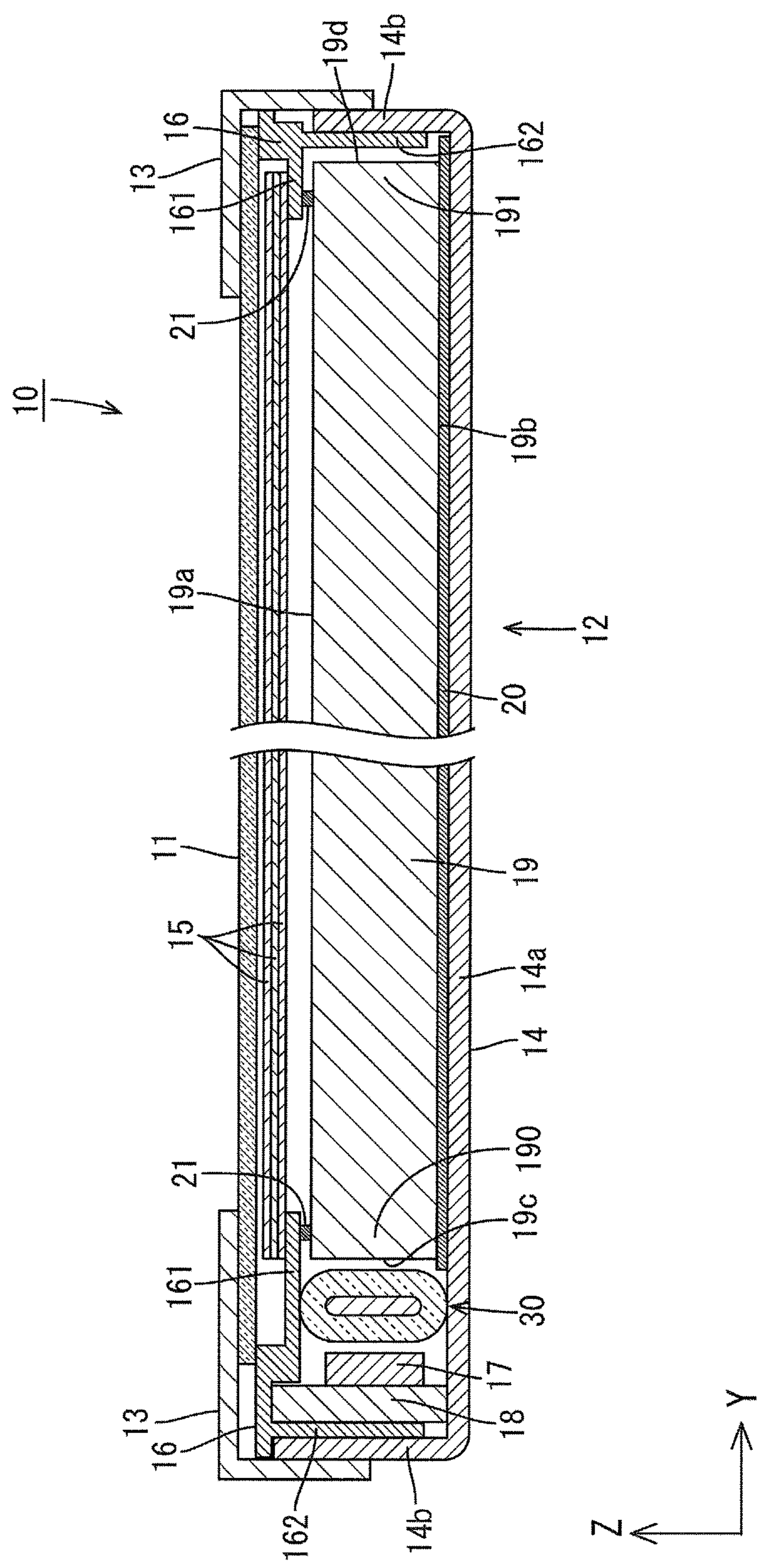
FIG. 2 is a cross-sectional view along line A-A in FIG. 1.
Figure 3:
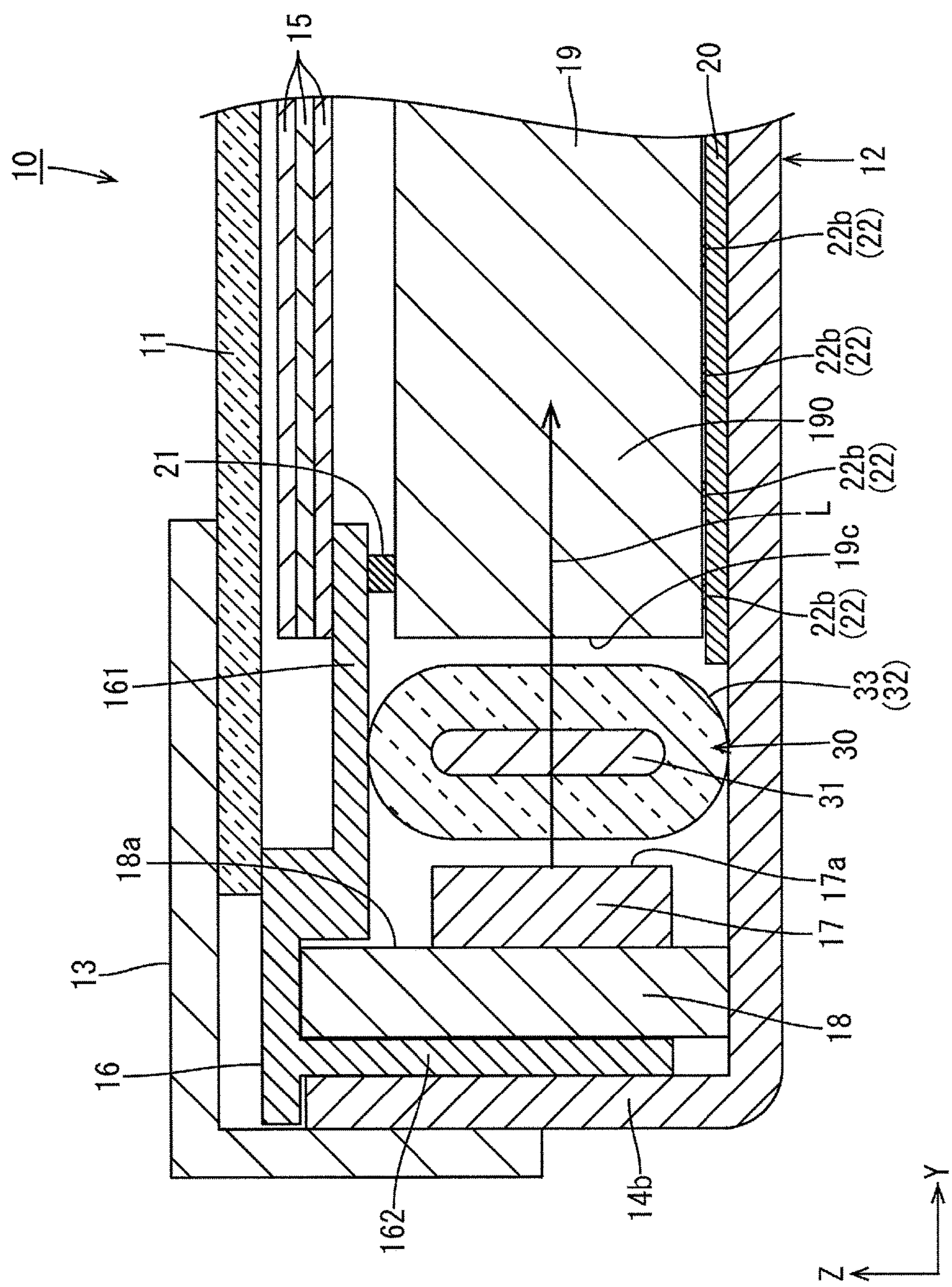
FIG. 3 is a magnified cross-sectional view of a portion of a liquid crystal display device including an LED and therearound.

A first embodiment of the present invention will be described with reference to FIGS. 1 to 6. In this section, a television device 10TV (an example of a liquid crystal display device) including a lighting unit 12 (a backlight unit) will be described. X-axes, Y-axes, and Z-axes are present in drawings for the purpose of illustration. First, the television device 10TV and a liquid crystal display device 10 will be described. FIG. 1 is an exploded perspective view illustrating a schematic configuration of the television device 10TV according to the first embodiment of the present invention. FIG. 2 is a cross-sectional view along line A-A in FIG. 1. FIG. 3 is a magnified cross-sectional view of a portion of the liquid crystal display device 10 including an LED 17 and therearound. As illustrated in FIG. 1, the television device 10TV includes the liquid crystal display device 10 (an example of a display device), a front cabinet 10Ca, a rear cabinet 10Cb, a power supply 10P, a tuner 10T (a receiver), and a stand 10S as major components. The front cabinet 10Ca and the rear cabinet 10Cb sandwich the liquid crystal display device 10 in a front-rear direction (a front-back direction) to hold the liquid crystal display device 10. The tuner 10T is configured to receive TV signals.

The liquid crystal display device 10 according to this embodiment has a horizontally-long rectangular overall shape extending in the horizontal direction. As illustrated in FIG. 2, the liquid crystal display device 10 includes a liquid crystal panel 11, the lighting unit 12 (a backlight unit), and a bezel 13 as major components. The liquid crystal panel 11 is a display panel. The lighting unit 12 is an external light source configured to supply light to the liquid crystal panel 11. The bezel 13 having a frame shape holds the liquid crystal panel 11 and the lighting unit 12. The liquid crystal panel 11 includes a pair of transparent substrates and a liquid crystal layer sealed between the substrates as main components. The liquid crystal panel 11 is configured to display images that are viewable on a panel surface using light emitted by the lighting unit 12. The liquid crystal panel 11 has a horizontally-long rectangular overall shape in a plan view.

The lighting unit 12 is a device disposed behind the liquid crystal panel 11 and configured to supply light to the liquid crystal panel 11. The lighting unit 12 is configured to emit white light. The lighting unit 12 in this embodiment is a so-called edge light type (or a side light type) lighting unit. As illustrated in FIG. 2, the lighting unit 12 includes a chassis 14, optical members 15, a frame 16, LEDs 17, an LED board 18, a light guide plate 19, a reflection sheet 20, and a phosphor tube 30 (a wavelength converting member).

The chassis 14 has a box-like overall shape with an opening on the front side. The chassis 14 is formed from a metal sheet such as an aluminum sheet and an electro galvanized steel sheet (SECC). The chassis 14 includes a bottom plate 14*a* and sidewall plates 14*b*. The bottom plate 14*a* has a rectangular shape similar to the liquid crystal panel 11 in the plan view. The sidewall plates 14*b* project from edges of the bottom plate 14*a* and surround the bottom plate 14*a*. Various kinds of components including the LEDs 17, the phosphor tube 30, the LED board 18, the reflection sheet 20, the light guide plate 19, and the optical members 15 are held in the chassis 14. Circuit boards including a control circuit board and an LED drive circuit board, which are not illustrated, are mounted to an outer surface of the chassis 14. Inside the chassis 14, the reflection sheet 20 is disposed to cover a surface of the bottom plate 14*a*. The reflection sheet 20 (an example of a light reflecting member) is a light reflective member in the form of a sheet. The reflection sheet 20 may be made of white foamed polyethylene terephthalate (an example of a white plastic sheet). The light guide plate 19 is disposed on the reflection sheet 20 and held in the chassis 14.

The light guide plate 19 is made of transparent synthetic resin having high light transmissivity and a refraction index sufficiently higher than that of air (e.g., acrylic resin such as PMMA, polycarbonate resin). The light guide plate 19 is a plate shaped member having a rectangular shape similar to the liquid crystal panel 11 in the plan view. The light guide plate 19 is held in the chassis 14 such that a front surface 19*a* thereof is opposed to the liquid crystal panel 11 and a back surface 19*b* thereof is opposed to the reflection sheet 20. The front surface 19*a* of the light guide plate 19 is a light exiting surface 19*a* through which light rays exit toward the liquid crystal panel 11. The optical members 15 are supported by the frame 16 between the light exiting surface 19*a* and the liquid crystal panel 11. One of adjacent long end surfaces 19*c* of the light guide plate 19 is a light entering surface 19*c* through which the light rays from the LEDs 17 enter via the phosphor tube 30. An end of the light guide plate 19 including the light entering surface 19*c* may be referred to as a light entering end 190. The other adjacent long end surface 19*d* of the light guide plate 19 and two short end surfaces 19*e* and 19*f* of the light guide plate 19 are not opposed to the light sources (the LEDs 17). Therefore, they may be referred to as "light source non-opposed end surfaces." Ends 191, 192, and 193 of the light guide plate including the light source non-opposed end surfaces may be referred to as "light source non-opposed ends." The short end surfaces 19*e* and 19*f* that are adjacent to the light entering surface 19*c* and not opposed to the LEDs 17 (the light sources) may be referred to as "light source non-opposed adjacent end surfaces." The light source non-opposed end surface (the adjacent long end surface 19*d*) on the opposite side from the light entering surface 19*c* may be referred to as an "opposite-side light source non-opposed end surface." The end 191 of the light guide plate 19 including the opposite-side light source non-opposed end surface may be referred to as an "opposite-side light source non-opposed end."

The frame 16 has a frame shape (a picture frame shape) as a whole to cover peripheral ends of the light guide plate 19 from the front side. The frame 16 is fitted in an opening of the chassis 14 from the front side. The frame 16 is made of synthetic resin and painted in white to have light reflectivity. The frame 16 includes a frame body 161 and projecting walls 162. The frame body 161 has a frame shape in the plan view. The frame body 161 includes an inner edge portion held against the peripheral ends of the light guide plate 19 that is held in the chassis 14 from the front side. The projecting walls 162 project from the frame body 161 toward the bottom plate 14*a* of the chassis 14. The projecting walls 162 are held in the chassis 14.

The frame body 161 has the frame shape such that the inner edge portion overlaps the peripheral ends of the light guide plate 19 and an outer edge portion overlaps upper ends of the sidewall plates 14*b* of the chassis 14. An elastic member 21 made of urethane foam is attached to a back surface of the inner edge portion of the frame body 161. The elastic member 21 in this embodiment is in black and has a light blocking property. The elastic member 21 has a frame shape (or a ring shape) as a whole. The elastic member 21 is brought into contact with the peripheral ends of the light guide plate 19 from the front side. The inner edge portion of the frame body 161 is configured such that the front surface thereof is one step lower than the front surface of the outer edge portion. An edge portion of the optical member 15 is placed on the surface that is one step lower. The front surface of the inner end of the frame portion includes protrusions that are not illustrated. The edge portion of the optical member 15 includes holes in which the protrusions are fitted and the optical member 15 is supported by the frame body 161.

Each projecting wall 162 has a plate shape that extends from the outer edge portion of the frame body 161 toward the bottom plate 14*a* of the chassis 14 to be opposed to the end surface 19*c* of the light guide plate 19. The LED board 18 on which the LEDs 17 are mounted are attached to a portion of the projecting wall 162 opposed to the first adjacent long end surface 19*c* of the light guide plate 19. A portion of the projecting wall 162 other than the portion to which the LED board 18 is attached is placed between the end surface of the light guide plate 19 and the sidewall plate 14*b* and held in the chassis 14.

Each LED 17 (an example of a light source) includes a blue LED component (a blue light emitting component), a transparent sealing member, and a case. The LED component is a light emitting source in the form of a chip. The sealing member seals the blue LED component. The case has a box shape and holds the blue LED component and the sealing member. The LEDs 17 are configured to emit blue light rays. Each blue LED component is a semiconductor containing InGaN. The blue LED component emits light rays in a blue wavelength range (about 420 nm to about 500 nm), that is, blue light rays when forward biased. In this specification, the blue light rays emitted by the LEDs 17 may be referred to as primary light rays.

Figure 4:
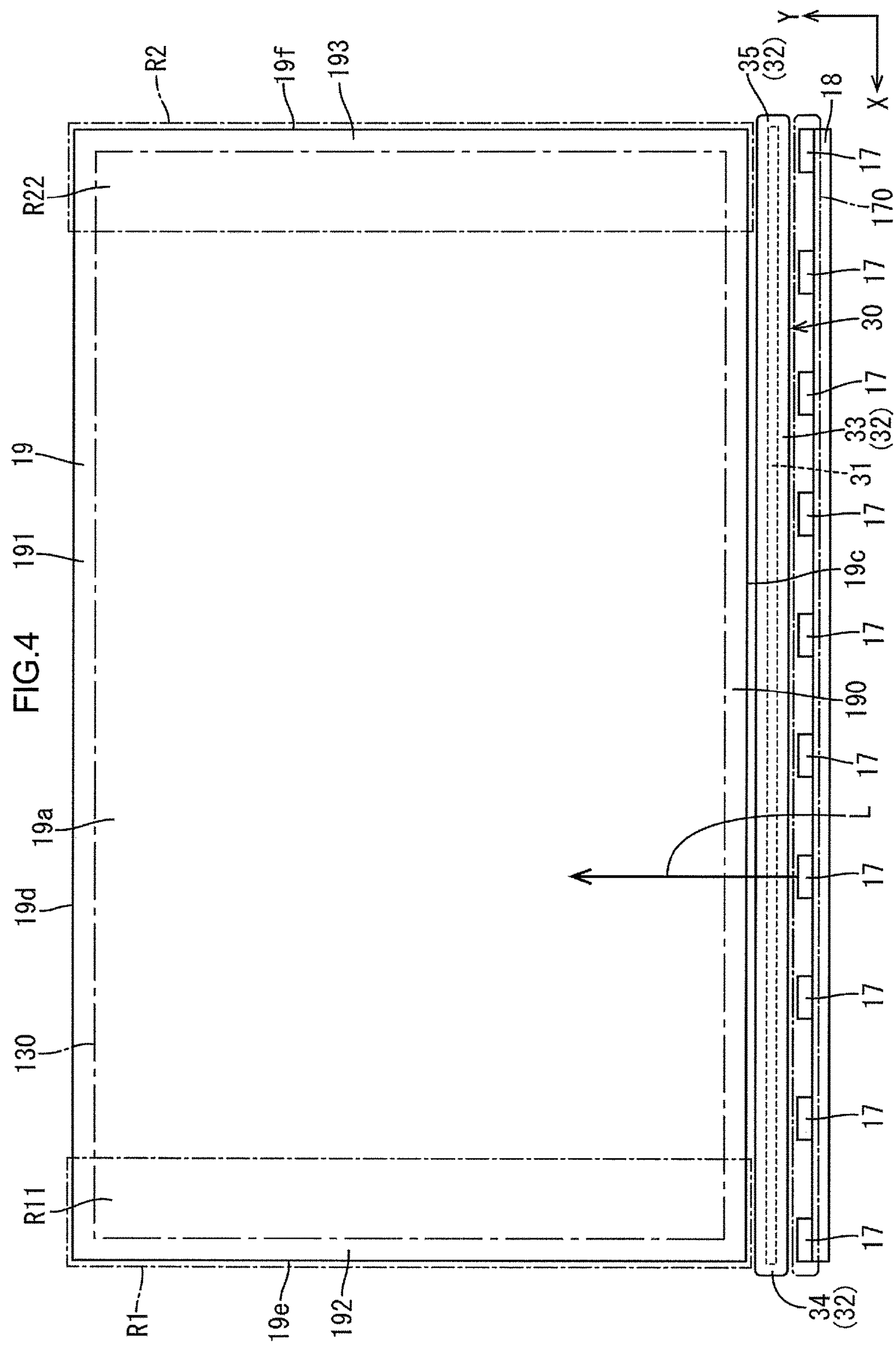
FIG. 4 is a plan view schematically illustrating positional relationships among an LED array, a phosphor tube, and a light guide plate viewed from the front side.

FIG. 4 is a plan view schematically illustrating positional relationships among an LED array 170, the phosphor tube 30, and the light viewed from the front side. The LEDs 17 are so-called top surface light emitting type LEDs and multiple LEDs 17 are provided. The LEDs 17 are arranged at intervals in line and mounted on the LED board 18. In this specification, the array of the LEDs 17 may be referred to as the LED array 170 (an example of a light source array).

The LEDs 17 are mounted on the LED board 18 and held in the chassis 14 such that light emitting surfaces 17*a* are opposed to a first adjacent long end surface 19*c* (a light entering surface) of the light guide plate 19 with the phosphor tube 30 between the light emitting surfaces 17*a* and the adjacent long end surface 19*c*. The LED board 18 is fixed to the projecting wall 162 of the frame 16. The phosphor tube 30 is disposed between the light emitting surfaces 17*a* of the LEDs 17 and the adjacent long end surface 19*c* (the light entering surface) of the light guide plate 19, as described later. A detail of the phosphor tube 30 will be described later. The LEDs 17 emit light rays (primary light rays, blue light rays) toward the phosphor tube 30 that is disposed between the LEDs 17 and the light entering surface 19*c*. In this description, a side to which the light emitting surfaces 17*a* of the LEDs 17 face (a light emitting side of the LEDs 17, an anterior in a direction along an optical axis L of the LEDs 17) may be referred to as a "front side" and an opposite side from the side may be referred to as a "rear side".

The optical members 15 have a horizontally-long rectangular shape in a plan view similar to the liquid crystal panel 11. The edge portions of the optical members 15 are disposed between the light exiting surface 19*a* of the light guide plate 19 and the back surface of the liquid crystal panel 11 with the edge portions placed on the frame body 161 of the frame 16 from the front side. The optical members 15 have functions for exerting predefined optical effects on the light rays exiting from the light guide plate 19 and direct the light rays toward the liquid crystal panel 11. The optical members 15 include multiple sheets that are placed on top of each other (optical sheets). The optical members 15 may include optical sheets such as a diffuser sheet, a lens sheet, and a reflective type polarizing sheet.

Figure 5:
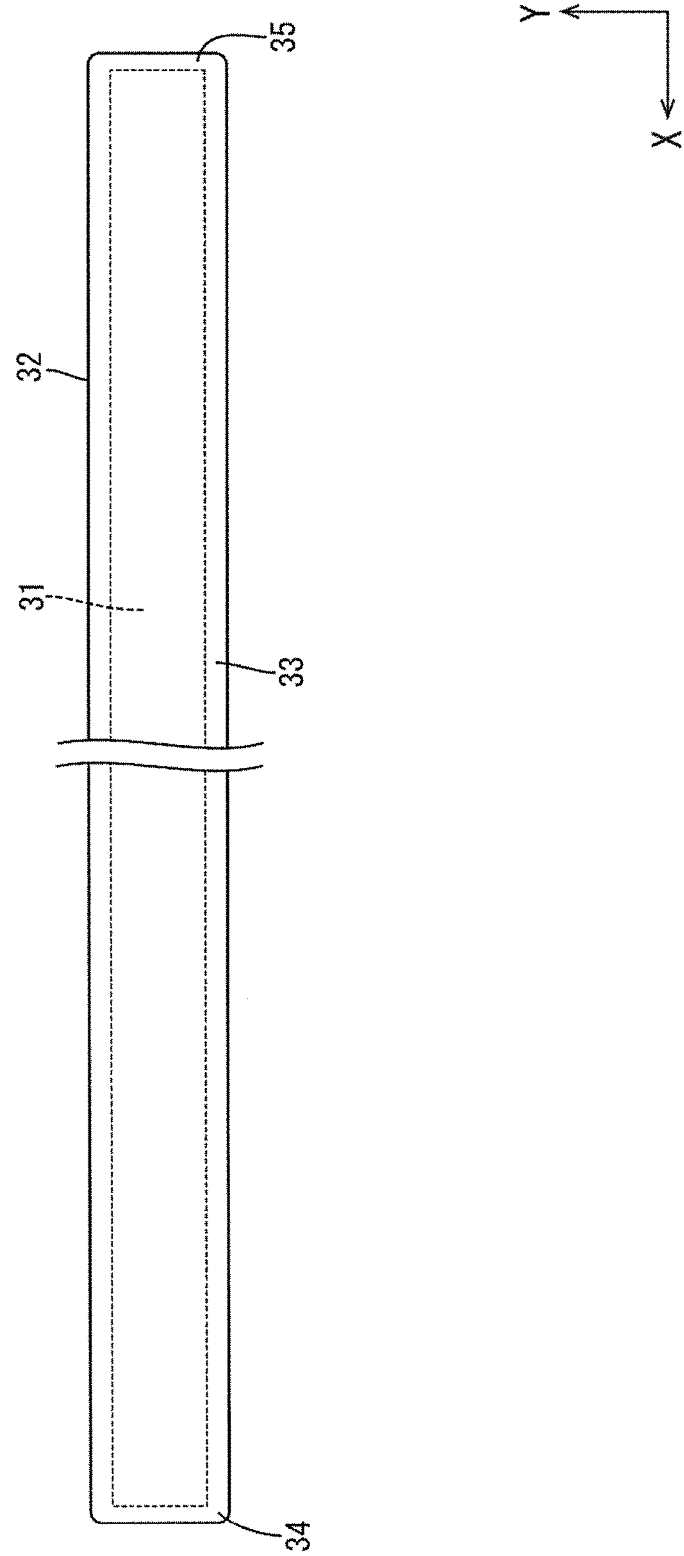
FIG. 5 is a plan view of the phosphor tube.

The phosphor tube 30 (the wavelength converting member) will be described. FIG. 5 is a plan view of the phosphor tube 30. The phosphor tube 30 has an elongated shape as a whole. The phosphor tube 30 is disposed in a space between the light emitting surfaces 17*a* of the LEDs 17 and the light entering surface 19*c* of the light guide plate 19 along a direction in which the LEDs 17 are arranged in line (a long direction of the light guide plate 19 in this embodiment). The phosphor tube 30 passes some of the light rays from the LEDs 17 (the primary light rays) to the light entering surface 19*c* side. The phosphor tube 30 absorbs some of the light rays from the LEDs 17 and converts the light rays into light rays with wavelengths in different wavelength ranges (secondary light rays). The phosphor tube 30 includes a wavelength converting portion 31 and a holding portion 32. The wavelength converting portion 31 includes quantum dot phosphors (an example of phosphors). The holding portion 32 surrounds and holds the wavelength converting portion 31. The holding portion 32 has an elongated shape and light transmissivity.

The wavelength converting portion 31 has a function of converting the primary light rays emitted by the LEDs 17 (blue light rays in this embodiment) into the secondary light rays with the wavelengths in the wavelength ranges different from the wavelength range of the primary light rays (green light rays and red light rays in this embodiment). Among the primary light rays in the wavelength converting portion 31, the primary light rays that are absorbed by the quantum dot phosphors contained in the wavelength converting portion 31 are wavelength converted into the secondary light rays and the primary light rays that are not absorbed by the quantum dot phosphors are passed through the wavelength converting portion 31. The wavelength converting portion 31 may be made of cured resin with the quantum dot phosphors added. The resin to which the quantum dot phosphors are added may be a transparent ultraviolet curable resin. The wavelength converting portion 31 in this embodiment held by the elongated holding portion 52 extends in the longitudinal direction of the holding portion 52.

The quantum dot phosphors are phosphors having high quantum efficiency. The quantum dot phosphors include semiconductor nanocrystals (e.g., diameters in a range from 2 nm to 10 nm) which tightly confine electrons, electron holes, or excitons with respect to all direction of a three dimensional space to have discrete energy levels. A peak wavelength of emitting light rays (a color of emitting light rays) is freely selectable by changing the dot size. In this embodiment, the wavelength converting portion 31 includes green quantum dot phosphors and red quantum dot phosphors as quantum dot phosphors. The green quantum dot phosphors emit green light (in a wavelength range from about 500 nm to about 570 nm). The red quantum dot phosphors emit red light rays (in a wavelength range from about 600 nm to about 780 nm). An emitting light spectrum of the green light rays emitted by the green quantum dot phosphors and an emitting light spectrum of the red light rays emitted by the red quantum dot phosphors have sharp peaks, respectively. A full width at half maximum of each peak is small. Therefore, green light rays and red light rays have significantly high color purity and thus wider color gamut can be achieved.

The green quantum dot phosphors absorb the light rays (the blue light rays, the primary light rays) from the LEDs 17 and emit green light rays (in a wavelength range from about 500 nm to about 570 nm) when excited by the light rays. Namely, the green quantum dot phosphors have a function of converting the light rays from the LEDs 17 (the blue light rays, the primary light rays) into light rays in a different wavelength range (the green light rays, secondary light rays). The red quantum dot phosphors absorb the light rays (the blue light rays, the primary light rays) from the LEDs 17 and emit red light rays (in a wavelength range from about 600 nm to about 780 nm) when excited by the light rays. Namely, the red quantum dot phosphors have a function of converting the light rays from the LEDs 17 (the blue light rays, the primary light rays) into light rays in a different wavelength range (the red light rays, secondary light rays). Materials used for the quantum dot phosphors include a material prepared by combining elements that could be divalent cations such as Zn, Cd, and Pb and elements that could be divalent anions such as O, S, Se, and Te (e.g., cadmium selenide (CdCe), zinc sulfide (ZnS)), a material prepared by combining elements that could be trivalent cations such as Ga and In and elements that could be trivalent anions such as P, As, and Sb (e.g., indium phosphide (InP), gallium arsenide (GaAs), and chalcopyrite type compounds (CuInSe2)). In this embodiment, CdSe is used for the material of the quantum dot phosphors. In this embodiment, the quantum dot phosphors (the green quantum dot phosphors and the red quantum dot phosphors) are dispersed about evenly in the resin of the wavelength converting portion 31. The wavelength converting portion 31 may contain other elements such as a scattering agent.

The holding portion 32 has an elongated shape as a whole. The holding portion 32 is a tubular member having light transmissivity. The holding portion 32 holds the wavelength converting portion 31 inside and ends of the holding portion 32 are closed. The holding portion 32 may be a tubular member made of glass (e.g., a glass tube) with one of the ends open and the other end closed. The wavelength converting member 51 is inserted in the holding portion 32 and the open end is closed. The holding portion 32 includes a tubular body 33 having an elongated shape and sealed ends 34 and 35 (non-wavelength converting portions). The tubular body 33 includes a transparent tubular wall that surrounds the wavelength converting portion 31 and a space for holding the wavelength converting portion 31 herein. The sealed ends 34 and 35 close (or seal) ends of the tubular body 33. The sealed ends 34 and 35 are ends of the holding portion 32 in the longitudinal direction and they are also ends of the phosphor tube 30.

The phosphor tube 30 is produced by adding and mixing the quantum dot phosphors in an uncured ultraviolet curable resin having flowability to obtain a mixture, inserting the mixture into a glass tube, sealing (or closing) an open end of the glass tube, and applying ultraviolet rays to cure the resin inside the glass tube. The phosphor tube 30 is sandwiched between the bottom plate 14*a* of the chassis 14 and a frame portion 161 of the frame and fixed at a predefined position between the LEDs 17 (the LED array 170) and the light entering surface 19*c* with a holding member that is not illustrated. As illustrated in FIG. 4, the phosphor tube 30 is disposed inside the lighting unit 12 such that the wavelength converting portion 31 held in the holding portion 32 overlaps the light emitting surfaces 17*a* of the LEDs 17 and the light entering surface 19*c* of the light guide plate 19 in the light emitting direction of the LEDs 17 (the optical axis direction L of the LEDs 17). The ends of the phosphor tube 30 in the longitudinal direction are made of a material having light transmissivity (e.g., glass) and do not have a wavelength converting function. Therefore, the ends 34 and 35 of the phosphor tube 30 are disposed outside the light entering surface 19*c* such that the ends 34 and 35 do not overlap the light emitting surfaces 17*a* of the LEDs 17 at the ends of the LED array 170 and the light entering surface 19*c* of the light guide plate 19 in the light emitting direction of the LEDs 17 (the optical axis direction L of the LEDs 17).

Some of the primary light rays emitted by the LEDs 17 travel through the phosphor tube 30 from the rear side (the LED 17 side) to the front side (the light guide plate 19 side) while being wavelength converted into the secondary light rays by the wavelength converting portion 31. Some of other primary light rays emitted by the LEDs 17 pass through the phosphor tube 30 from the rear side (the LED 17 side) to the front side (the light guide plate 19 side) without the wavelength conversion. According to the configuration in which some of the primary light rays emitted by the LEDs 17 with the wavelength conversion pass through the phosphor tube 30 from the rear side (the LED 17 side) to the front side (the light guide plate 19 side), white transmission light rays including the primary light rays and the secondary light rays exit from the phosphor tube 30 toward the light entering surface 19*c* of the light guide plate 19.

As described earlier, the ends 34 and 35 of the phosphor tube 30 are disposed outside the light entering surface 19*c*. However, some of the primary light rays emitted by the LEDs 17 pass through the ends 34 and 35 from the rear side (the LED 17 side) to the front side (the light guide plate 19 side). Although the light rays emitted by the LEDs 17 are more likely to travel straight forward, the light rays have an orientation distribution with spread angles. Therefore, some of the light rays emitted by the LEDs 17 (the primary light rays) pass through the ends 34 and 35 of the phosphor tube 30 (the sealed ends, the non-wavelength converting portions). If the light rays pass through the ends of the phosphor tube 30 (the sealed ends, the non-wavelength converting portions), the light rays mainly including the primary light rays (the blue light rays) exit from the ends 34 and 35 (the sealed ends, the non-wavelength converting portions). Therefore, the light tinted with the color of the primary light rays (bluish light in this embodiment) exits from each of the ends 34 and 35 of the phosphor tube 30 toward the light entering surface 19*c* side.

Figure 6:
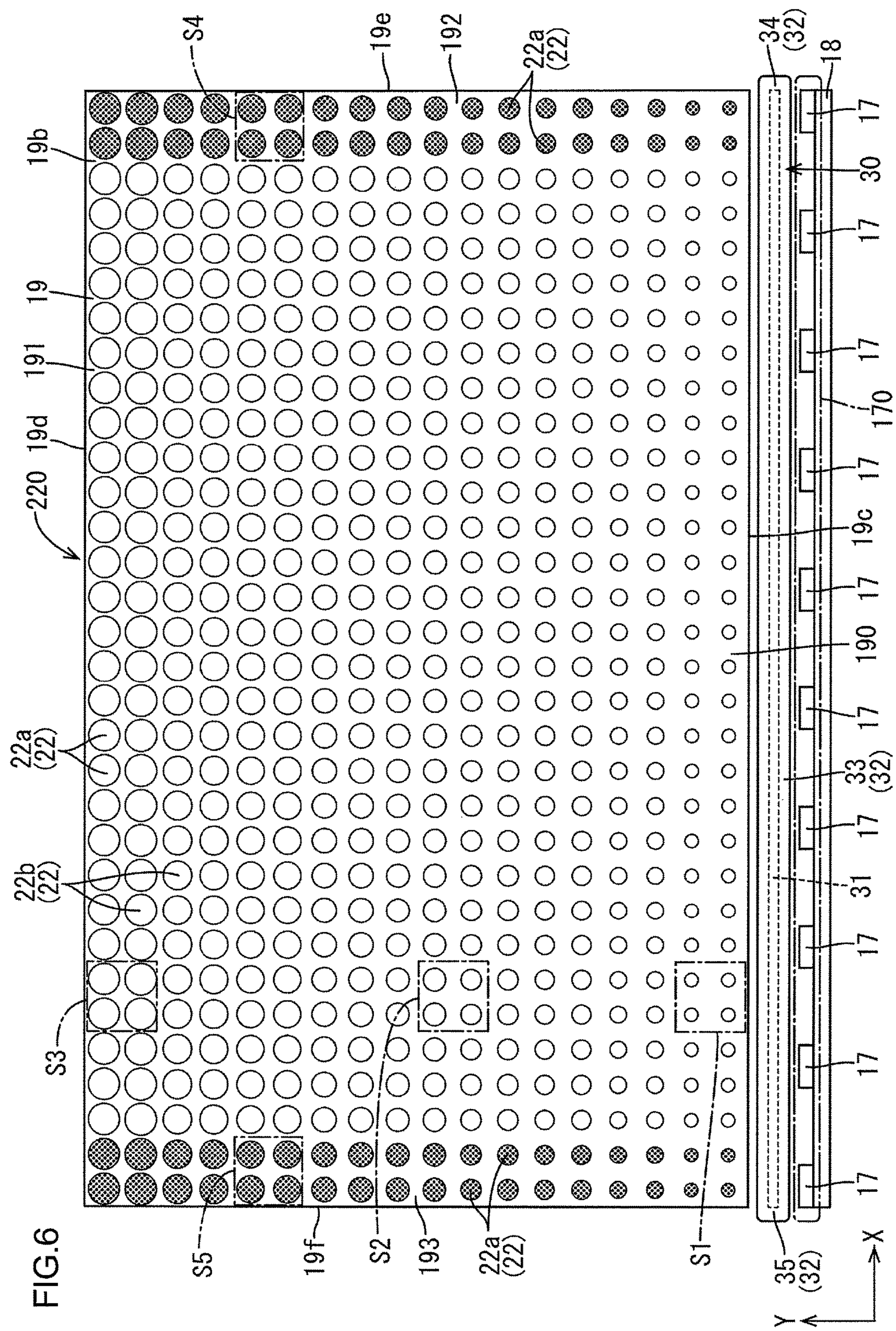
FIG. 6 is a plan view schematically illustrating positional relationships among the LED array, the phosphor tube and the light guide plate viewed from the rear side.

FIG. 6 is a plan view schematically illustrating positional relationships among the LED array 170, the phosphor tube 20, and the light guide plate 19 viewed from the back surface 19*b* side. As illustrated in FIG. 6, a light reflecting and scattering pattern 220 is formed on the back surface 19*b* (the opposite surface) of the light guide plate 19.

The light reflecting and scattering pattern 220 has a function of reflecting or scattering the light rays in the light guide plate 19 to direct the light rays toward the light exiting surface 19*a*. The light reflecting and scattering pattern 220 includes dots 22 having light reflectivity and light scattering properties. The dots 22 are two-dimensionally spread in a predefined pattern on the back surface 19*b* (the opposite surface) of the light guide plate 19. Each dot 22 has a round shape in a plan view.

The dots 22 in this embodiment include complementary color dots 22*a* and white dots 22*b*. The complementary color dots 22*a* are arranged along short ends 192 and 193 of the light guide plate 19. The complementary color dots 22*a* absorb the primary light rays (the blue light rays) from the LEDs 17 and exhibit a color (yellow) which is a complementary color of a reference color (blue) exhibited by the primary light rays (the blue light rays). The white dots 22*b* are arranged inner than the complementary color dots 22*a*. The white dots 22*b* exhibit color white. The complementary color dots 22*a* are arranged along the light emitting direction of the LEDs 17 (the optical axis direction L) from the ends 34 and 35 (the non-wavelength converting portions) of the phosphor tube 30.

The dots 22 in this embodiment are made of paints prepared by adding coloring agents to resins that are bases and by shaping the paints in the form of films (i.e., paint films). The dots 22 are formed on the back surface 19*b* of the light guide plate 19 using a known printing technology such as silk printing and inkjet printing. The coloring agents may be pigments or dyes selected depending on target colors.

A yellow color agent (an example of a complementary color agent) is used for the coloring agent of the complementary color dots 22*a*. The yellow color agent absorb the primary light rays (the blue light rays) from the LEDs 17 and exhibits (or reflects) the complementary color (yellow) of the reference color (blue) exhibited by the primary light rays (the blue light rays). Yellow pigments, yellow dyes, or yellow phosphors may be used for the yellow color agent. White pigments or white dyes may be used for the color agent of the white dots 22*b*.

The light reflecting and scattering pattern 220 is defined such that a density differs from area to area of the back surface 19*b* (the opposite surface) of the light guide plate 19. As illustrated in FIG. 6, the light reflecting and scattering pattern 220 is defined such that the density on the back surface 19*b* (the opposite surface) gradually increases as a distance from light entering surface 19*c* in a direction toward the opposite-side light source non-opposed end surface 19*d* increases.

As illustrated in FIG. 6, the density of the dots 22 (the light reflecting and scattering pattern 220) per unit area S1 in the area of the back surface 19*b* (the opposite surface) closer to the light entering surface 19*c* is lower. The density of the dots 22 (the light reflecting and scattering pattern 220) per unit area S3 in the area of the back surface 19*b* closer to the opposite-side light source non-opposed end surface 19*d* is higher. The density of the dots 22 (the light reflecting and scattering pattern 220) per unit area S2 in the area of the back surface 19*b* about the middle between the light entering surface 19*c* and the opposite-side light source non-opposed end surface 19*d* is higher than the density per unit area S1 and lower than the density per unit area S3.

The light reflecting and scattering pattern 220 is defined such that the density per unit area is higher in areas of the back surface 19*b* (the opposite surface) closer to the end surfaces 19*d*, 19*e*, and 19*f* (the light source non-opposed end surfaces) of the light guide plate 19 which are not opposed to the LEDs 17 (the light sources) than an area of the back surface 19*b* closer to the light entering surface 19*c*. As illustrated in FIG. 6, the density of the dots 22 (the light reflecting and scattering pattern 220) per unit area S4 in an area of the back surface 19*b* closer to one of the light source non-opposed end surface 19*e* adjacent to the light entering surface 19*c* (i.e., a light source non-opposed adjacent end surface) is higher than the density per unit area S1. The density of the dots 22 (the light reflecting and scattering pattern 220) per unit area S5 in an area of the back surface 19*b* closer to the other light source non-opposed end surface 19*f* adjacent to the light entering surface 19*c* (i.e., a light source non-opposed adjacent end surface) is higher than the density per unit area S1.

As described earlier, the density of the dots 22 (the light reflecting and scattering pattern 220) per unit area S3 in the area of the back surface 19*b* closer to the opposite-side light source non-opposed end surface 19*d* is higher than the density per unit area S1. The densities per unit areas in the areas of the back surface 19*b* (high and low) may be adjusted by setting the sizes and the numbers of the dots as appropriate.

In an area closer to the LEDs 17 (the light sources), that is, closer to the light entering surface 19*c*, a larger amount of the light rays emitted by the LEDs 17 exist. Therefore, in the area closer to the light entering surface 19*c*, a sufficient amount of the light rays can be directed from the inner side of the light guide plate 19 toward the light exiting surface 19*a* with the dots 22 (the light reflecting and scattering pattern 220) with a lower density per unit area. In contrast, the amount of the light rays supplied to the light guide plate 19 by the LEDs 17 tends to become smaller as a distance from the LEDs 17 (the light sources) in the direction toward the opposite side (the opposite-side light source non-opposed end surface 19*d* side) in comparison to the light entering surface 19*c* side or the middle area of the back surface 19*b*. In the areas closer to the light source non-opposed adjacent end surfaces 19*e* and 19*f* adjacent to the light entering surface 19*c*, the amount of the light rays supplied to the light guide plate 19 by the LEDs 17 tends to be smaller in comparison to the light entering surface 19*c* side or the middle area of the back surface 19*b*. In such areas, the sufficient amount of the light rays are directed from the inner side of the light guide plate 19 toward the light exiting surface 19*a* with the dots 22 (the light reflecting and scattering pattern 220) with the higher densities per unit areas.

In this embodiment, the density of the dots 22 (the light reflecting and scattering pattern 220) per unit area is higher in the area of the back surface 19*b* of the light guide plate 19 close to the opposite-side light source non-opposed end surface 19*d* in comparison to the areas of the back surface 19*b* closer to the light source non-opposed adjacent end surfaces 19*e* and 19*f*.

As illustrated in FIG. 6, the complementary color dots 22*a* of the light reflecting and scattering pattern 220 are formed in arrays on the back surface 19*b* along a direction in which the short ends 192 and 193 (the light source non-opposed adjacent sections) extend to form a linear band shape as a whole. As illustrated earlier, the complementary color dots 22*a* that form the linear band shape as a whole are arranged along the light emitting direction (the optical axis direction L) of the LEDs 17 from the ends 34 and 35 (the non-wavelength converting sections) of the phosphor tube 30. The complementary color dots 22*a* are formed in the areas to which the bluish light exiting from the ends 34 and 35 of the phosphor tube 30 is supplied, which will be described later.

Some of the primary light rays (the blue light rays) which have reached the complementary color dots 22*a* are absorbed by the complementary color dots 22*a* that exhibit yellow. The secondary light rays (the green light rays, the red light rays) which have reached the complementary color dots 22*a* are reflected or scattered by the complementary color dots 22*a*. The primary light rays (the blue light rays) or the secondary light rays (the green light rays, the red light rays) which have reached the white dots 22*b* are reflected or scattered by the white dots 22*b*.

In the lighting unit 12 having the configuration described above, when the power is supplied to the LEDs 17, the LEDs 17 turn on and the primary light rays (the blue light rays) emitted by the LEDs 17 enter the phosphor tube 30. The primary light rays emitted by the LEDs 17 in the middle excluding the LEDs 17 at the ends of the LED array 170 enter the section of the phosphor tube 30 including the wavelength converting portion 31 (the meddle section including the tubular body 33 and the wavelength converting portion 31). Some of the primary light rays emitted by the LEDs 17 at the ends of the LED array 170 enter the ends 34 and 35 of the phosphor tube 30.

The primary light rays absorbed by the quantum dot phosphors in the wavelength converting portion 31 in the phosphor tube 30 are wavelength converted into the secondary light rays and exit the phosphor tube 30. Other primary light rays in the phosphor tube 30 are not wavelength converted by the phosphor tube 30 and exit the phosphor tube 30 as the primary light rays. White transmitted light rays including the primary light rays and the secondary light rays are produced from the primary light rays emitted by the LEDs 17 and passing through the section of the phosphor tube 30 including the wavelength converting portion 31 (the middle section including the tubular body 33 and the wavelength converting portion 31). The transmitted light rays are directed toward the light entering surface 19*c* of the light guide plate 19. Bluish light rays (transmitted light rays) including a larger amount of the primary light rays are produced from the light rays emitted by the LEDs 17 and passing through the ends 34 and 35 of the phosphor tube 30 without the wavelength conversion. The bluish color rays mostly enter the light guide plate 19 through the ends of the light entering surface 19*c*. The light rays in the light guide plate 19 travels while repeatedly reflected inside the light guide plate 19. The light rays that have reached the light reflecting and scattering pattern 220 (the dots 22) on the back surface 19*b* while traveling through the light guide plate 19 are directed to the light exiting surface 19*a* to exit from the light exiting surface 19*a* toward the optical members 15.

The white light rays (the transmitted light rays) including the primary light rays and the secondary light rays exiting from the section of the phosphor tube 30 including the wavelength converting portion 31 (the middle section including the tubular body 33 and the wavelength converting portion 31) enter the light guide plate 19. The white light rays that have reached the white dots 22*b* arranged in most of the inner area of the back surface 19*b* excluding the short ends 192 and 193 are reflected or scattered by the white dots 22*b* to travel toward the light exiting surface 19*a*. The bluish light (the transmitted light) exiting from the ends 34 and 35 of the phosphor tube 30 enters the light guide plate 19. The bluish light may reach the complementary color dots 22*a* arranged in the areas of the back surface 19*b* along the short ends 192 and 193. Some of the primary light rays (the blue light rays) which have reached the complementary color dots 22*a* are absorbed by the complementary color dots 22*a* and other light rays that have reached the complementary color dots 22*a* are reflected or scattered by the complementary color dots 22*a* to travel toward the light exiting surface 19*a*.

In sections R1 and R2 of the light guide plate 19 to which bluish light exiting from the ends 34 and 35 of the phosphor tube 30 is supplied (sections that linearly extend from the ends 34 and 35 of the phosphor tube 30 in the light emitting direction of the LEDs 17, respectively), the complementary color dots 22*a* are formed on the areas of the back surface 19*b* corresponding to the sections R1 and R2. According to the configuration, the primary light rays (the blue light rays) included in the bluish light can be absorbed by the complementary color dots 22*a* to eliminate some of those. Therefore, blueness in the light rays exiting from the areas of the light exiting surface 19*a* of the light guide plate 19 corresponding to the sections R1 and R2 to which the blueish light rays are supplied can be reduced. The planar white light with reduced uneven brightness exits from an entire area of the light exiting surface 19*a*.

The light rays exiting from the light exiting surface 19*a* may reach the optical members 15 (the optical sheets) or the reflection sheet 20 on the back surface 19*b* of the light guide plate 19. The light rays are retroreflected several times and directed to the back surface of the liquid crystal panel 11 as planar light spreading from the optical member 15.

In FIG. 4, the sections R1 and R2 are illustrated. The sections R1 and R2 are located closer to the short end surfaces 19*e* and 19*f* adjacent to the light entering surface 19*c* (the light source non-opposed adjacent end surfaces), respectively. The sections R1 and R2 linearly extend from the ends 34 and 35 of the phosphor tube 30 along the light emitting direction of the LEDs 17. The bluish light (the light including the blue light rays with the higher percentage in comparison to the inner area) exiting from the ends 34 and 35 of the phosphor tube 30 are supplied to the sections R1 and R2 of the light guide plate 19. In FIG. 4, a rectangular 130 (a chain line) along edges of the light exiting surface 19*a* indicates inner edges of the frame 16 (inner edges of the frame body 161, inner edges of the bezel 13). The light rays supplied to the liquid crystal panel 11 (i.e., the light rays emitted by the lighting unit 12) among the light rays exiting from the light exiting surface 19*a* of the light guide plate 19 pass a section inner than inner edges of the frame 16. If the light reflecting and scattering pattern 220 include only the white dots 22*b*, areas of the display surface of the liquid crystal panel corresponding to an intersection R11 of the rectangular 130 and the section R1 and an intersection R22 of the rectangular 130 and the section R2 may become bluish.

In this embodiment, the complementary color dots 22*a* of the light reflecting and scattering pattern 220 are formed in the areas of the back surface 19*b* of the light guide plate 19 overlapping at least the sections R1 and R2 in the plan view. The sections R1 and R2 are the sections of the light guide plate 19 to which the bluish light is supplied. When the light guide plate 19 is viewed in plan, the complementary color dots 22*a* that exhibit yellow are within the sections R1 and R2. Namely, when the light guide plate 19 is viewed in plan, the complementary color dots 22*a* are formed such that the complementary color dots 22*a* overlap the sections R1 and R2 that are larger than the intersections R11 and R22.

In the lighting unit 12 in this embodiment, the light rays exiting from the sections R1 and R2 (or R11 and R22) which linearly extend from the ends 34 and 35 of the phosphor tube 30 along the light emitting direction of the LEDs 17, respectively are less likely to be tinted with the color of the primary light rays (blue) in comparison to the light rays exiting from other sections. Therefore, white light with reduced uneven brightness is emitted by the lighting unit 12.

<Second Embodiment>

Figure 7:
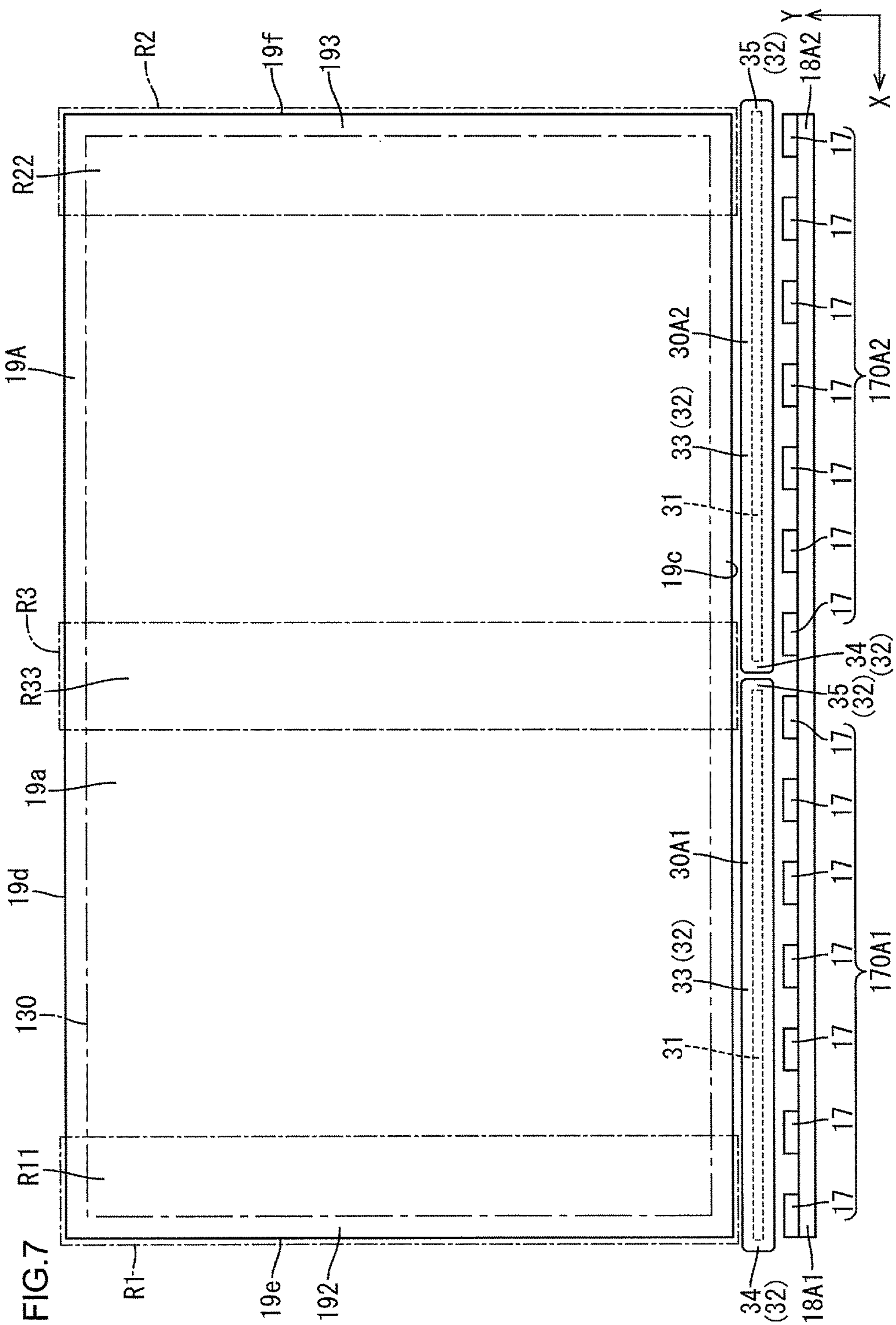
FIG. 7 is a plan view schematically illustrating positional relationships among an LED array, a phosphor tube, and a light guide plate in a lighting device according to a second embodiment viewed from the front side.
Figure 8:
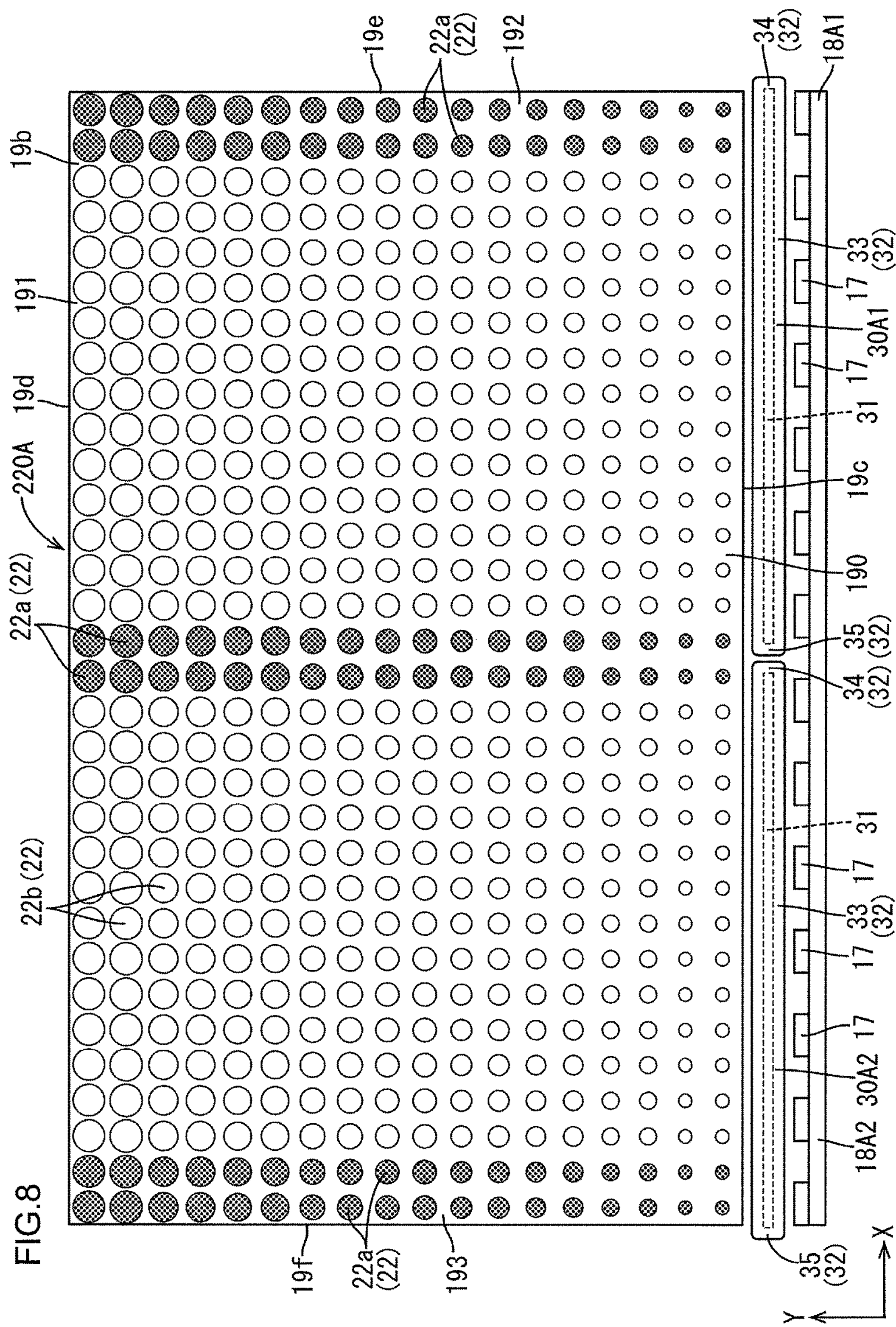
FIG. 8 is a plan view schematically illustrating positional relationships among the LED array, the phosphor tube, and the light guide plate in the lighting device according to the second embodiment viewed from the rear side.

A second embodiment of the present invention will be described with reference to FIGS. 7 and 8. In this section, a lighting unit including a light reflecting and scattering pattern 220A instead of the light reflecting and scattering pattern 220 in the first embodiment. A basic configuration of the lighting unit in this embodiment is similar to that of the first embodiment. Components and sections the same as those of the first embodiment will be indicated with the same symbols and will not be described in detail. FIG. 7 is a plan view schematically illustrating positional relationships among LED arrays 170A1 and 170A2, phosphor tubes 30A1 and 30A2, and a light guide plate 19A in the lighting unit according to the second embodiment viewed from the front side. FIG. 8 is a plan view schematically illustrating positional relationships among the LED arrays 1701 and 170A2, the phosphor tubes 30A1 and 30A2, and the light guide plate 19A in the lighting unit according to the second embodiment viewed from the rear side.

In the lighting unit in this embodiment, two (multiple) LED boards 18A1 and 18A2 are arranged in line. The LEDs 17 are arranged in line and mounted on the LED boards 18A1 and 18A2, respectively. The LEDs 17 on an LED board 18A1 and the LEDs 17 on the LED board 18A2 form the LED array 170A1 and the LED array 170A2, respectively. The LEDs 17 mounted on the LED boards 18A1 and 18A2 are arranged in line at equal intervals as a whole. In the lighting unit in this embodiment, two (multiple) phosphor tubes 30A1 and 30A2 assigned to the LED boards 18A1 and 18A2 respectively are arranged in line. The light guide plate 19A in this embodiment includes the light reflecting and scattering pattern 220A formed on the back surface 19*b* (the opposite surface) is different from that of the light guide plate 19 in the first embodiment. However, other configurations of the light guide plate 19A are the same as those of the light guide plate 19.

When the light guide plate 19 is viewed from the front side, as illustrated in FIG. 7, the LED board 18A1 including the LED array 170A1 and the phosphor tube A1 are located on the left side of the light guide plate 19A (a short end surface 19*e* side). The LED board 18A2 including the LED array 170A2 and the phosphor tube A2 are located on the right side of the light guide plate 19A (a short end surface 19*f* side). In this embodiment, the LED board 18A1 including the LED array 170A1 and the LED board 18A2 including the LED array 170A2 have the same size. The phosphor tubes 30A1 and 30A2 have the same size.

A phosphor tube 30A1 is disposed between the LEDs 17 mounted on the LED board 18A1 and the light entering surface 19*c* of the light guide plate 19A. The phosphor tube 30A2 is disposed between the LEDs 17 mounted on the LED board 18A2 and the light entering surface 19*c* of the light guide plate 19A.

The phosphor tube 30A1 on the left side includes a first end 34 and a second end 35. The first end 34 is disposed outer than the left edge of the light entering surface 19*c* so as not to overlap the light entering surface 19*c* with respect to the light emitting direction of the LEDs 17. The second end 35 is disposed so as to overlap the light entering surface 19*c* with respect to the light emitting direction of the LEDs 17. The phosphor tube 30A2 on the right side includes a first end 35 and a second end 34. The first end 35 is disposed outer than the right edge of the light entering surface 19*c* so as not to overlap the light entering surface 19*c* with respect to the light emitting direction of the LEDs 17. The second end 34 is disposed so as to overlap the light entering surface 19*c* with respect to the light emitting direction of the LEDs 17.

As illustrated in FIG. 8, the light reflecting and scattering pattern 220A formed on the back surface 19*b* of the light guide plate 19A includes the dots 22, which are also in the first embodiment. The dots 22 include the complementary color dots 22*a* that exhibit yellow and the white dots 22*b* that exhibit white. In this embodiment, in addition to the short ends 192 and 193 of the light guide plate 19A, the complementary color dots 22*a* are formed in the middle area of the back surface 19*b* across the light guide plate 19A in the short direction. A layout pattern (a density per unit area) of the dots 22 formed on the back surface 19*b* is similar to the layout pattern thereof in the first embodiment.

In this embodiment, light that have passed through the ends 34 and 35 of the phosphor tubes 30A1 and 30A2 that do not have a wavelength converting function (bluish light) is supplied not only to the section along the short ends 192 and 193 of the light guide plate 19A but also to the section across the short dimension of the light guide plate 19A at the middle. Therefore, in this embodiment, as illustrated in FIG. 8, the complementary color dots 22*a* are arranged at the middle of the back surface 19*b* of the light guide plate 19A. In this embodiment, the complementary color dots 22*a* are arranged so as to cross the back surface 19*b* (the opposite surface) in the direction along the light emitting direction of the LEDs 17 from where the phosphor tubes 30A1 and 30A2 are next to each other.

In FIG. 7, sections R1 and R2 are illustrated. The sections R1 and R2 are located closer to the short end surfaces 19*e* and 19*f* (the light source non-opposed adjacent end surfaces) adjacent to the light entering surface 19*c* of the light guide plate 19A, respectively. The sections R1 and R2 linearly extend from an outer end 34 of the first phosphor tube 30A1 and the outer end 35 of the second phosphor tube 30A2 in the direction along the light emitting direction of the LEDs 17. The section R3 linearly extends from an inner end 35 of the first phosphor tube 30A1 and the inner end 34 of the second phosphor tube 30A2 in the direction along the light emitting direction of the LEDs 17.

In this embodiment, the bluish light exiting from the ends 34 and 35 of the phosphor tubes 30A1 and 30A2 (the light rays including the blue light rays with the higher percentage in comparison to the middle section) enters the sections R1, R2, and R3 of the light guide plate 19A.

Among the light rays exiting from the light exiting surface 19*a* of the light guide plate 19A, the light rays directed to the liquid crystal panel 11 are the light rays that pass through a section inside the inner edges of the frame 16. If the light reflecting and scattering pattern 220 includes only the white dots 22*b*, areas of the display surface of the liquid crystal panel 11 corresponding to an intersection R11 of the rectangular 130 and the section R1, an intersection R22 of the rectangular 130 and the section R2, and an intersection R33 of the rectangular 130 and the section R3 may become bluish.

In this embodiment, the complementary color dots 22*a* of the light reflecting and scattering pattern 220 are arranged on the back surface 19*b* of the light guide plate 19A to overlap at least the sections R1, R2, and R3 in the plan view. The sections R1, R2, and R3 are the sections of the light guide plate 19A to which the bluish light is supplied.

In the lighting unit in this embodiment, the light rays exiting from the sections R1, R2, and R3 (R11, R22, and R33) which linearly extends from the ends 34 and 35 of the phosphor tubes 30A1 and 30A2 in the direction along the light emitting direction of the LEDs 17 are less likely to be tinted with the color of the primary light rays emitted by the LED 17 (blue) more than the light rays exiting from other sections. Therefore, the planar white light with reduced uneven brightness is emitted by the lighting unit.

<Third Embodiment>

Figure 9:
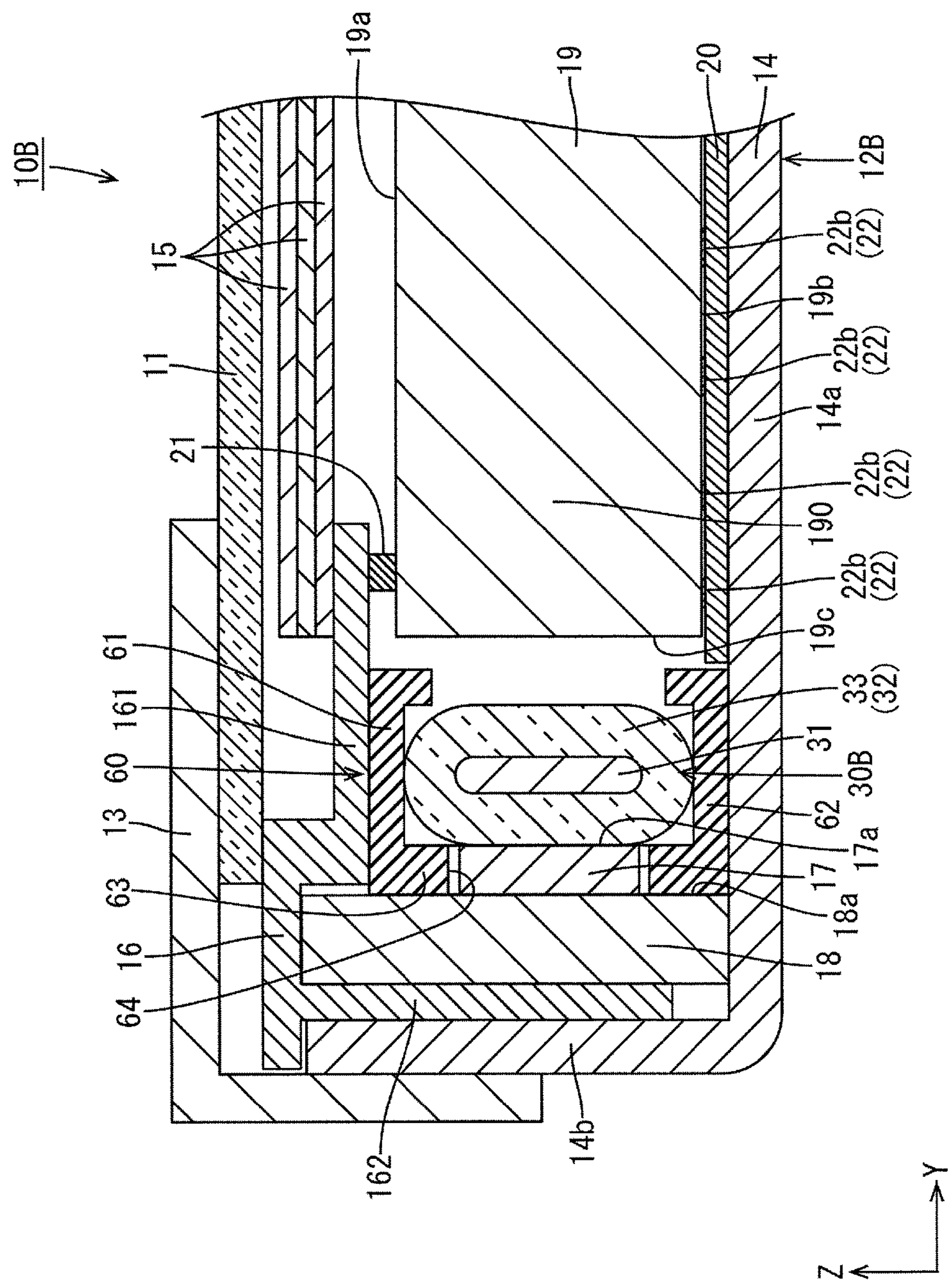
FIG. 9 is a magnified cross-sectional view of a portion of a liquid crystal display device including a light entering surface and therearound according to a third embodiment.
Figure 10:
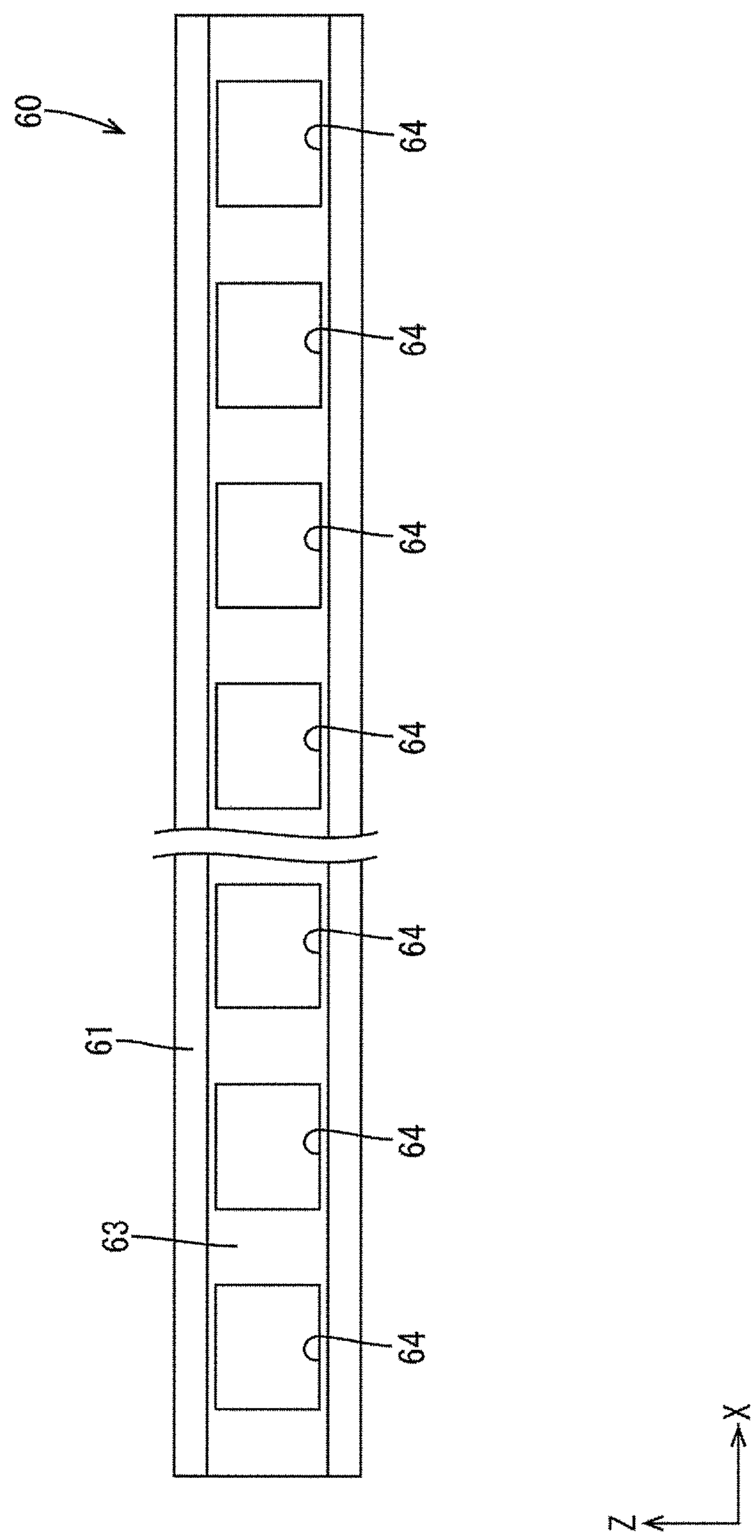
FIG. 10 is a front view of a holder.

A third embodiment of the present invention will be described with reference to FIGS. 9 and 10. FIG. 9 is a magnified cross-sectional view of a portion of a liquid crystal display device 10B including the light entering surface 19*c* and therearound according to the third embodiment. FIG. 10 is a front view of a holder. A lighting unit 12B included in the liquid crystal display device 10B according to this embodiment includes a phosphor tube 30B held by a holder 60 having an elongated shape. The configuration of the phosphor tube 30B is similar to that of the first embodiment.

As illustrated in FIG. 9, the phosphor tube 30B (a wavelength converting member) in this embodiment is held by the holder 60 and disposed in a space between the LEDs 17 and light entering surface 19*c* of the light guide plate 19. The holder 60 is a molded member having an elongated overall shape and made of synthetic resin that exhibits white having high light reflectivity. The holder 60 has a C-shaped cross section to sandwich a section of the phosphor tube 30B in the top-bottom direction (the front-rear direction) for an enter length thereof. The section of the phosphor tube 30B holds the wavelength converting portion therein. The holder 60 includes a front holding wall 61, a rear holding wall 62, and a connecting wall 63. The front holding wall 61 and the rear holding wall 62 hold the phosphor tube 30B in the top-bottom direction. The connecting wall 63 connects the front holding wall 61 to the rear holding wall 62 in the top-bottom direction (the front-rear direction). The connecting wall 63 is disposed closer to the LEDs 17 (the LED board 18) than the phosphor tube 30B. The holder 60 that holds the phosphor tube 30B in the top-bottom direction opens toward the light entering surface 19*c* of the light guide plate 19.

In this embodiment, the holder 60 is sandwiched between the frame 16 and the bottom plate 14*a* of the chassis 14 with the front holding wall 61 in contact with the frame body 161 and the rear holding wall 62 placed on the bottom plate 14*a*. The connecting wall 63 stands in the top-bottom direction inside the chassis 14 and extends in a direction in which the LEDs 17 are arranged in line. The connecting wall 63 includes holes 64 to expose the LEDs 17 on the light entering surface 19*c* side. Inside the chassis 14, the connecting wall 63 is held against the mounting surface 18*a* of the LED board 18 with the LEDs 17 exposed through the holes 64. The phosphor tube 30B is held by the holder 60 as described above and fixed to the bottom plate 14*a* of the chassis 14 with a fixing member that is not illustrated. In this embodiment, as illustrated in FIG. 9, the light emitting surfaces 17*a* of the LEDs 17 are in close contact with a wall surface of the holding portion 32 of the phosphor tube 30B.

Figure 11:
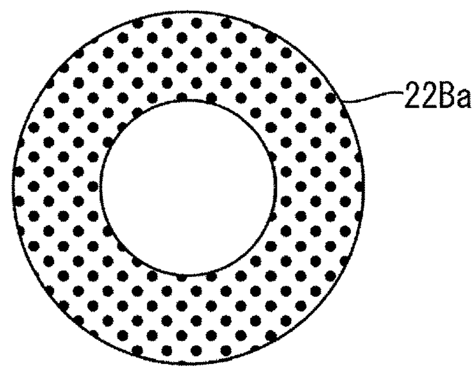
FIG. 11 is a view illustrating a complementary color dot in a first modification.
Figure 12:
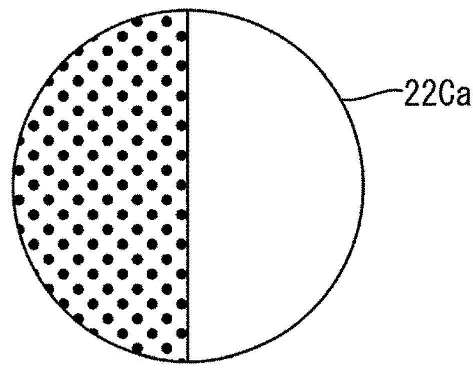
FIG. 12 is a view illustrating a complementary color dot in a second modification.
Figure 13:
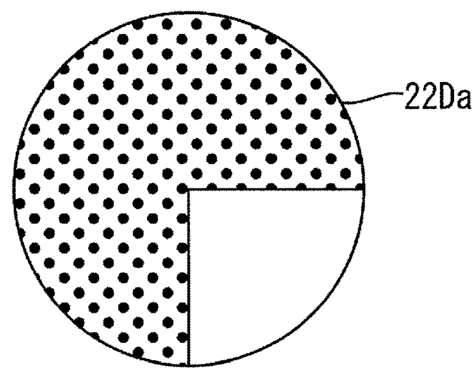
FIG. 13 is a view illustrating a complementary color dot in a third modification.

As in this embodiment, the phosphor tube 30B can be fixed at a predefined position inside the chassis 14 using the holder 60. With the holder 60, the phosphor tube 30B can be easily set at a predefined position as appropriate. In this embodiment, the complementary color dots are defined to exhibit the complementary color (yellow) of the reference color exhibited by the primary light rays (the blue light rays) for the entire surface. However, the present invention is not limited to such a configuration. The dots may be defined such that some of the dots exhibit the complementary color (yellow) of the reference color (the blue light rays) and the rest of the dots exhibit white. A complementary color dot 22Ba illustrated in FIG. 11 is a first modification. The complementary color dot 22Ba includes a center section that exhibits white and an annular section that surrounds the center section and exhibits the complementary color (yellow) of the reference color (blue). A complementary color dot 22Ca illustrated in FIG. 12 is a second modification. The complementary color dot 22Ca includes two semicircular sections. A first semicircular section may be in white and a second semicircular section may be in the complementary color (yellow) of the reference color (the blue light rays). A complementary color dot 22Da illustrated in FIG. 13 is a third modification. The complementary color dot 22Da includes quadrants. One of the quadrants (¼) may be in white and the rest of the quadrants (¾) may be in the complementary color (yellow) of the reference color (the blue light rays). The density of the complementary color dots per unit area may be adjusted by setting a section of each complementary dot to exhibit the complementary color (yellow) of the reference color (the blue light rays).

Figure 14:
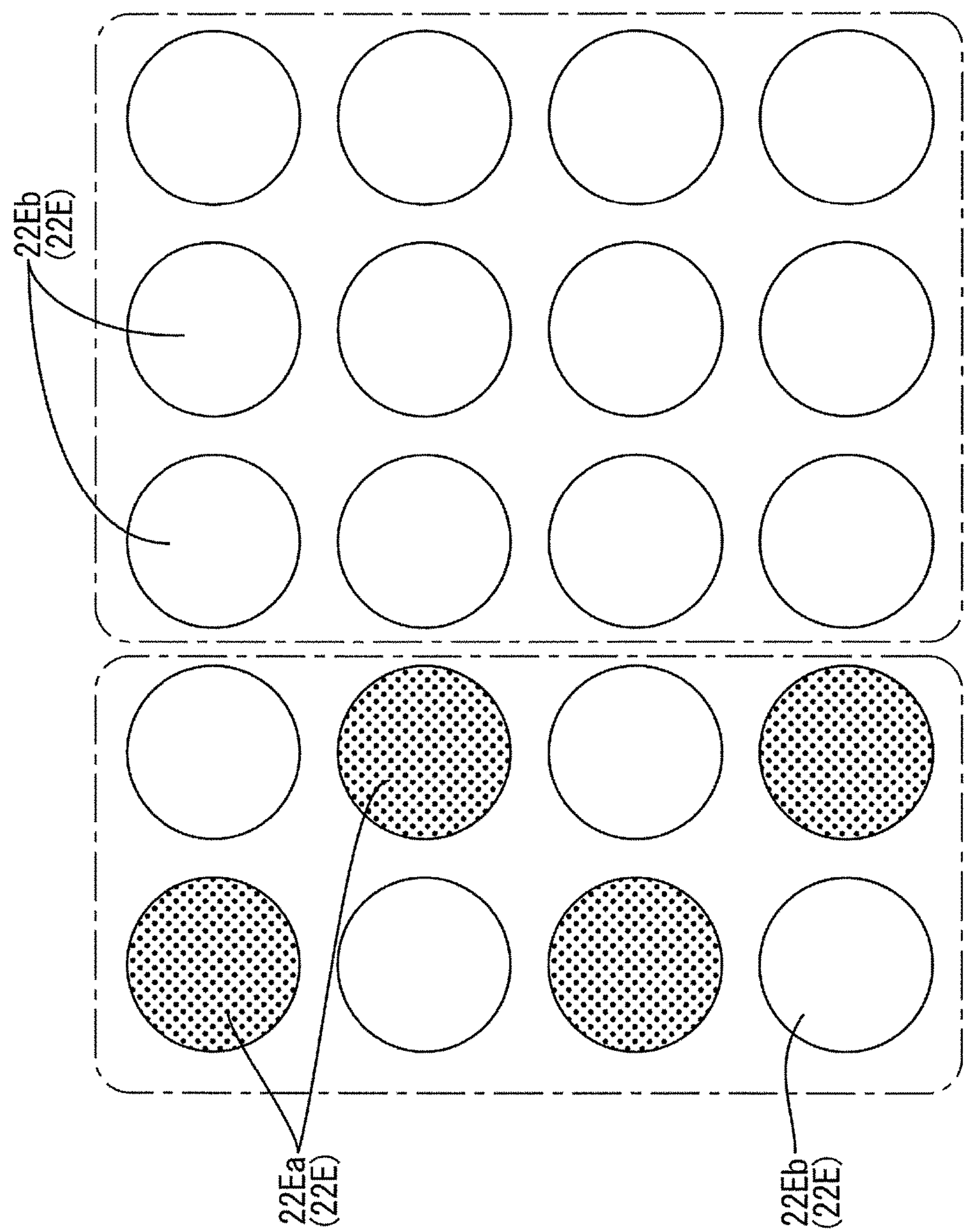
FIG. 14 is a view illustrating a light reflecting and scattering pattern according to other embodiments.

In the above embodiments, the white dots among the dots of the light reflecting and scattering patterns are all arranged on the inner side in comparison to the complementary color dots. However, the white dots may be arranged between the adjacent complementary color dots as long as they do not have adverse effect on the object of the present invention. FIG. 14 is a view illustrating a section of a light reflecting and scattering pattern according to another embodiment. As illustrated in FIG. 14, white dots Eb are arranged between adjacent complementary color dots 22Ea. The density of the complementary color dots 22Ea per unit area may be adjusted by arranging the dots 22E as described above.

Figure 15:
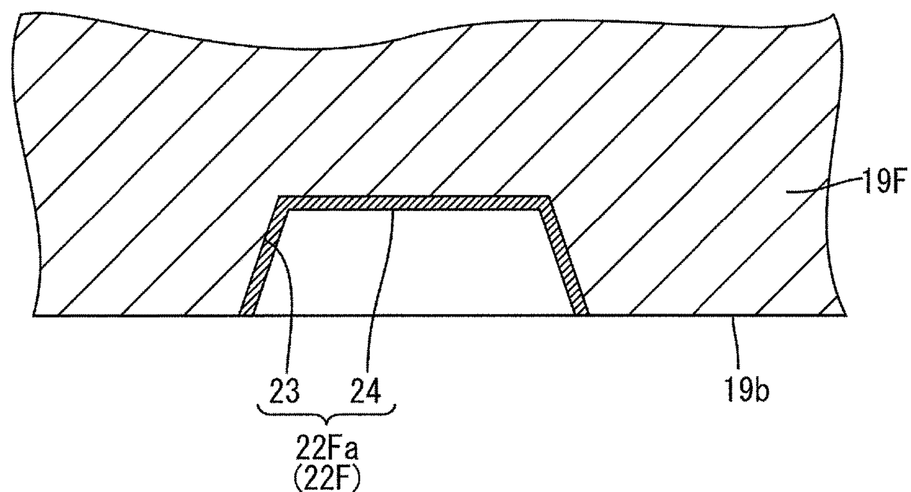
FIG. 15 is a cross-sectional view of a complementary color dot according to other embodiments.
Figure 16:
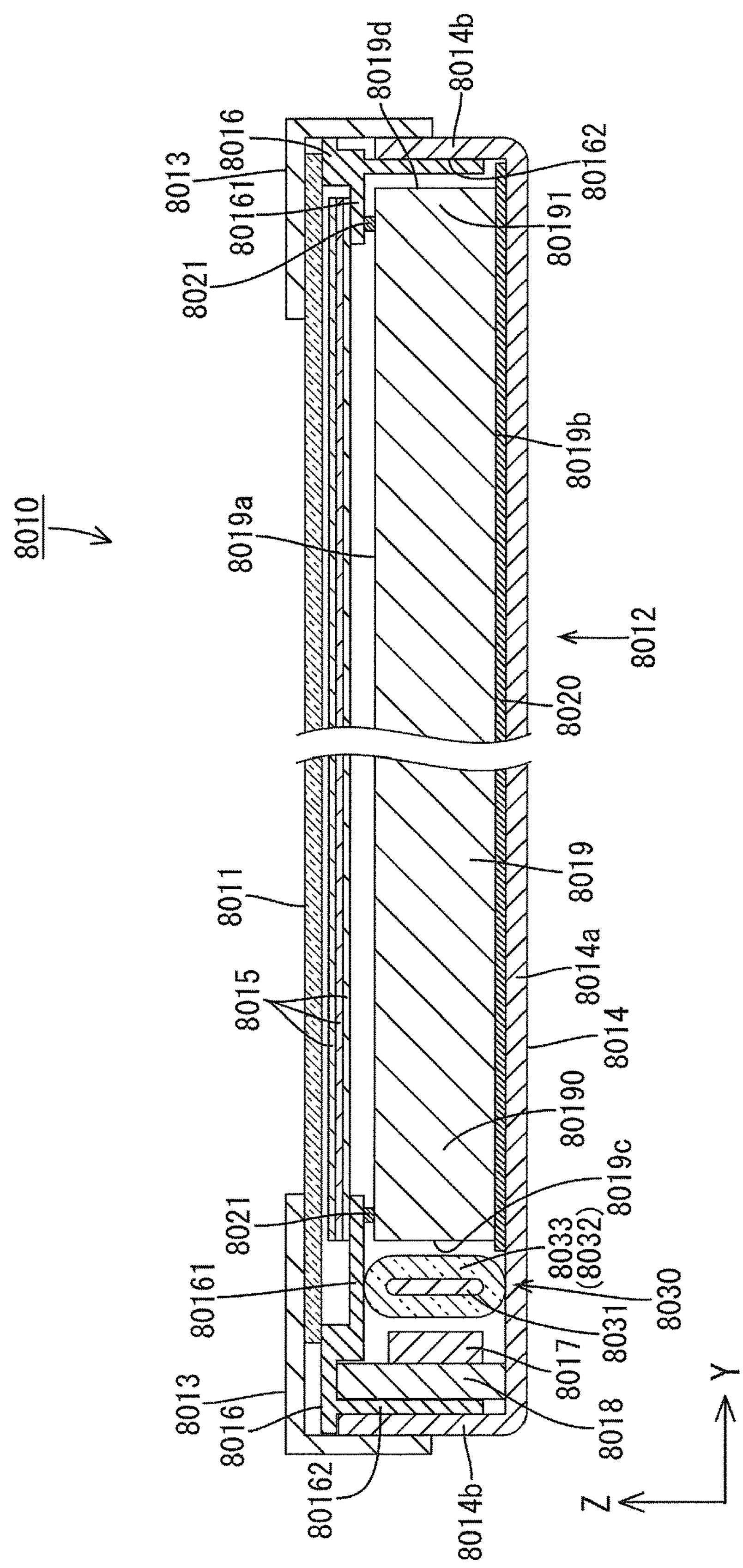
FIG. 16 is a cross-sectional view along lien A-A according to a fourth embodiment (similar to the cross-sectional view of the first embodiment in FIG. 2).
Figure 17:
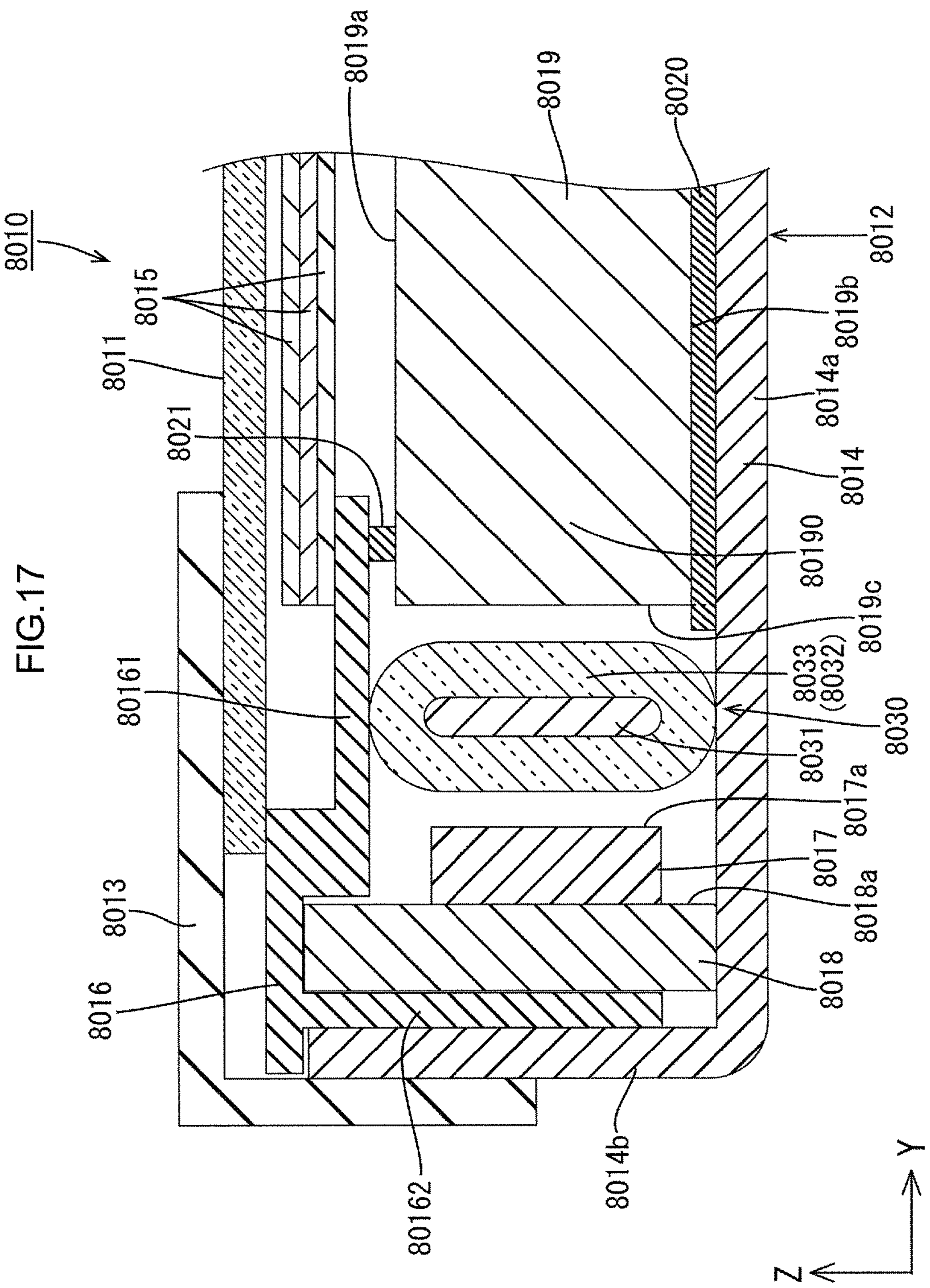
FIG. 17 is a magnified cross-sectional view including an LED 8017 in FIG. 16 and therearound.

In the above embodiments, the dots of the light reflecting and scattering patterns are formed from the paint films containing the predefined coloring agents. However, dots having different configuration may be used as long as they do not have adverse effects on the object of the present invention. A dot 22F illustrated in FIG. 15 includes a recess 23 in the form of a dot formed on the back surface 19*b* (an opposite surface) of a light guide plate 19F through emboss processing. A paint 24 (a paint film) is applied to the inner wall of the recess 23. The paint 24 absorbs the primary light rays and exhibits the complementary color (yellow) of the reference color exhibited by the primary light rays. A white dot includes only a recess 23. The dots 22F may be formed from recesses 23 as described above.

<Fourth Embodiment>

A fourth embodiment will be described with reference to FIGS. 16 to 22. A liquid crystal display device 8010 includes a liquid crystal panel 8011 having a configuration similar to the liquid crystal display device 10 according to the first embodiment. A lighting unit 8012 has a configuration similar to the first embodiment except for a light guide plate 8019. Namely, a chassis 8014, optical members 8015, a frame 8016, LEDs 8017, an LED board 8018, a reflection sheet 8020, and a phosphor tube 8030 have configurations similar to the first embodiment unless otherwise described.

The light guide plate 8019 is made of transparent synthetic resin having high light transmissivity and a refraction index sufficiently higher than that of air (e.g., acrylic resin such as PMMA, polycarbonate resin). The light guide plate 8019 is a plate shaped member having a rectangular shape similar to the liquid crystal panel 8011 in the plan view. The light guide plate 8019 is held in the chassis 8014 such that a front surface 8019*a* thereof is opposed to the liquid crystal panel 8011 and a back surface 8019*b* (an opposite surface) thereof is opposed to the reflection sheet 8020. The front surface 8019*a* of the light guide plate 8019 is a light exiting surface 8019*a* through which light rays exit toward the liquid crystal panel 8011. The optical members 8015 are supported by the frame 8016 between the light exiting surface 8019*a* and the liquid crystal panel 8011. One of adjacent long end surfaces 8019*c* of the light guide plate 8019 is a light entering surface 8019*c* through which the light rays from the LEDs 8017 enter. An end of the light guide plate 8019 including the light entering surface 8019*c* may be referred to as a light entering end 80190.

The other long adjacent end surface 8019*d* of the light guide plate 8019 and two short end surfaces 8019*e* and 19*f* of the light guide plate 8019 are not opposed to the light sources (the LEDs 8017). Therefore, they may be referred to as "light source non-opposed end surfaces." The light source non-opposed surface (the long adjacent end surface 8019*d*) on the opposite side from the light entering surface 8019*c* may be referred as an "opposite-side light source non-opposed surface." In this description, ends 80191, 80192, and 80193 of the light guide plate including the light source non-opposed end surfaces may be referred to as "light source non-opposed ends." The end 80191 of the light guide plate 8019 including the opposite-side light source non-opposed surface may be referred to as an "opposite-side light source non-opposed end." The ends 80192 and 80193 of the light guide plate including adjacent end surfaces 8019*e* and 8019*f* (the short end surfaces) which are the light source non-opposed surfaces adjacent to the light entering surface 8019*c* may be referred to as "light source non-opposed adjacent ends."

The frame 8016 has a frame shape (a picture frame shape) as a whole to cover peripheral ends of the light guide plate 8019 from the front side. The frame 8016 is fitted in an opening of the chassis 8014 from the front side. The frame 8016 is made of synthetic resin and painted in white to have light reflectivity. The frame 8016 includes a frame body 80161 and projecting walls 80162. The frame body 80161 has a frame shape in the plan view. The frame body 80161 includes an inner edge portion held against the peripheral ends of the light guide plate 8019 that is held in the chassis 8014 from the front side. The projecting walls 80162 project from the frame body 80161 toward a bottom plate 8014*a* of the chassis 8014. The projecting walls 80162 are held in the chassis 8014. A frame width of the frame body 80161 is predefined such that inner edge portions overlap the outer edge portions of the light guide plate 8019 and outer edge portions overlap upper ends of a sidewall plate 8014*b*. An elastic member 8021 that may be made of urethane foam is attached to back surfaces of the inner edge portions of the frame body 80161. The elastic member 8021 in this embodiment is black in color and has a light blocking property. The elastic member 8021 has a frame-like (ring-like) overall shape. The elastic member 8021 is brought into contact with the outer edge portions of the light guide plate 8019 from the front side. The frame body 80161 is formed such that surfaces on the inner edge sides are one step lower than surfaces on the outer edge sides. The edges of the optical members 8015 are placed on the surfaces that are one step lower. Each projecting wall 80162 has a plate shape that extends from the outer edge portion of the frame body 80161 toward the bottom plate 8014*a* of the chassis 8014 to be opposed to the end surface 8019*c* of the light guide plate 8019. The projecting walls 80162 form a drum-like shape to surround the light guide plate 8019. The LED board 8018 on which the LEDs 8017 are mounted are attached to a portion of the projecting wall 80162 opposed to the first long end surface 8019*c* of the light guide plate 8019. A portion of the projecting wall 80162 other than the portion to which the LED board 8018 is attached is placed between the end surface of the light guide plate 8019 and the sidewall plate 8014*b* and held in the chassis 8014.

Figure 18:
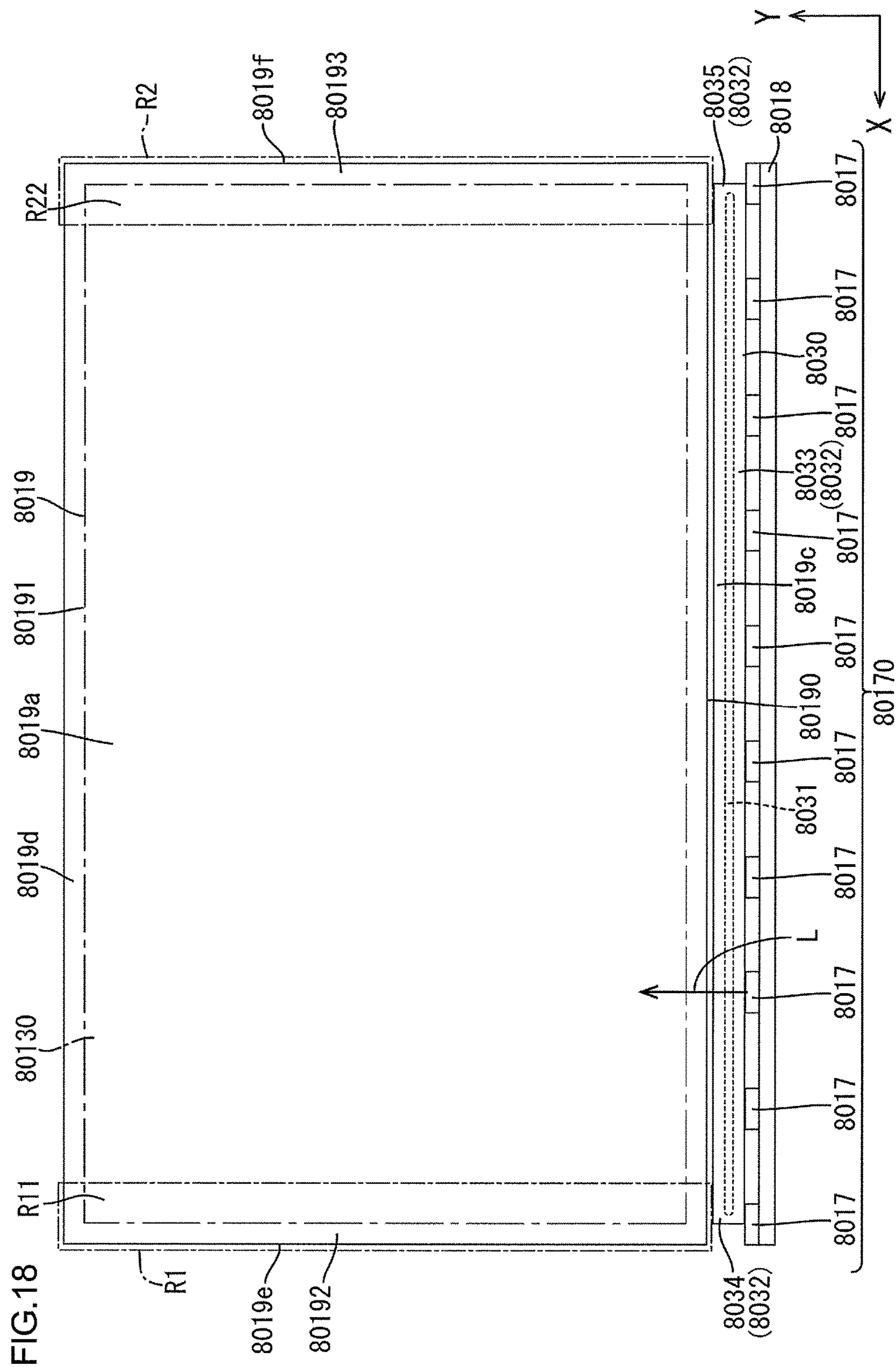
FIG. 18 is a plan view schematically illustrating positional relationships among an LED array, a phosphor tube, and a light guide plate viewed from the front side.

FIG. 18 is a plan view schematically illustrating positional relationships among an LED array 80170, the phosphor tube 8030, and the light guide plate 8019. The LEDs 8017 are so-called top surface emitting type LEDs and surface-mounted on a plate surface 8018*a* (a mounting surface) of the LED board 8018 having an elongated shape. The LEDs 8017 are arranged in line at equal intervals and mounted on the LED board 8018. The line of the LEDs 8017 may be referred to as an LED array 80170 (an example of a light source array).

The LEDs 8017 mounted on the LED board 8018 are oriented such that the light emitting surfaces 8017*a* are opposed to the first long end surface 8019*c* of the light guide plate 8019 via the phosphor tube 8030. The LEDs 8017 mounted on the LED board 8018 that is fixed to the projecting wall 80162 of the frame 8016 are held in the chassis 8014. The phosphor tube 8030 is disposed between the light emitting surfaces 8017*a* of the LEDs 8017 and the light entering surface 8019*c* of the light guide plate 8019, which will be described later. The phosphor tube 8030 will be described in detail later. The LEDs 8017 are configured to emit light rays (blue light rays) toward the light entering surface 8019*c* of the light guide plate 8019. In this description, a direction in which the light emitting surfaces 8017*a* of the LEDs 8017 (a light emitting direction of the LEDs 8017, an optical axis direction L of the LEDs 8017) may be referred to as "the front" and an opposite direction from that direction may be referred to as "the rear."

The optical members 8015 have a horizontally-long rectangular shape in a plan view similar to the liquid crystal panel 8011. The outer edge portions of the optical members 8015 are disposed between the light exiting surface 8019*a* of the light guide plate 8019 and the back surface of the liquid crystal panel 8011 with the edge portions placed on the frame body 80161 of the frame 8016 from the front side. The optical members 8015 have functions for exerting predefined optical effects on the light rays exiting from the light guide plate 8019 and directing the light rays toward the liquid crystal panel 8011. The optical members 8015 include multiple sheets that are placed on top of each other (optical sheets). The optical members 8015 may include optical sheets such as a diffuser sheet, a lens sheet, and a reflective type polarizing sheet.

The phosphor tube 8030 (a wavelength converting member) will be described. The phosphor tube 8030 has an elongated shape similar to the first embodiment. The phosphor tube 8030 is disposed in a space between the light emitting surfaces 8017*a* of the LEDs 8017 and the light entering surface 8019*c* of the light guide plate 8019 to extend along the direction in which the LEDs 8017 are arranged in line (the long direction of the light guide plate 8019 in this embodiment). The phosphor tube 8030 includes a wavelength converting portion 8031 and a holding portion 8032 similar to the first embodiment. The wavelength converting portion 8031 contains quantum dot phosphors (an example of phosphors). The holding portion 8032 is an elongated member having light transmissivity and holds the wavelength converting portion 8031 to surround the wavelength converting portion 8031.

As illustrated in FIG. 18, the phosphor tube 8030 is disposed inside the lighting unit 8012 such that the wavelength converting portion 8031 held in the holding portion 8032 overlap the light emitting surface 8017*a* of the LEDs 8017 and the light entering surface 8019*c* of the light guide plate 8019 with respect to the light emitting direction of the LEDs 8017 (the optical axis direction L of the LEDs 8017). The LEDs 8017 in the middle excluding the ones at ends in the LED array 80170 are oriented inside the lighting unit 8012 such that the light emitting surfaces 8017*a* are opposed to the wavelength converting portion 8031 held in the holding portion 8032. The LEDs 8017 in the middle are positioned to overlap the light entering surface 8018*c* with respect to the light emitting direction of the LEDs 8017 (the optical axis direction L of the LEDs 8017) via the wavelength converting portion 8031.

Ends 8034 and 8035 of the phosphor tube 8030 with respect to the long direction thereof are made of a material having light transmissivity (e.g., glass) and do not have a wavelength converting function. The ends 8034 and 8035 of the phosphor tube 8030 are disposed to overlap the light entering surface 8019*c* with respect to the light emitting direction of the LEDs 8017 (the optical axis direction L of the LEDs 8017) so as not to extend over the outer edges of the light entering surface 8019*c*. The LEDs 8017 at the ends of the LED array 80170 are disposed in the lighting unit 8012 such that some areas of the light emitting surfaces 8017*a* are opposed to the wavelength converting portion 8031 together with the ends 8034 and 8035 (the non-wavelength converting portions) and the rest of areas of the light emitting surfaces 8017*a* are directly opposed to the light entering surface 8019*c* of the light guide plate 8019. A left area of the light emitting surface 8017*a* of the LED 8017 at the left end of the LED array 80170 is directly opposed to the light entering surface 8019*c* and a right area of the light emitting surface 8017*a* is opposed to the left end section of the wavelength converting portion 8031 together with the left end 8034 of the phosphor tube 8030. A right area of the light emitting surface 8017*a* of the LED 8017 at the right end of the LED array 80170 is directly opposed to the light entering surface 8019*c* and a left area of the light emitting surface 8017*a* is opposed to the right end section of the wavelength converting portion 8031 together with the right end 8035 of the phosphor tube 8030.

The primary light rays (blue light rays) emitted by the LEDs 8017 in the middle of the LED array 80170 travel mainly toward the middle portion of the phosphor tube 8030 (including the wavelength converting portion 8031). The wavelength converting portion 8031 convert some of the primary light rays (the blue light rays) emitted by the LEDs 8017 into the secondary light rays (green light rays and the red light rays). The primary light rays emitted by the LEDs 8017 travel through the phosphor tube 8030 from the rear (the LED 8017 side) to the front (the light guide plate 8019 side) and are converted into the secondary light rays while traveling through the phosphor tube 8030. Some of the primary light rays emitted by the LEDs 8017 travel through the phosphor tube 8030 from the rear (the LED 8017 side) to the front (the light guide plate 8019 side) without the wavelength conversion. With some of the primary light rays emitted by the LEDs 8017 and wavelength converted while traveling through the phosphor tube 8030 from the rear (the LED 8017 side) to the front (the light guide plate 8019 side), white transmitted light including the primary light rays and the secondary light rays exits from the phosphor tube 8030 toward the light entering surface 8019*c* of the light guide plate 8019.

The primary light rays emitted by the LEDs 8017 at the ends of the LED array 80170 travel mainly toward the ends of the wavelength converting portion 8031 closer to the ends 3034 and 8035 of the phosphor tube 8030. Some of the blue light rays (the primary light rays) entering the wavelength converting portion 8031 are converted into the secondary light rays by the quantum dot phosphors in the wavelength converting portion 8031 excited by the blue light rays. Some of the blue light rays emitted by the LEDs 8017 at the ends pass through the ends 8034 and 8035 of the phosphor tube 8030 which do not have the wavelength converting function without the wavelength conversion and directed to the light entering surface 8019*c*. Namely, light tinted with a color exhibited by the primary color rays (bluish light in this embodiment) exits from the ends 8034 and 8035 of the phosphor tube 8030 toward the light entering surface 8019*c*.

Figure 19:
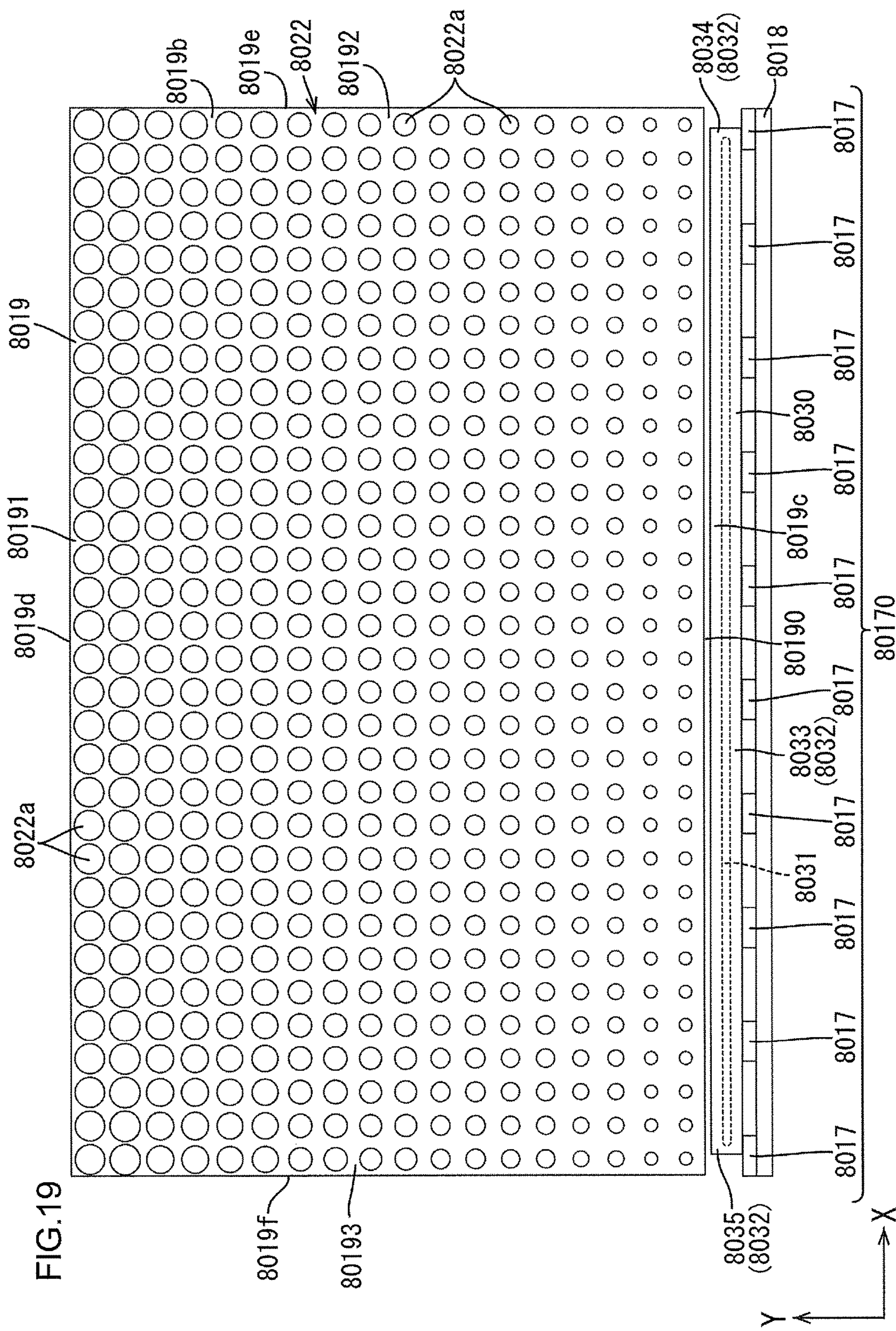
FIG. 19 is a plan view schematically illustrating positional relationships among the LED array, the phosphor tube, and the light guide plate viewed from the rear side.

FIG. 19 is a plan view schematically illustrating positional relationships among the LED array 80170, the phosphor tube 8030, and the light guide plate 8019 viewed from the rear side. As illustrated in FIG. 19, a light reflecting and scattering pattern 8022 including the dots 8022*a* is formed on the back surface 8019*b* of the light guide plate 8019. Each dot 8022*a* has light reflectivity and a light scattering property. The dots 8022*a* are round paint films in white. The dots 8022*a* are formed on the back surface 8019*b* of the light guide plate 8019 with a known method such as printing. In the light reflecting and scattering pattern 8022, the dots 8022*a* closer to the LEDs 8017 (i.e., closer to the light entering surface 8019*c*) are smaller in size and a density of the dots 8022*a* (a density per unit area) is lower. As a distance from the LEDs 8017 increases, the size of the dots 8022*a* increases and the density of the dots 8022*a* (the density per unit area) increases. The light rays that have entered the light guide plate 8019 through the light entering surface 8019*c* and have reached the dots 8022*a* are reflected or scattered by the dots 8022*a* and exit through the light exiting surface 8019*a*.

Figure 20:
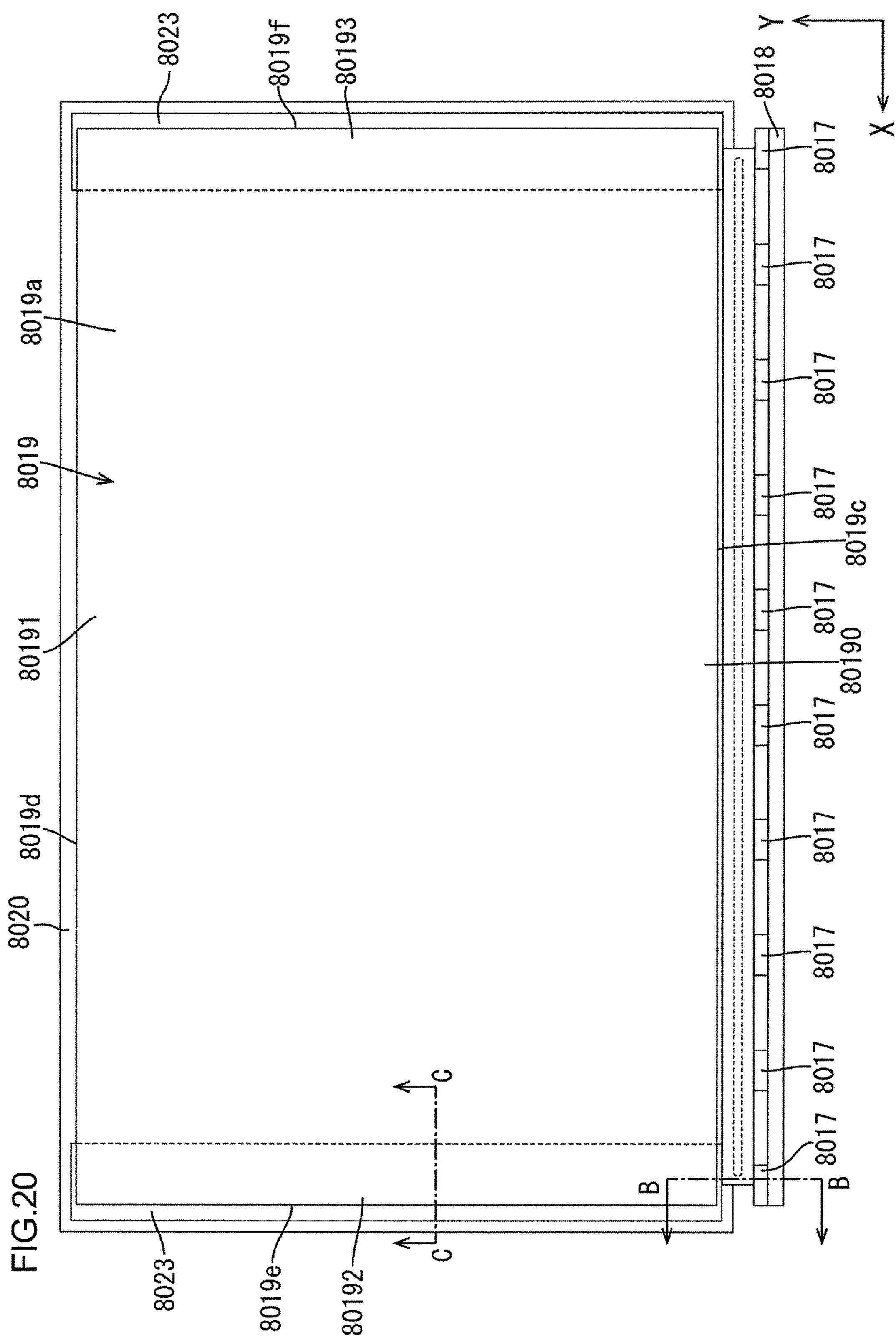
FIG. 20 is a plan view schematically illustrating positional relationships among an LED array, a phosphor tube, a light guide plate, a complementary color member, and a reflection sheet viewed from the front side.
Figure 21:
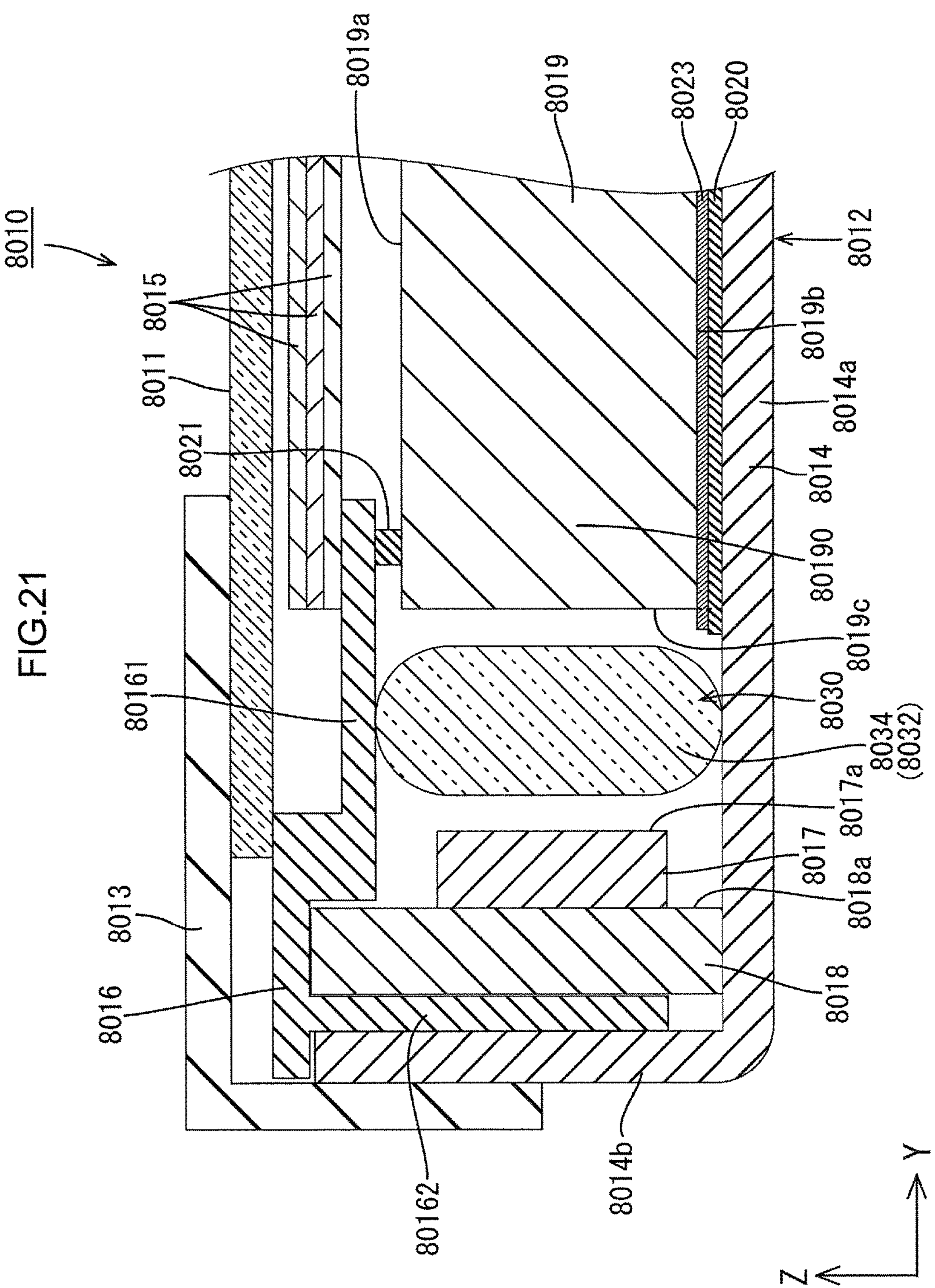
FIG. 21 is a magnified cross-sectional view of a portion of a liquid crystal display device including an LED on the left side of an LED array and therearound.
Figure 22:
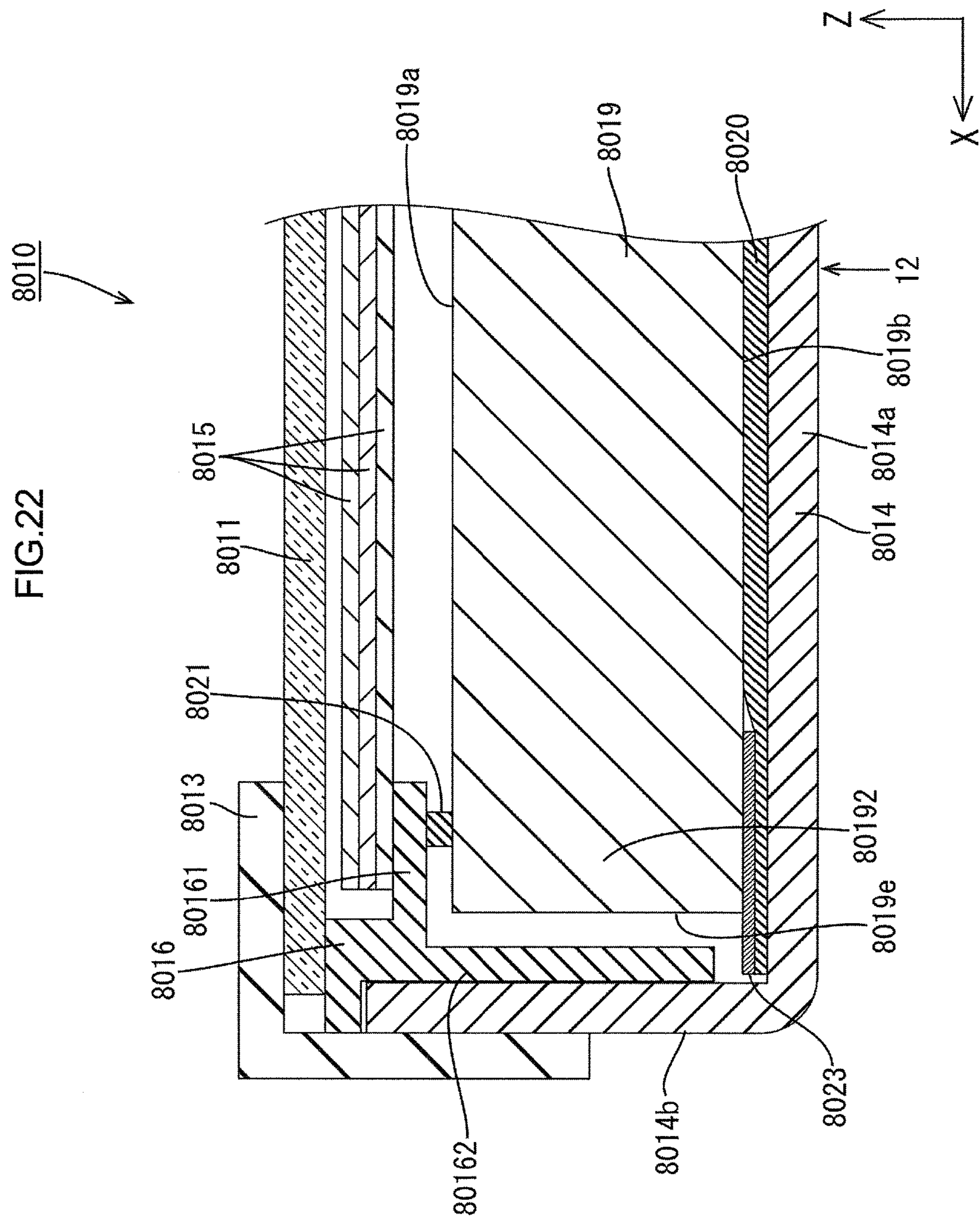
FIG. 22 is a magnified cross-sectional view of a portion of the liquid crystal display device including a light source non-opposed adjacent end section and therearound.

Next, complementary color members 8023 will be described with reference to FIGS. 20 to 22. FIG. 20 is a plan view schematically illustrating positional relationships among the LED array 80170, the phosphor tube 8030, the light guide plate 8019, the complementary color members 8023, and the reflection sheet 8020 viewed from the front side. FIG. 21 is a magnified cross-sectional view of a portion of the liquid crystal display device 8010 including the LED on the left end in the LED array 80170 and therearound. FIG. 22 is a magnified cross-sectional view of a portion of the liquid crystal display device 8010 including the light source non-opposed adjacent end 80192 and therearound. FIG. 21 illustrates the cross section along line B-B in FIG. 20. FIG. 22 illustrates the cross section along line C-C in FIG. 20.

The complementary color members 8023 are sheet-shaped members that exhibit a complementary color (yellow in this embodiment) of blue (the reference color) exhibited by the light rays emitted by the LEDs 8017 (the primary light rays, the blue light rays). The complementary color members 8023 (an example of a first complementary color member) in this embodiment have light transmissivity and a function of absorbing some of the light rays emitted by the LEDs 8017 (the primary light rays, the blue light rays), converting the light rays in a different wavelength range (secondary light rays), and releasing the light rays. The complementary color members 8023 contain phosphors that emit the light rays in the different wavelength range (the secondary light rays) when excited by the light rays emitted by the LEDs 8017 (the primary light rays, the blue light rays).

Each complementary color member 8023 in this embodiment includes a wavelength converting layer, a pair of supporting layers, and a pair of barrier layers. The wavelength converting layer contains the phosphors. The supporting layers sandwich the wavelength converting layer. The barrier layers are disposed over outer surfaces of the respective supporting layers to sandwich the wavelength converting layer and the supporting layers. The wavelength converting layer of the complementary color member 8023 includes an acrylic resin as a binder resin and quantum dot phosphors dispersed in the acrylic resin. The supporting layers of the complementary color member 8023 are sheet shaped (or film shaped) members made of polyester-based resin such as PET.

The quantum dot phosphors contained in the wavelength converting layers of the complementary color members 8023 include green quantum dot phosphors and red quantum dot phosphors as quantum dot phosphors. The green quantum dot phosphors emit green light (in a wavelength range from about 500 nm to about 570 nm). The red quantum dot phosphors emit red light rays (in a wavelength range from about 600 nm to about 780 nm). Materials similar to those in the wavelength converting portion 8031 in the phosphor tube 8030 (e.g., CdSe) may be used for the quantum dot phosphors. A light scattering agent or other component may be included in the wavelength converting layers of the complementary color members 8023. The barrier layers may be made from metal oxide films made of alumina or silicon oxide. The barrier layers have a function of protecting the quantum dot phosphors in the wavelength converting layers from moisture (liquid) or oxygen.

As illustrated in FIGS. 20 to 22, the complementary color members 8023 are disposed between the back surface 8019*b* (the opposite surface) of the light guide plate 8019 and the reflection sheet 8020 to overlap the ends 80192 and 80193 (the light source non-opposed adjacent ends) of the light guide plate 8019, respectively. The complementary color members 8023 have a rectangular shape in the plan view. The complementary color members 8023 are disposed to cover the ends 80192 and 80193 (the light source non-opposed adjacent ends) on the right and the left sides of the light entering surface 8019*c* from the back surface 8019*b* (opposite surface) side, respectively. Sections of the complementary color members 8023 are located outer than the ends 80192 and 80193 (the light source non-opposed adjacent ends). The back surfaces of the ends 80192 and 80193 (the light source non-opposed adjacent ends) of the light guide plate 8019 are entirely covered with the complementary color members 8023.

In FIG. 18, sections R1 and R2 of the light guide plate 8019 are illustrated. The sections R1 and R2 are located closer to the short end surfaces 8019*e* and 8019*f* (the light source non-opposed adjacent end surfaces) adjacent to the light entering surface 8019*c*. The sections R1 and R2 linearly extend from the respective ends 8034 and 8035 of the phosphor tube 8030 along the light emitting direction of the LEDs 8017. The bluish light (the light including the blue light rays with a higher percentage in comparison to the middle section) from the ends 8034 and 8035 of the phosphor tube 8030 is supplied to the sections R1 and R2 of the light guide plate 8019. The complementary color members 8023 are disposed to cover at least areas of the back surface 8019*b* corresponding to the sections R1 and R2.

In the lighting unit 8012 having the configuration described above, when power is supplied to the LEDs 8017, the LEDs 8017 turn on and emit the primary light rays (the blue light rays). The primary light rays enter the phosphor tube 8030. The primary light rays entering the section of the phosphor tube 8030 including the wavelength converting portion 8031 (the middle section including a tubular body 8033 and the wavelength converting portion 8031) mainly include the primary light rays emitted by the LEDs 8017 in the middle of the LED array 80170. The primary light rays entering the ends 8034 and 8035 of the phosphor tube 8030 mainly include some of the primary light rays emitted by the LEDs 8017 at the ends of the LED array 80170.

The primary light rays absorbed by the quantum dot phosphors in the wavelength converting portion 8031 among the primary light rays that have entered the phosphor tube 8030 exit the phosphor tube 8030 as the secondary light rays obtained through the wavelength conversion. Other primary light rays that have entered the phosphor tube 8030 exit the phosphor tube 8030 as the primary light rays without the wavelength conversion.

The white transmitted light rays including the primary light rays and the secondary light rays are produced from the primary light rays emitted by the LEDs 8017 and passed through the section of the phosphor tube 8030 including the wavelength converting portion 8031 (the middle section including the tubular body 8033 and the wavelength converting portion 8031). The transmitted light rays enter the light guide plate 8019 through the light entering surface 8019*c*. The bluish light including a large amount of the primary light rays (the transmitted light) is produced from the primary light rays emitted by the LEDs 8017 and passed through the ends 8034 and 8035 of the phosphor tube 8030 without the wavelength conversion. The bluish light enters the ends 80192 and 80193 of the light guide plate 8019 through the sections of the light entering surface 8019*c* at the ends. The light rays that have entered the light guide plate 8019 transmit through the light guide plate 8019 while repeatedly reflected. The light rays that have reached the light reflecting and scattering pattern 8022 (the dots 8022*a*) on the back surface during the transmission through the light guide plate 8019 travel toward the light exiting surface 8019*a* and then toward the optical members 8015 via the light exiting surface 8019*a*.

Some of the light rays in the bluish light (the transmitted light) which has exited from the ends 8034 and 8035 of the phosphor tube 8030 and entered the light guide plate 8019 pass through the back surface 8019*b* (the opposite surface) and reach the complementary color members 8023. The primary light rays (the blue light rays) included in the bluish light are wavelength converted by the phosphors in the complementary color members 8023 and exit as the secondary light rays (the yellow light rays produced from the green light rays and the red light rays). Namely, in the ends 80192 and 80193 of the light guide plate 8019, the percentage of the primary light rays is reduced and the percentage of the secondary light rays is increased. Therefore, an overall color of the light is whitened.

The second light rays that reach the complementary color members 8023 and pass through the complementary color members 8023 are reflected by the reflection sheet 8020 and returned to the light guide plate 8019.

The light rays travel from the ends 8034 and 8035 into the light guide plate 8019 and the light rays returned to the light guide plate 8019 by the reflection sheet 8020 which have reached the white dots 8022*a* are reflected or scattered by the dots 8022*a* to travel toward the light exiting surface 8019*a*. Therefore, the light in color, blueness of which is reduced and whiteness is increased, exits from the areas of the light exiting surface 8019*a* of the light guide plate 8019 corresponding to the sections R1 and R2 to which the bluish light rays travel. Light exiting from a whole area of the light exiting surface 8019*a* is white planar light with reduced color unevenness.

The light rays exiting through the light exiting surface 8019*a* may reach the optical member 8015 (the optical sheet) or the reflection sheet 8020 disposed on the back surface 8019*b* of the light guide plate 8019. Namely, the light rays are retroreflected several times and then exit from the optical member 8015 as planar light that two-dimensionally spreads and travels toward the back surface of the liquid crystal panel 8011 at the end.

In FIG. 18, a rectangle (a chain line) along the edges of the light exiting surface 8019*a* illustrates an inner edges of the frame 8016 (the inner edges of the frame body 80161, the inner edges of a bezel 8013). The light rays exiting the light guide plate 8019 through the light exiting surface 8019*a* and reach the liquid crystal panel 8011 (i.e., the light rays emitted by the lighting unit 8012) are those that have passed through the section inside the inner edges of the frame 8016. If the complementary color members 8023 are removed from the lighting unit 8012, areas of the display surface of the liquid crystal panel 8011 corresponding to an intersection R11 of the rectangle 80130 and the section R1 and an intersection R22 of the rectangle 80130 and the section R2 may become bluish.

When the light guide plate 8019 is viewed in plan, the complementary color members 8023*a* overlap the sections R1 and R2 that are larger than the intersections R11 and R22.

In the lighting unit 8012 in this embodiment, the complementary color members 8023 are disposed between the back surface 8019*b* of the light guide plate 8019 and the reflection sheet 8020 to overlap the sections R1 and R2. According to the configuration, the percentage of the light rays that exhibit yellow (the complementary color) which is the complementary color of blue can be increased and the percentage of the light rays that exhibit blue (the blue light rays) can be decreased in the intersections R11 and R22 (R1 and R2) of the light exiting surface 8019*a*. Therefore, whitish light exits from not only the middle section of the lighting unit 8012 but also the ends of the lighting unit 8012. Namely, portions of the planar light emitted by the lighting unit 8012 at the ends (closer to the light source non-opposed adjacent ends 80192 and 80193 are less likely to be tinted with the color of the primary light rays from the LED 8017 (blue) more than a portion of the planar light in the middle section.

In the lighting unit 8012 in this embodiment, at least one of the ends 8034 and 8035 (the non-wavelength converting section) of the phosphor tube 8030 (the wavelength converting member) is disposed closer to the end surface 8019*e* or 8019*f* of the light guide plate 8019 adjacent to the light entering surface 8019*c*. Furthermore, the complementary color members 8023 are disposed between the back surface 8019*b* (the opposite surface) and the reflection sheet 8021 (the reflecting member) along the adjacent ends 80192 and 80193 of the light guide plate 8019 including the end surfaces 8019*e* and 8019*f*.

In the lighting unit 8012 in this embodiment, the ends 8034 and 8035 of the phosphor tube 8030 (the wavelength converting member) are disposed inner than the ends of the LED array 80170.

In the lighting unit 8012 in this embodiment, the phosphor tube 8030 (the wavelength converting member) has a dimension in the longitudinal direction smaller than the LED array 80170. The ends 8034 and 8035 (the non-wavelength converting sections) of the phosphor tube 8030 (the wavelength converting member) are disposed inner than the ends of the LED array 80170. According to the configuration, even if the phosphor tube 8030 (the wavelength converting member) in the lighting unit 8012 is slightly displaced in the longitudinal direction, the phosphor tube 8030 (the wavelength converting member) including the wavelength converting portion 8031 is less likely to project outer than the light entering surface 8019*c*. If the wavelength converting portion 8031 projects outer than the light entering surface 8019*c*, light tinted with a color (yellow) which is a complementary color of the reference color (the blue light rays) exhibited by the primary light rays exit from a section of the wavelength converting portion 8031 outer than the light entering surface 8019*c*.

<Fifth Embodiment>

A fifth embodiment will be described with reference to FIG. 23. In this section, a liquid crystal display device 8010A including a lighting unit 8012A will be described. The lighting unit 8012A includes complementary color members 8023A instead of the color complementary color members 8023 in the fourth embodiment. The basic configuration of the lighting unit 8012A (the liquid crystal display device 8010A) in this embodiment is similar to the fourth embodiment. Therefore, components and portions having the same configurations as those of the fourth embodiment will be indicated with the same symbols and will not be described. In embodiment sections following this section, components and portions having the same configurations as those of the fourth embodiment will be indicated with the same symbols and will not be described.

Figure 23:
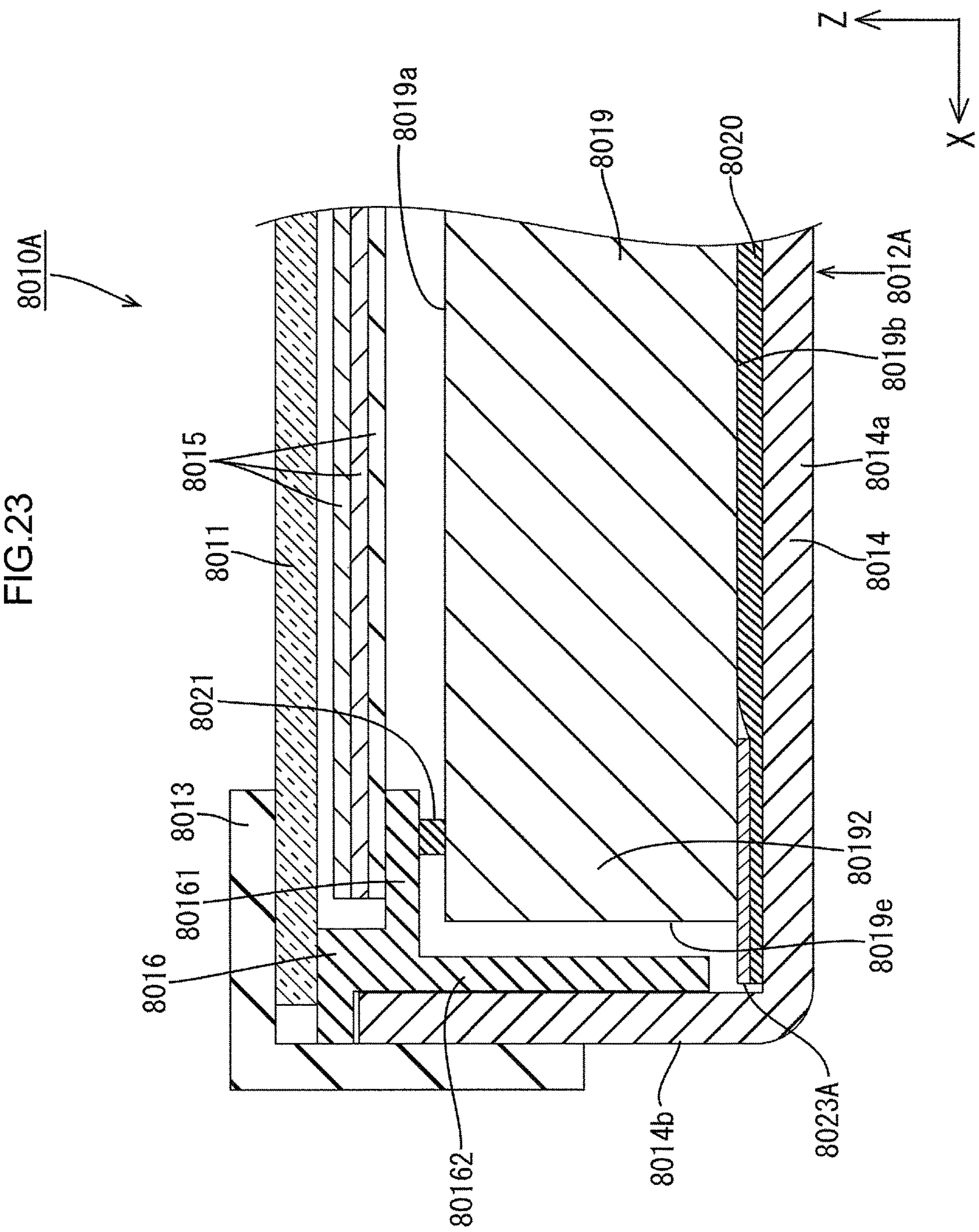
FIG. 23 is a magnified cross-sectional view of a portion of a liquid crystal display device according to a fifth embodiment including a source non-opposed adjacent end section and therearound.

FIG. 23 is a magnified cross-sectional view of a portion of the liquid crystal display device 8010A including the source non-opposed adjacent end 80192 and therearound according to the fifth embodiment. In FIG. 23, a portion corresponding to FIG. 22 according to the fourth embodiment is illustrated. The complementary color members 8023A in this embodiment are sheet shaped members that exhibit a complementary color (yellow in this embodiment) of blue (the reference color) exhibited by the light rays (the primary light rays, the blue light rays) emitted by the LEDs 8017, similar to the fourth embodiment. The complementary color members 8023A have a function of selectively absorbing the light rays (the primary light rays, the blue light rays) from the LEDs 8017, which is different from the fourth embodiment. The complementary color members 8023A have a function of passing the secondary light rays (the green light rays, the red light rays), that is, light transmissivity. Yellow cellophane films may be used for the complementary color members 8023A.

Similar to the fourth embodiment, in this embodiment, the complementary color members 8023A are disposed between the ends 80192 and 80193 (the light source non-opposed ends) of the light guide plate 8019 and the reflection sheet 8020 to cover at least areas of the back surface 8019*b* corresponding to the sections R1 and R2 that linearly extend from the ends 8034 and 8035 of the phosphor tube 8030 to which the bluish light enters along the light emitting direction of the LEDs 8017. Some of the primary light rays (the blue light rays) which have entered the light guide plate 8019, passed through the back surface 8019*b* (the opposite surface), and reached the complementary color members 8023A are absorbed by the complementary color members 8023A. The secondary light rays (the green light rays, the red light rays) which have reached the complementary color members 8023A pass through the complementary color members 8023A. Such secondary light rays are reflected by the reflection sheet 8020 and returned to the light guide plate 8019.

In the lighting unit 8012A in this embodiment, the complementary color members 8023A that selectively absorb the primary light rays (the blue light rays) and selectively pass the secondary light rays (the yellow light rays formed from the green light rays and the red light rays) are disposed on the reflection sheet 8020 behind the back surface 8019*b* (the opposite surface) of the ends 80192 and 80193 (the light source non-opposed ends) in the intersections R11 and R22 (R1 and R2) of the light exiting surface 8019*a*. According to the configuration, the percentage of the light rays (the complementary color rays) which exhibit yellow that is the complementary color of blue can be increased and the percentage of the light rays that exhibit blue (the blue light rays) can be reduced in the intersections R11 and R22 (R1 and R2) of the light exiting surface 8019*a*. Therefore, the lighting unit 8012A emits whitish light not only from the middle section but also from the ends. Namely, the portions of the planar light emitted by the lighting unit 8012A at the ends (the light source non-opposed adjacent ends 80192 and 80193) are less likely to be tinted with the color of the primary light rays (blue) from the LEDs 8017 more than the middle portion. Such complementary color members 8023A having the function of selectively absorbing the light rays form the LEDs 8017 (the primary light rays, the blue light rays) and the function of passing the secondary light rays (The green light rays, the red light rays) may be used.

<Sixth Embodiment>

Figure 24:
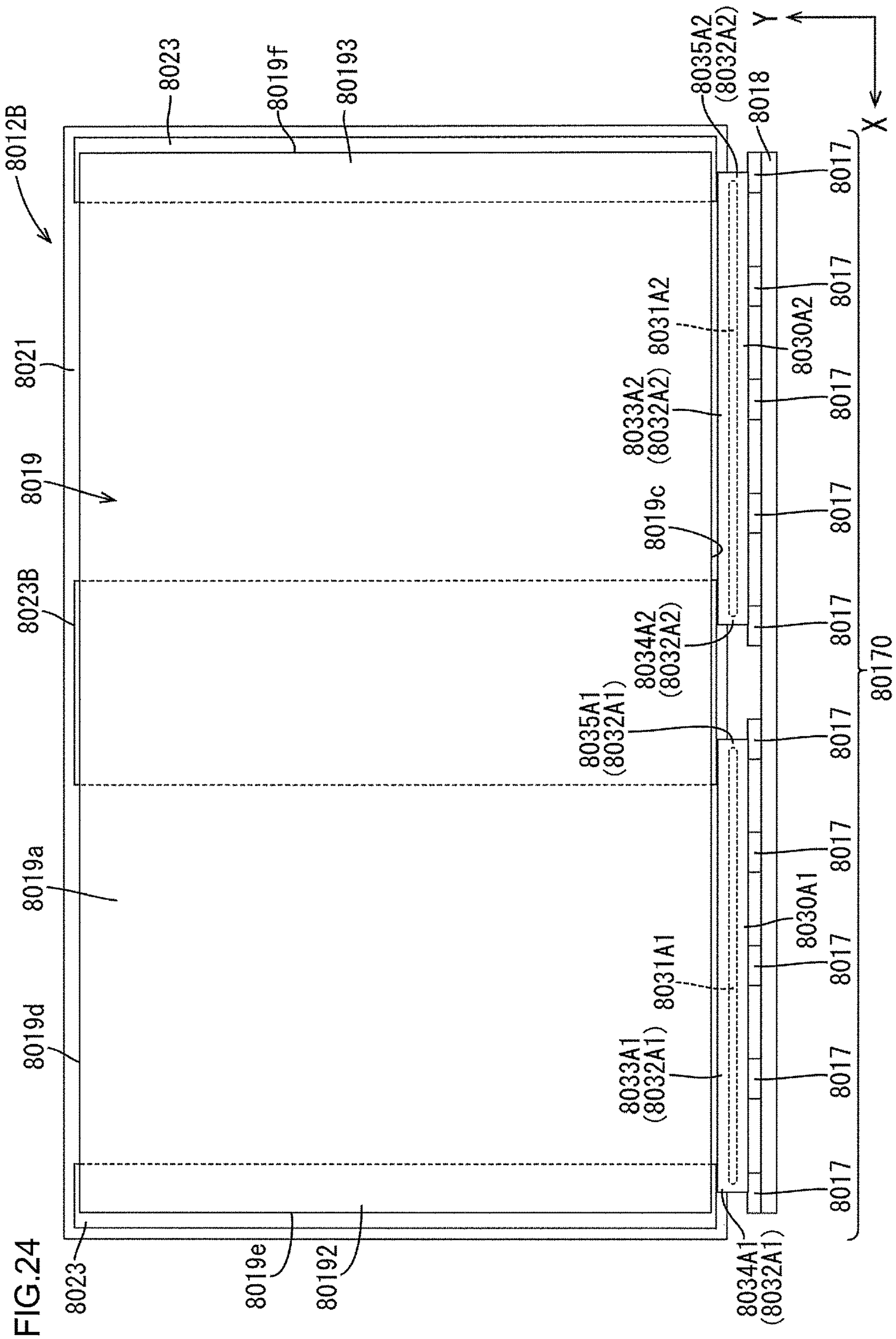
FIG. 24 is a plan view schematically illustrating positional relationships among an LED array, a phosphor tube, and a light guide plate in a lighting device according to a sixth embodiment.

A sixth embodiment will be described with reference to FIG. 24. In this section, a lighting unit 8012B including two phosphor tubes 8030A1 and 8030A2 will be described. FIG. 24 is a plan view schematically illustrating positional relationships amount the LED array 80170, the phosphor tubes 8030A1 and 8030A2, and the light guide plate 8019 included in the lighting unit 8012B according to the sixth embodiment. In this embodiment, two (multiple) phosphor tubes 8030A1 and 8030A2 are used, which is different from the fourth embodiment. The phosphor tubes 8030A1 and 8030A2 are arranged in line. In this embodiment, multiple (two) phosphor tubes 8030A1 and 8030A2 arranged in line in the longitudinal direction are disposed in a space between the LED array 80170 and the light entering surface 8019*c*. The phosphor tubes 8030A1 and 8030A2 have a dimension in the longitudinal direction smaller than that of the phosphor tube 8030 in the fourth embodiment. However, the basic configuration of the phosphor tubes 8030A1 and 8030A2 is similar to that of the phosphor tube 8030 in the fourth embodiment. The phosphor tube 8030A1 includes a wavelength converting portion 8031A1 and a holding portion 8032A1. The phosphor tube 8030A2 includes a wavelength converting portion 8031A2 and a holding portion 8032A2. The holding portion 8032A1 includes a tubular body 8033A1 and sealing ends (non-wavelength converting sections 8034A1 and 8035A1). The holding portion 8032A2 includes a tubular body 8033A2 and sealing ends (non-wavelength converting sections 8034A2 and 8035A2).

Two phosphor tubes 8030A1 and 8030A2 are disposed between the light entering surface 8019*c* of the light guide plate and the LED array 80170. In FIG. 24, one phosphor tube 8030A1 is disposed closer to a left end surface 8019*e* (the short end surface) of the light guide plate 8019. The other phosphor tube 8030A2 is disposed closer to the right end surface 8019*f* (the short end surface) of the light guide plate 8019. The left end 8034A1 of the phosphor tube 8030A1 is disposed inner than the left end surface 8019*e* so as not to project from the light entering surface 8019*c* and opposed to the light entering surface 8019*c*. The right end 8035A1 of the phosphor tube 8030A1 is disposed in the middle of the light entering surface 8019*c* and opposed to the light entering surface 8019*c*. The right end 8035A2 of the phosphor tube 8030A2 is disposed inner than the right end surface 8019*f* so as not to project from the light entering surface 8019*c* and opposed to the light entering surface 8019*c*. The left end 8035A2 of the phosphor tube 8030A2 is disposed in the middle of the light entering surface 8019*c* and opposed to the light entering surface 8019*c*.

The phosphor tubes 8030A1 and 8030A2 have a dimension in the longitudinal direction smaller than the LED array 80170. The ends 8034A1 and 8035A1 of the phosphor tube 8030A1 and the ends 8034A2 and 8035A2 of the phosphor tube 8030A2 are disposed inner than ends of an LED array 80170A. The LED array 80170 includes the LEDs 8017 arranged in line and mounted on the LED board 8018, similar to the fourth embodiment. The LEDs 8017 emit the blue light rays. The LED 8017 at the left end of the LED array 80170 is disposed to the left end 8034A1 of the phosphor tube 8030A1. A left section of the LED 8017 is not opposed to the 8035A1 and directly opposed to the light entering surface 8019*c*. Some of the light rays emitted by the LED 8017 (the blue light rays, the primary light rays) directly enter the light entering surface 8019*c*.

The LED 8017 at the right end of the LED array 80170 is disposed to the right end 8035A2 of the phosphor tube 8030A2. A right section of the LED 8017 is not opposed to the right end 8035A2 and directly opposed to the light entering surface 8019*c*. Some of the light rays emitted by the LED 8017 directly enter the light entering surface 8019*c*. One of two LEDs 8017 in the middle of the LED array 80170 on the left is opposed to the right end 8035A1 of the phosphor tube 8030A1. A right section of the LED 8017 is not opposed to the end 8035A1 and directly opposed to the light entering surface 8019*c*. Some of the light rays emitted by the LED 8017 (the blue light rays, the primary light rays) directly enter the light entering surface 8019*c*.

The other one of two LEDs 8017 in the middle of the LED array 80170 on the right is opposed to the left end 8034A2 of the phosphor tube 8030A2. A left section of the LED 8017 is not opposed to the end 8034A2 and directly opposed to the light entering surface 8019*c*. Some of the light rays emitted by the LED 8017 (the blue light rays, the primary light rays) directly enter the light entering surface 8019*c*. Other LEDs 8017A are opposed to the wavelength converting portion 8031A1 of the phosphor tube 8030A1 and the wavelength converting portion 8031A2 of the phosphor tube 8030A2. The LEDs 8017A are disposed to overlap the light entering surface 8019*c* in the light emitting direction of the LEDs 8017.

In such a lighting unit 8012B, the complementary color members 8023 are disposed behind the short ends 80192 of the light guide plate 8019, similar to the fourth embodiment. In the lighting unit 8012B in this embodiment, a complementary color member 8023B is disposed between the back surface of the light guide plate 8019 and the reflection sheet 8020 so as to cross the back surface of the light guide plate 8019 in the short direction along the light emitting direction of the LEDs 8017 from a section at which two phosphor tubes 8030A1 and 8030A2 are adjacent to each other. The complementary color member 8023B and the complementary color members 8023 in the fourth embodiment are made of the same material. The complementary color member 8023B has a rectangular overall shape that is larger in comparison to the complementary color members 8023 disposed closer to the ends 80192 and 80193 of the light guide plate 8019.

In the lighting unit 8012B, when power is supplied to the LEDs 8017 in the LED array 80170, the LEDs 8017 turn on and emit the light rays (the blue light rays, the primary light rays). The light rays enter the light guide plate 8019 through the light entering surface 8019*c*. The white light exits from the section of the phosphor tube 8030A1 including the wavelength converting portion 8031A1 and the section of the phosphor tube 8030A2 including the wavelength converting portion 8031A2 that receive the blue light rays from the LEDs 8017. The white light exits from the ends 8034A1, 8035A1, 8034A2, and 8035A2 of the phosphor tubes 8030 that receive white light rays from the LEDs 8017. Because the white light is supplied to the entire light guide plate 8019 and thus white planar light exits from the light exiting surface 8019*a*. If the complementary color members 8023 and the complementary color member 8023B are removed from the lighting unit 8012B, the blue light rays may pass through the ends 8034A1, 8035A1, 8034A2, and 8035A2 and reach sections of the light guide plate 8019 linearly extending from the ends 8034A1, 8035A1, 8034A2, and 8035A2 of the phosphor tubes 8030A1 and 8030A2 along the light emitting direction of the LEDs 8017.

If the complementary color members 8023 and the complementary color member 8023B are removed from the lighting unit 8012B, the blue light rays reach not only the section of the light guide plate 8019 along the left edge and the light edge but also the section in the middle across the light guide plate 8019 in the short direction. Therefore, the planar light exiting through the light exiting surface 8019*a* is partially tinted with the color (blue) of the first primary light rays (partially bluish planar light). In the lighting unit 8012B in this embodiment, the complementary color members 8023 are disposed behind the ends 80192 and 80193 of the light guide plate 8019 and the complementary color member 8023B is disposed behind the middle of the light guide plate 8019. Therefore, the emitting light (the planar light) is less likely to be tinted with the color of the primary light rays (blue).

<Seventh Embodiment>

A seventh embodiment will be described with reference to FIGS. 25 and 26. A lighting unit 8012C used in a liquid crystal display device 8010C according to this embodiment includes a phosphor tube 8030C held by a holder 8060 having an elongated shape. The configuration of the phosphor tube 8030C is similar to that of the fourth embodiment. The phosphor tube 8030C includes a wavelength converting portion 8031C and a holding portion 8032C.

Figure 25:
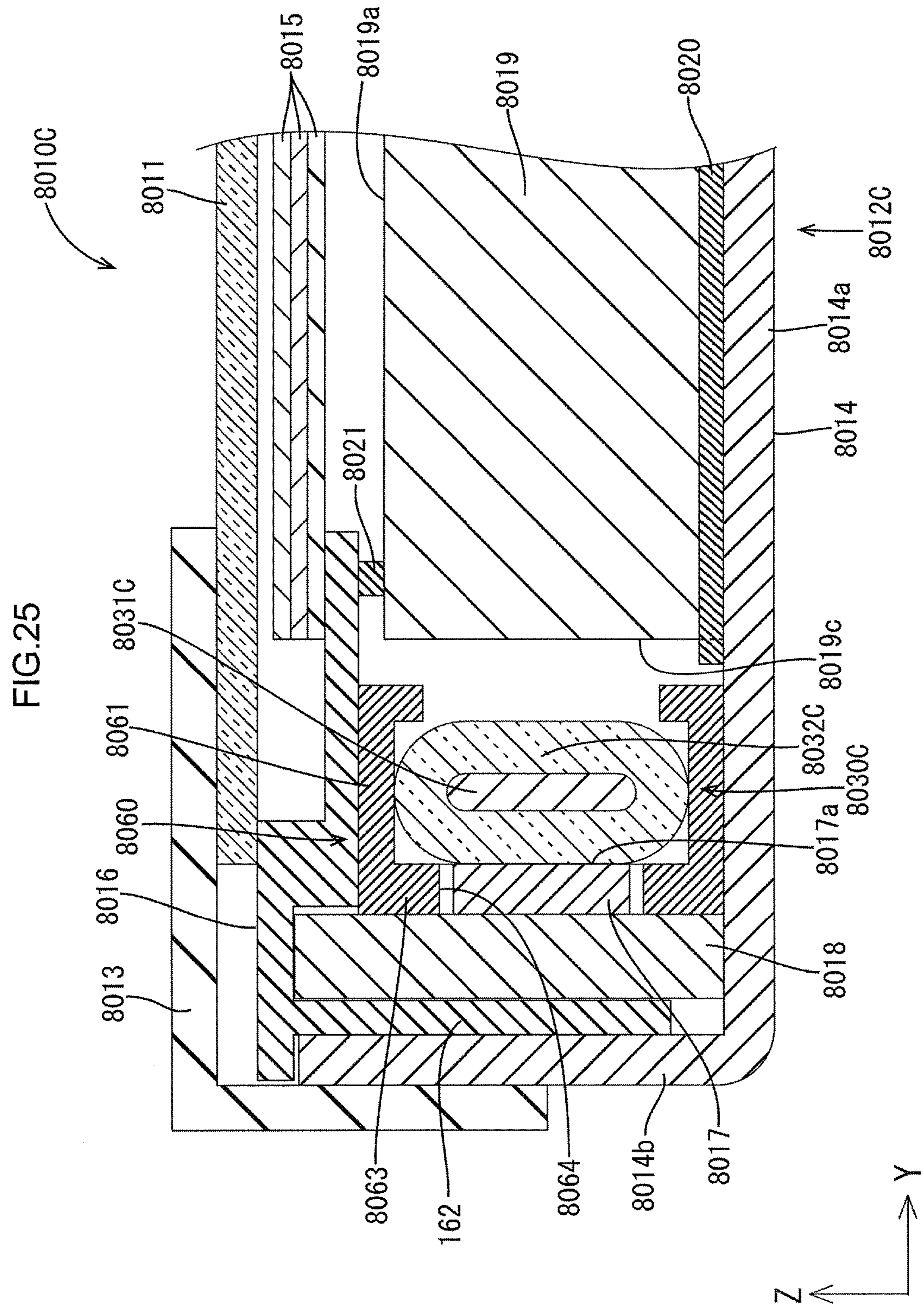
FIG. 25 is a magnified cross-sectional view of a liquid crystal display device according to a seventh embodiment including a light entering surface and therearound.
Figure 26:
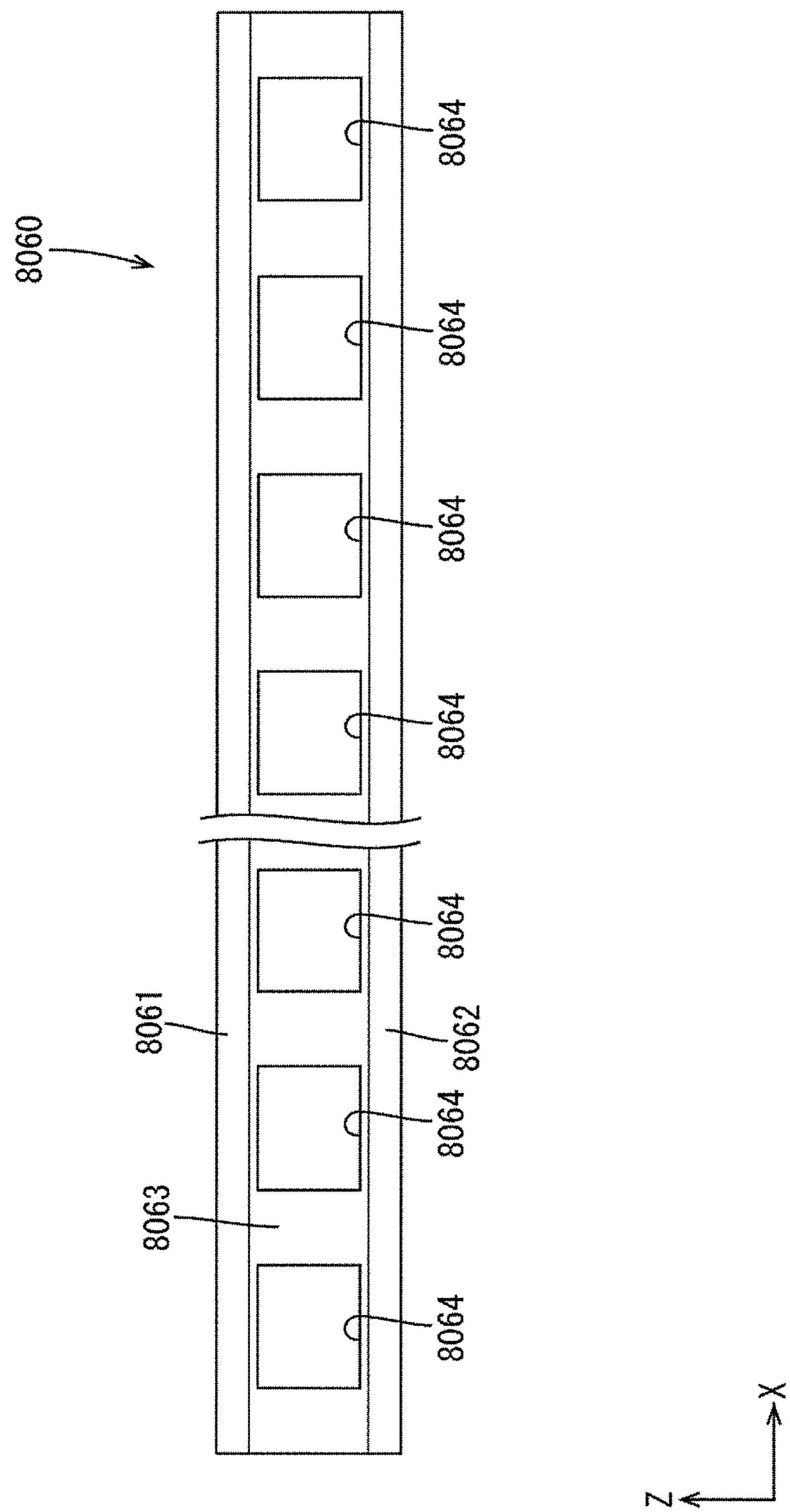
FIG. 26 is a plan view of a holder.

As illustrated in FIG. 25, the phosphor tube 8030C (a wavelength converting member) in this embodiment is held by the holder 8060 and disposed between the LEDs 8017 and the light entering surface 8019*c* of the light guide plate 8019. The holder 8060 is a molded member made of synthetic resin in white having high light reflectivity and an elongated overall shape. The holder 8060 has a C-shaped cross section to sandwich a section of the phosphor tube 8030 in the in the top-bottom direction (the front-rear direction) for an enter length thereof. The section of the phosphor tube 8030C holds the wavelength converting portion therein. The holder 8060 includes a front holding wall 8061, a rear holding wall 8062, and a connecting wall 8063. The front holding wall 8061 and the rear holding wall 8062 hold the phosphor tube 8030C in the top-bottom direction. The connecting wall 8063 connects the front holding wall 8061 to the rear holding wall 8062 in the top-bottom direction (the front-rear direction). The connecting wall 8063 is disposed closer to the LEDs 8017 (the LED board 8018) than the phosphor tube 8030C. The holder 8060 that holds a phosphor tube 8030B in the top-bottom direction opens toward the light entering surface 8019*c* of the light guide plate 8019.

In this embodiment, the holder 8060 is sandwiched between the frame 8016 and the bottom plate 8014*a* of the chassis 8014 with the front holding wall 8061 in contact with the frame body 80161 and the rear holding wall 8062 placed on the bottom plate 8014*a*. The connecting wall 8063 stands in the top-bottom direction inside the chassis 8014 and extends in a direction in which the LEDs 8017 are arranged in line. The connecting wall 8063 includes holes 8064 to expose the LEDs 8017 on the light entering surface 8019*c* side. Inside the chassis 8014, the connecting wall 8063 is held against the mounting surface 8018*a* of the LED board 8018 with the LEDs 8017 exposed through the holes 8064. The phosphor tube 8030C is held by the holder 8060 and fixed to the bottom plate 8014*a* of the chassis 8014 with a fixing member that is not illustrated. In this embodiment, as illustrated in FIG. 25, the light emitting surfaces 8017*a* of the LEDs 8017 are in close contact with a wall surface of the holding portion 8032 of the phosphor tube 8030C. As in this embodiment, the phosphor tube 8030C can be set at a predefined position in the chassis 8014 using the holder 8060. With the holder 8060, the phosphor tube 8030C can be easily set at a predefined position as appropriate.

<Eighth Embodiment>

Figure 27:
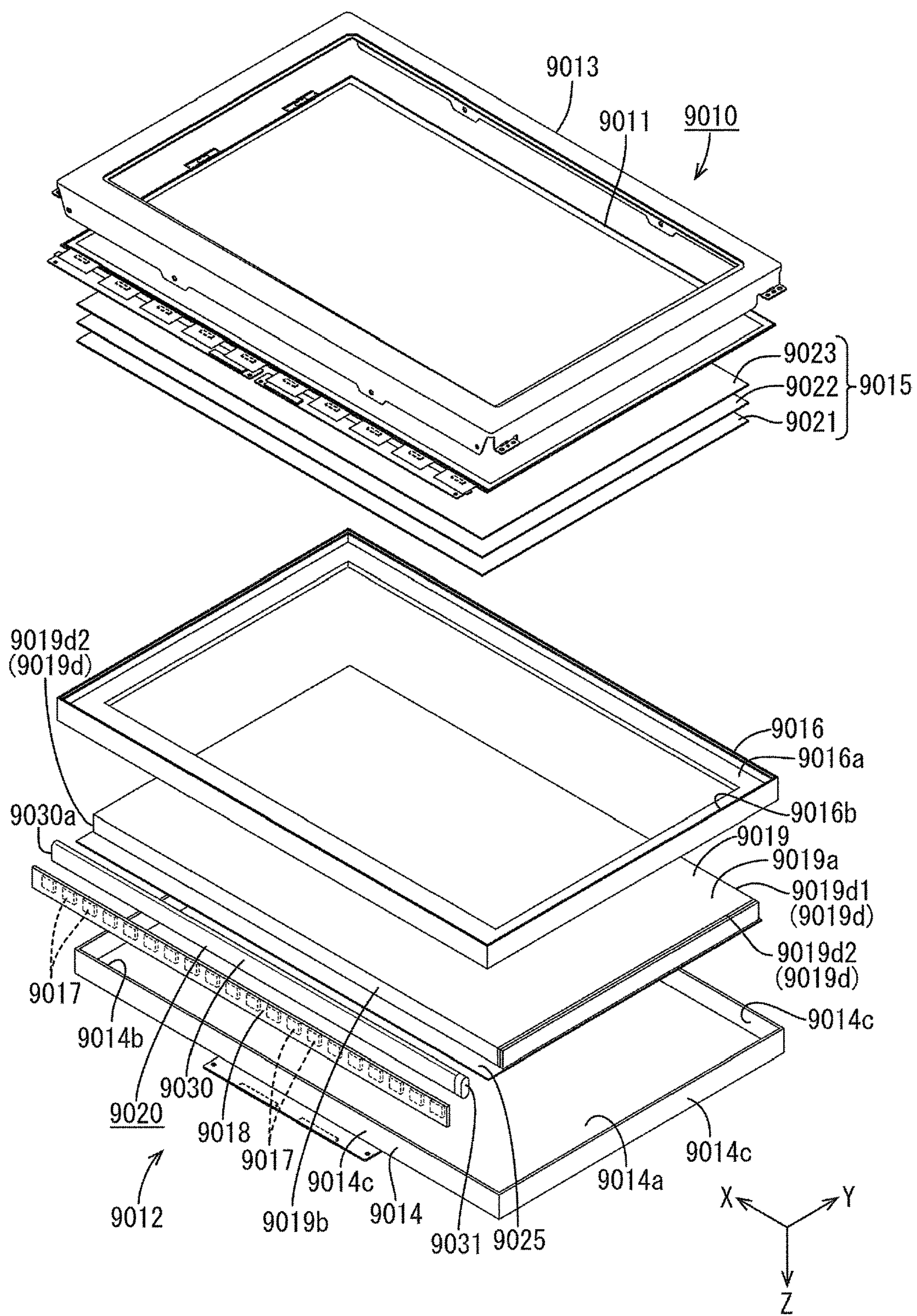
FIG. 27 is an exploded perspective view illustrating a schematic configuration of a liquid crystal display device included in a television device according to an eighth embodiment.

An eighth embodiment of the present invention will be described with reference to FIGS. 27 to 36. A television device according to this embodiment includes a liquid crystal display device 9010 as a main component, similar to the first embodiment. As illustrated in FIG. 27, the liquid crystal display device 9010 includes a liquid crystal panel 9011 and a backlight unit 9012 (a lighting unit). The liquid crystal panel 9011 is a display panel configured to display images. The backlight unit 9012 is an external light source configured to supply light to the liquid crystal panel 9011 for display. The liquid crystal panel 9011 and the backlight unit 9012 are integrally held with a bezel 9013. The liquid crystal panel 9011 included in the liquid crystal display device 9010 has a configuration similar to the first embodiment.

As illustrated in FIG. 27, the backlight unit 9012 includes a chassis 9014 and optical members (optical sheets) 9015. The chassis 9014 has a box shape with a light exiting portion 9014*b* that opens toward the outside on the front side (the liquid crystal panel 9011 side, the light exiting side). The optical members 9015 are disposed to cover the light exiting portion 9014*b* of the chassis 9014. Inside the chassis 9014, LEDs 9017, an LED board 9018, a light guide plate 9019, a main wavelength converting member (a main wavelength converting tube) 9020, and a frame 9016 are disposed. The LEDs 9017 are light sources. The LEDs 9017 are mounted on the LED board 9018. The light guide plate 9019 is configured to direct light rays from the LEDs 9017 to the optical members 9015 (the liquid crystal panel 9011). A main wavelength converting member 9020 is configured to convert a wavelength of the light rays from the LEDs 9017 and disposed between the LEDs 9017 and the light guide plate 9019. The frame 9016 presses the light guide plate 9019 from the front side and receives the optical members 9015 from the rear side. In the backlight unit 9012, the LED board 9018 is disposed on one of long edge sides of the backlight unit 9012 (the lower side in FIGS. 27 and 28, the left side in FIG. 29). Namely, the LEDs 9017 mounted on the LED board 9018 are disposed closer to one of the long edge sides of the liquid crystal panel 9011. The configurations of the chassis 9014, the optical members 9015, the frame 9016, the LEDs 9017, and the LED board 9018 on which the LEDs 9017 are mounted included in the backlight unit 9012 are similar to the configurations of those in the first embodiment unless otherwise described.

Figure 28:
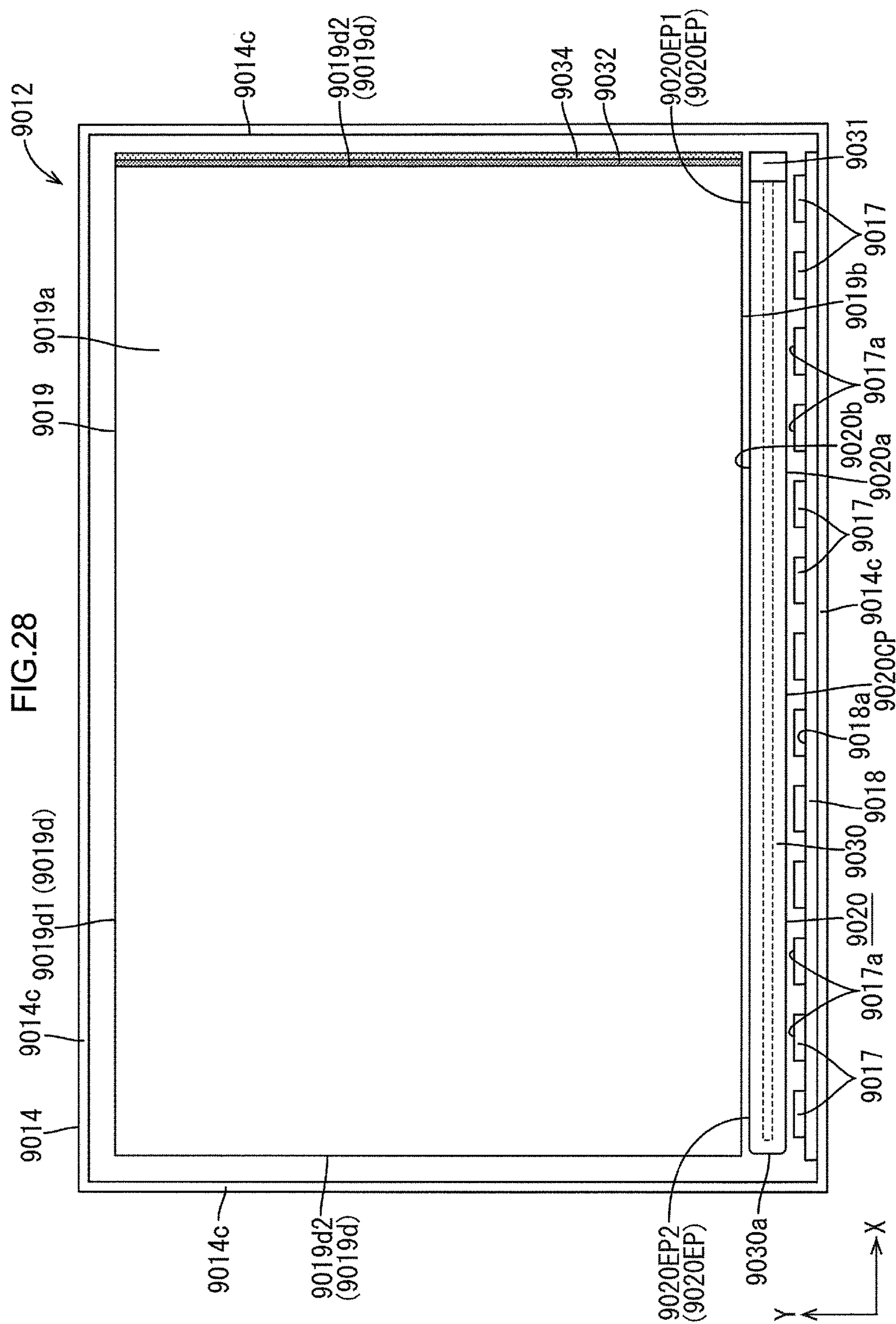
FIG. 28 is a plan view illustrating a chassis, an LED board, and a light guide plate of a backlight unit included in the liquid crystal display device.
Figure 29:
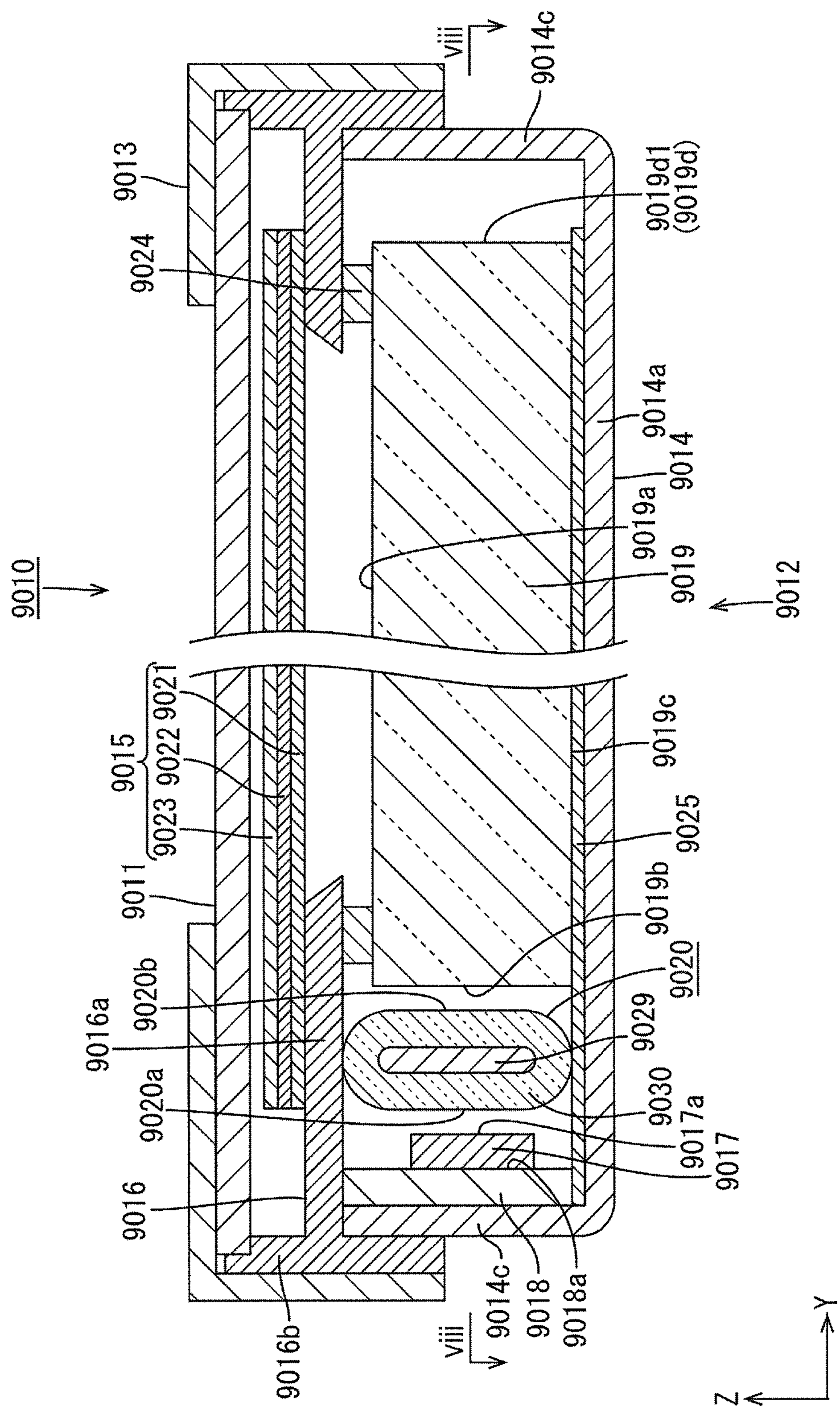
FIG. 29 is a cross-sectional view illustrating a cross-sectional configuration cut along a short direction of the liquid crystal display device.
Figure 30:
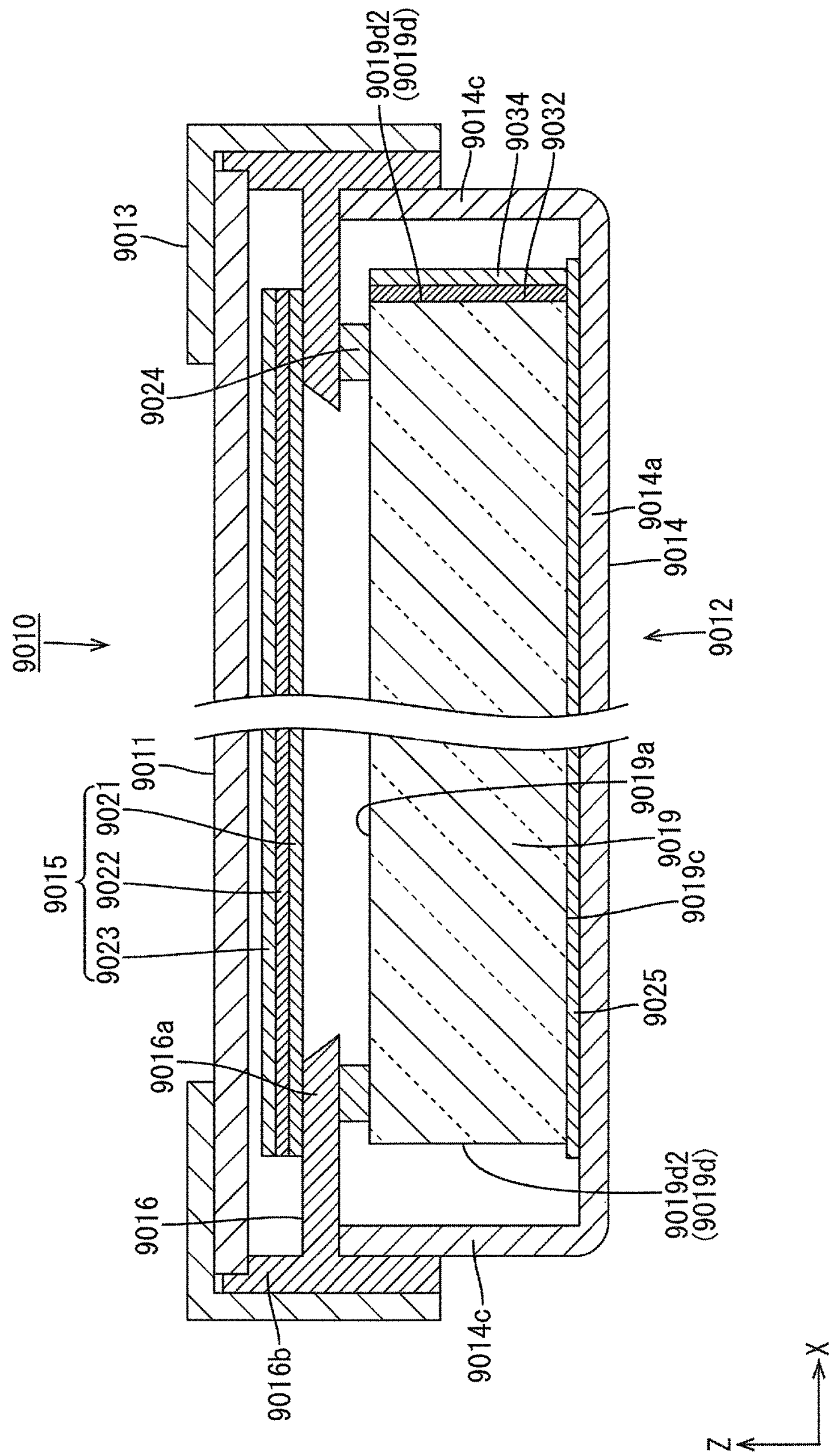
FIG. 30 is a cross-sectional view illustrating a cross-sectional configuration cut along a long direction of the liquid crystal display device.
Figure 31:
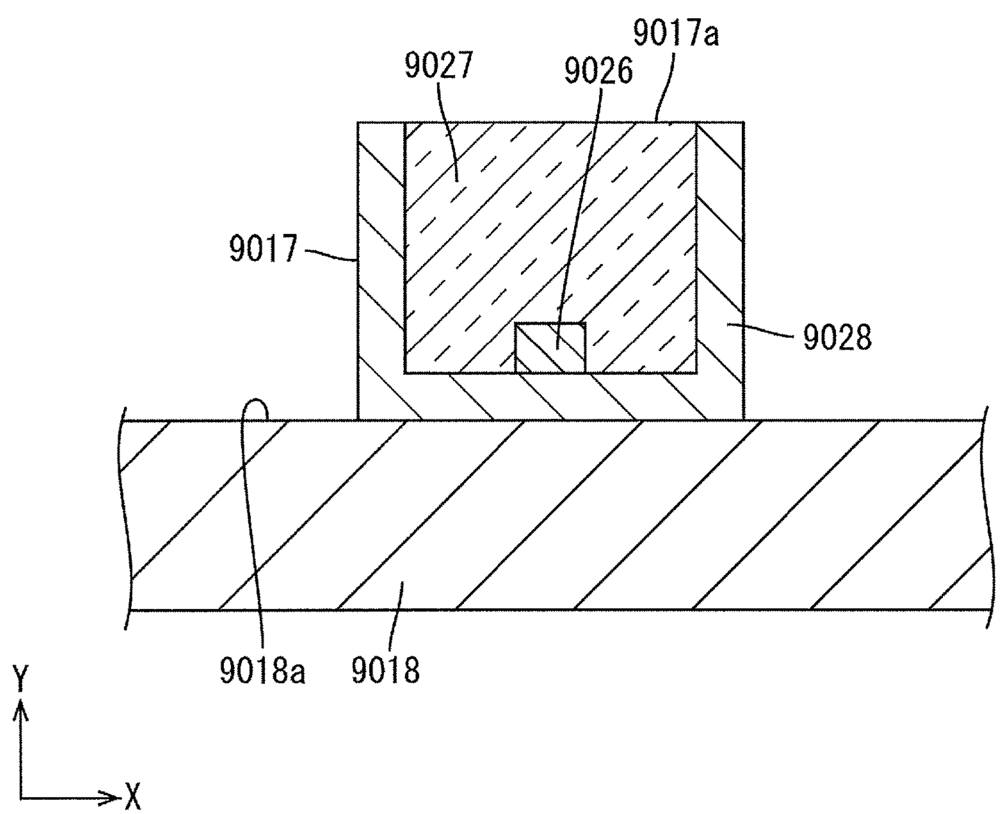
FIG. 31 is a cross-sectional view illustrating an LED and an LED board.

The light guide plate 9019 is made of substantially transparent synthetic resin having high light transmissivity (e.g., acrylic resin such as PMMA, polycarbonate resin). The light guide plate 9019 has a refractive index of about 1.49, which is sufficiently higher than that of the air. As illustrated in FIGS. 27 and 28, the light guide plate 9019 has a horizontally-long rectangular shape in the plan view similar to the liquid crystal panel 9011 and the chassis 9014. The light guide plate 9019 has a thickness larger than the thickness of the optical members 9015. The long direction, the short direction, and the thickness direction perpendicular to the plate surface of the light guide plate 9019 correspond with the X-axis direction, the Y-axis direction, and the Z-axis direction. As illustrated in FIGS. 29 and 30, the light guide plate 9019 is disposed immediately below the liquid crystal panel 9011 and the optical members 9015 in the chassis 9014. One of long end surfaces of peripheral end surfaces of the light guide plate 9019 is opposed to the LEDs 9017 on the LED board 9018 disposed on one of long edges of the chassis 9014. An arrangement direction of the LEDs 9017 (the LED board 9018) and the light guide plate 9019 corresponds with the Y-axis direction. An arrangement direction of the optical members 9015 (the liquid crystal panel 9011) and the light guide plate 9019 corresponds with the Z-axis direction. Therefore, the arrangement directions are perpendicular to each other. The light guide plate 9019 is configured to receive the light rays emitted by the LEDs 9017 in the Y-axis direction, pass the light rays therethrough, and direct the light rays toward the optical members 9015 (the front side). The thickness of the light guide plate 9019 (a dimension in the Z-axis direction) is larger than the height (a dimension in the Z-axis direction) of the LEDs 9017.

As illustrated in FIGS. 29 and 30, a front plate surface of plate surfaces of the light guide plate 9019 is a light exiting plate surface 9019*a* (a light exiting surface) through which light rays exit the light guide plate 9019 toward the optical members 9015 and the liquid crystal panel 9011. Peripheral end surfaces adjacent to the plate surfaces of the light guide plate 9019 include a pair of long end surfaces and a pair of short end surfaces. The long end surfaces have an elongated shape along the X-axis direction, which is one of directions of periphery of the light guide plate 9019 (an arrangement direction of the LEDs 9017, the long direction of the LED board 9018, the long direction of the light guide plate 9019). The short end surfaces have an elongated shape along the Y-axis direction, which is one of directions of periphery of the light guide plate 9019 (an arrangement direction of the LEDs 9017 and the light guide plate 9019, the thickness direction of the light guide plate 9019, the short direction of the light guide plate 9019. One of the long end surfaces of the periphery of the light guide plate 9019 (on the lower side in FIGS. 27 and 28) is opposed to the LEDs 9017 (the LED board 9018) with a predefined space therebetween (an arrangement space for the main wavelength converting member 9020, which will be described later). The long end surface is a light entering end surface 9019*b* (a light entering surface) through which the light rays emitted by the LEDs 9017 enter via the main wavelength converting member 9020, which will be described later. Because the light entering end surface 9019*b* is opposed to the LEDs 9017, it may be referred to as an "LED opposed end surface (light source opposed end surface)." The length direction (the long direction) of the light entering end surface 9019*b* corresponds with the X-axis direction. The width direction (the short direction) of the light entering end surface 9019*b* corresponds with the Z-axis direction. The normal direction of the light entering end surface 9019*b* corresponds with corresponds with the Y-axis direction. The light entering end surface 9019*b* is substantially perpendicular to the light exiting plate surface 9019*a*. The peripheral end surfaces of the light guide plate 9019 except for the light entering end surface 9019*b* (the other long end surface and the short end surfaces) are non-light entering end surfaces 9019*d* through which the light rays emitted by the LEDs 9017 do not directly enter. Because the non-light entering end surfaces 9019*d* are not opposed to the LEDs 9017, they may be referred to as "LED non-opposed end surfaces (light source non-opposed end surfaces)." The non-light entering end surfaces 9019*d* include a non-light entering opposite end surface 9019*d*1 and a pair of non-light entering adjacent end surfaces 9019*d*2. The non-light entering opposite end surface 9019*d*1 is the other long end surface of the peripheral end surfaces of the light guide plate 9019, that is, the end surface on the opposite side from the light entering end surface 9019*b*. The non-light entering adjacent end surfaces 9019*d*2 are the short end surfaces adjacent to the light entering end surface 9019*b* and the non-light entering opposite end surface 9019*d*1. In this section, the LED non-opposed end surfaces may be referred to as "non-light entering end surfaces 9019*d*." However, it does not mean that no light rays enter through those surfaces. For example, the light rays leaking to the outside through the non-light entering end surfaces 9019*d* and reflected by the side portions 9014*c* of the chassis 9014 may be returned to the light guide plate 9019 and enter through the non-light entering end surface 9019*d*.

As illustrated in FIGS. 29 and 30, a reflection sheet 9025 (a reflecting member) is disposed on the back side of the light guide plate 9019, that is, over an opposite plate surface

9019*c* of the light guide plate 9019 on the opposite side from the light exiting plate surface 9019*a*. The reflection sheet 9025 is made of synthetic resin with a white surface having high light reflectivity (e.g., foamed PET). The reflection sheet 9025 is configured to reflect the light rays that travel through the light guide plate 9019 and reach the opposite plate surface 9019*c* toward the front side, that is, toward the light exiting plate surface 9019*a*. The reflection sheet 9025 is disposed to cover substantially an entire opposite plate surface 9019*c* of the light guide plate 9019. The reflection sheet 9025 extends to overlap the LED board 9018 (the LEDs 9017) in the plan view. The LED board 9018 (the LEDs 9017) is sandwiched between the extended section of the reflection sheet 9025 and a frame portion 9016*a* of the frame 9016 on the front side. The light rays from the LEDs 9017 may be reflected by the extended section of the reflection sheet 9025 and thus the light rays are efficiently directed to the light entering end surface 9019*b*. A light reflecting pattern including light reflecting portions (not illustrated) is formed on the opposite plate surface 9019*c* of the light guide plate 9019 for reflecting the light rays in the light guide plate 9019 toward the light exiting plate surface 9019*a* so that a larger amount of the light rays exit through the light exiting plate surface 9019*a*. The light reflecting portions of the light reflecting pattern are light reflecting dots with distribution density that varies according to a distance from the light entering end surface 9019*b* (the LEDs 9017). Specifically, the distribution density of the light reflecting dots of the light reflecting portions increases as the distance from the light entering end surface 9019*b* in the Y-axis direction increases (as a distance to the non-light entering opposite end surface 9019*d*1 decreases). The distribution density the light reflecting dots of the light reflecting portions decreases as the distance from the light entering end surface 9019*b* in the Y-axis direction decreases (as the distance to the non-light entering opposite end surface 9019*d*1 increases). According to the configuration, in-plan distribution of the light rays exiting through the light exiting plate surface 9019*a* remains uniform.

Figure 32:
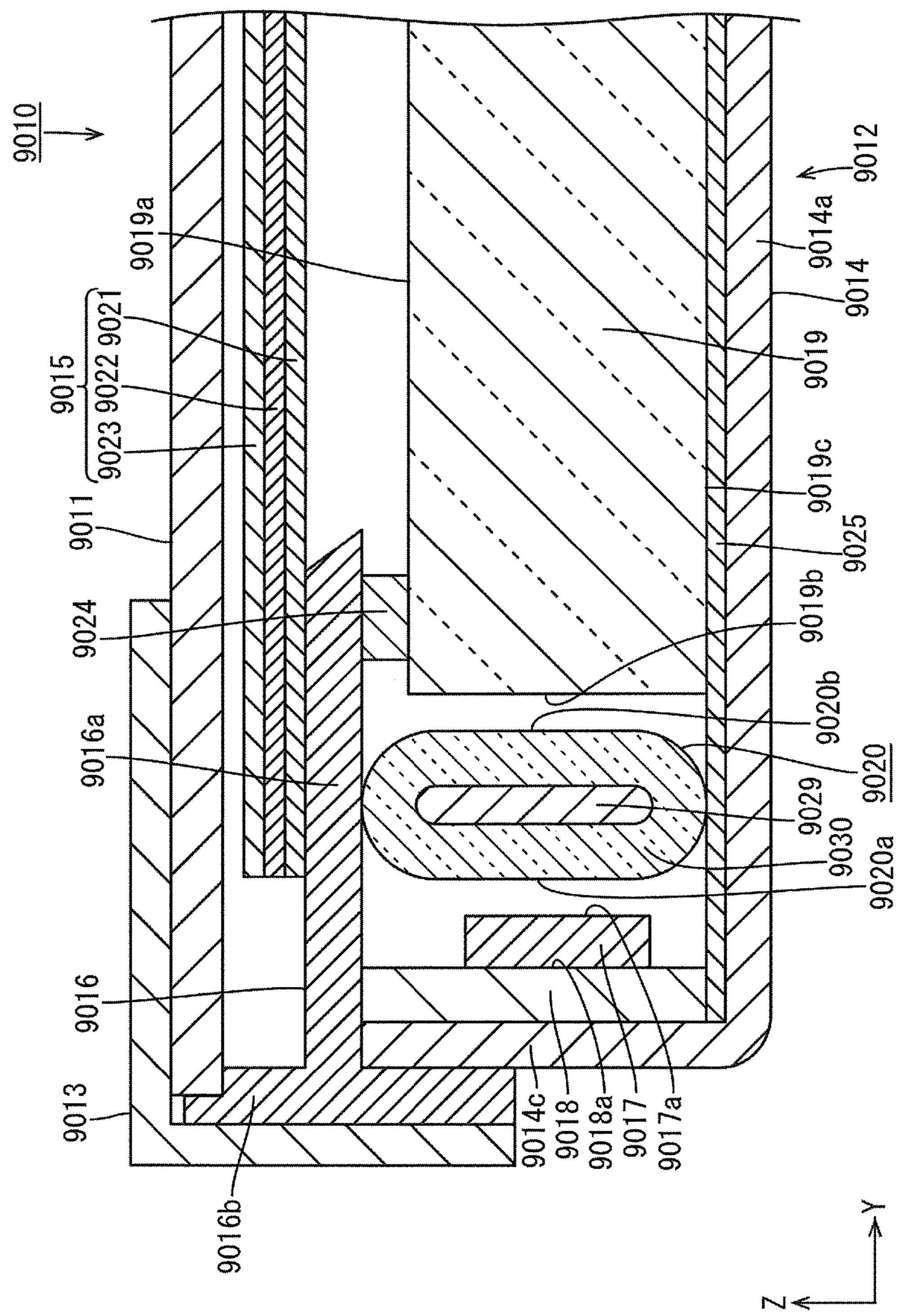
FIG. 32 is a magnified view of FIG. 29.
Figure 33:
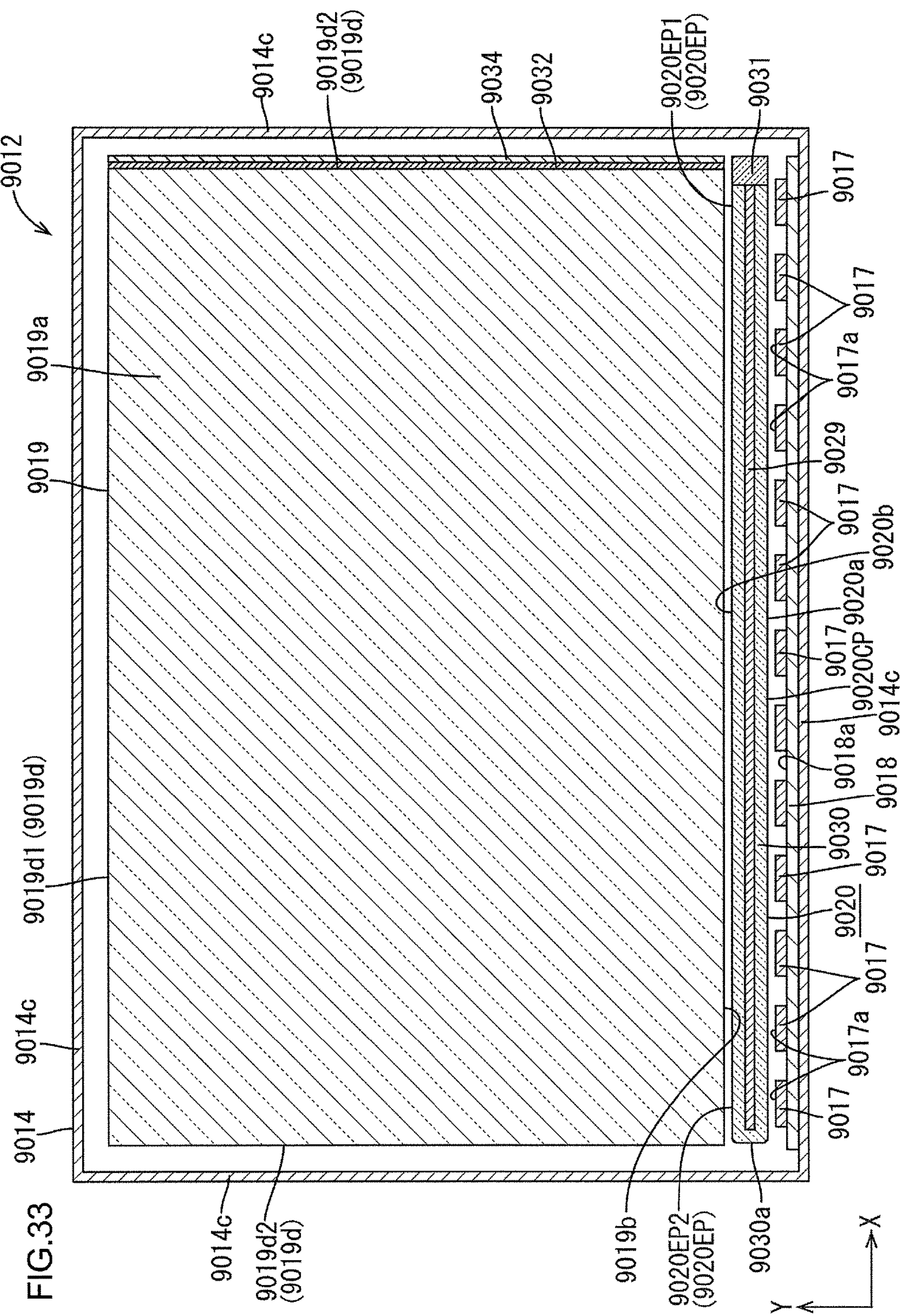
FIG. 33 is a cross-sectional view along line viii-viii in FIG. 29.

The main wavelength converting member 9020 will be described in detail. As illustrated in FIGS. 32 and 33, the main wavelength converting member 9020 is disposed between the LEDs 9017 and the light entering end surface 9019*b* of the light guide plate 9019. The main wavelength converting member 9020 includes phosphors (wavelength converting substances) for converting the light rays emitted by the LEDs 9017 (the primary light rays) to light rays with different wavelengths (the secondary light rays). The main wavelength converting member 9020 is held in a position described above with a holding member that is not illustrated. The main wavelength converting member 9020 extends along the length direction of the light entering end surface 9019*b* of the light guide plate 9019 (the X-axis direction). The main wavelength converting member 9020 is opposed to about an entire light entering end surface 9019*b* and to all LEDs 9017 mounted on the LED board 9018. The main wavelength converting member 9020 has a vertically-long oval cross section cut along a direction perpendicular to the length direction thereof (an extending direction, the X-axis direction). A length (a dimension in the X-axis direction) of the main wavelength converting member 9020 is larger than a long dimension of the light guide plate 9019 (a long dimension of the light entering end surface 9019*b*). A height (a dimension in the Z-axis direction) of the main wavelength converting member 9020 is larger than a thickness of the light guide plate 9019 (a width of the light entering end surface 9019*b*). Outer surfaces of the main wavelength converting member 9020 along the X-axis direction and the Z-axis direction are substantially flat. The outer surface opposed to light emitting surfaces 9017*a* of the LEDs 9017 is parallel to the light emitting surfaces 9017*a* and defined as a light entering surface 9020*a* through which the light rays from the light emitting surfaces 9017*a* enter. The outer surface opposed to the light entering end surface 9019*b* of the light guide plate 9019 is parallel to the light entering end surface 9019*b* and defined as a light exiting surface 9020*b* through which the light rays exit toward the lithe entering end surface 9019*b*. The main wavelength converting member 9020 is disposed such that an inner end of the main wavelength converting member 9020 is located outer than an inner end of the frame portion 9016*a* of the frame 9016 with respect to the width direction thereof (the Y-axis direction). Namely, the main wavelength converting member 9020 is disposed to entirely overlap the frame portion 9016*a* of the frame 9016 in the plan view. Therefore, the main wavelength converting member 9020 is less likely to be directly viewed by a user of the liquid crystal display device 9010 from the front side. According to the configuration, the light rays emitted by the LEDs 9017 enter the light guide plate 9019 through the light entering end surface 9019*b* after wavelength converted during travel through the wavelength converting member 9020 disposed between the LEDs 9017 and the light entering end surface 9019*b* of the light guide plate 9019. The light rays travel through the light guide plate 9019 and then exit through the light exiting plate surface 9019*a*. The main wavelength converting member 9020 is disposed between the LEDs 9017 and the light entering end surface 9019*b* of the light guide plate 9019. Therefore, in comparison to a configuration in which a wavelength converting portion formed in a sheet shape is placed over the light exiting plate surface 9019*a* of the light guide plate 9019 or the opposite plate surface 9019*c*, an amount of the phosphors can be reduced. This configuration is preferable for reducing a production cost.

As illustrated in FIGS. 32 and 33, the main wavelength converting member 9020 includes a phosphor containing member 9029, a container 9030 (a capillary), and a sealing member 9031. The phosphor containing member 9029 contain the phosphors (the wavelength converting substances) for converting the wavelength of the light rays from the LEDs 9017. The container 9030 extends along the X-axis direction that corresponds with the length direction of the light entering end surface 9019*b* and holds the phosphor containing member 9029. The sealing member 9031 seals an end of the container 9030 with respect to the X-axis direction. In the phosphor containing member 9029, red phosphors and green phosphors are dispersed. The red phosphors emit red light rays (visible light rays in a specific wavelength region of red) and the green phosphors emit green light rays (visible light rays in a specific wavelength region of green) when excited by the light rays in a single color of blue emitted by the LEDs 9017. The phosphor containing member 9029 is prepared by dispersing the red phosphors and the green phosphors in an ultraviolet curable resin material in a liquid state to obtain a phosphor solution, pouring the phosphor solution into the container 9030, and curing the phosphor solution with an ultraviolet ray applied thereto.

More specifically, the phosphors in different colors contained in the phosphor containing member 9029 are excited by blue light and have the following emission spectra. The green phosphors emit the light rays in the wavelength range of green (about 500 nm to about 570 nm) when excited by the blue light rays, that is, emit green light rays as fluorescent light rays. Preferably, the green phosphors have an emission spectrum with a peak wavelength about 530 nm in the wavelength range of green light and a full width at half maximum smaller than 40 nm. The red phosphors emit the light rays in the wavelength range of red (about 600 nm to about 780 nm) when excited by the blue light rays, that is, emit red light rays as fluorescent light rays. Preferably, the red phosphors have an emission spectrum with a peak wavelength about 610 nm in the wavelength range of green light and a full width at half maximum smaller than 40 nm.

As illustrated in FIGS. 32 and 33, the phosphor containing member 9029 is sealed in an internal space of the container 9030. The phosphor containing member 9029 has surfaces along the X-axis direction and the Z-axis direction. A forming area of the phosphor containing member 9029 is set to overlap most of the mounting area of the LEDs 9017 on the LED board 9018 with respect to the X-axis direction and entire light emitting surfaces 9017*a* of the LEDs 9017 with respect to the Z-axis direction. The phosphor containing member 9029 has a thickness (a dimension in the Y-axis direction) smaller than the thickness of the container 9030, specifically, about 0.5 mm. The front and the back surfaces of the phosphor containing member 9029 along the X-axis direction and the Z-axis direction are both flat surfaces and parallel to the light emitting surfaces 9017*a* of the LEDs 9017 and the light entering end surface 9019*b* of the light guide plate 9019, respectively.

The container 9030 is made of substantially transparent inorganic glass material having high light transmissivity (e.g., alkali-free glass and silica glass). The container 9030 has a refractive index of about 1.5. As illustrated in FIGS. 32 and 33, the container 9030 surrounds the phosphor containing member 9029 for an entire length. The container 9030 has a tubular shape with a bottom. The container 9030 extends long the X-axis direction. The container 9030 has a vertically long oval cross section cut along a direction perpendicular to the length direction thereof (the extending direction). Outer surfaces of the container 9030 along the length direction are the light entering surface 9020*a* and the light exiting surface 9020*b* described earlier. The container 9030 has a thickness larger than the thickness of the phosphor containing member 9029 described above, specifically, about 1 mm. One of ends of the container 9030 with respect to the length direction is sealed by the sealing member 9031. Namely, the main wavelength converting member 9020 has a single-end sealed structure in which only one end is sealed with the sealing member 9031. One of ends of the container 9030 is open and the other end is closed with the bottom 9030*a* before the phosphor containing member 9029 is formed in a production process. After the phosphor containing member 9029 is formed, the open end is closed with the sealing member 9031. The sealing member 9031 is made of organic glass material that is the same as the material of the container 9030. Therefore, the end of the container 9030 can be sealed with high air tightness. The dimension of the sealing member 9031 in the X-axis direction is larger than the thickness of the bottom 9030*a* of the container 9030 and smaller than or about equal to the dimension of the LEDs 9017 in the X-axis direction, specifically, about 5 mm.

The main wavelength converting member 9020 having the configuration described above (the single-end sealed structure) includes a pair of end portions 9020EP at the ends thereof with respect to the length direction thereof. The sealing member 9031 is set at one of the end portions 9020EP but the sealing member 9031 is not set at the other one of the end portions 9020EP. The one of the end portions 9020EP may be referred to as a sealing member disposed end portion 9020EP1 and the other one of the end portions 9020EP may be referred to as a sealing member non-disposed end portion 9020EP2. As illustrated in FIG. 33, the sealing member disposed end portion 9020EP1 of the main wavelength converting member 9020 (the sealing member 9031) project outer than a first non-light entering adjacent end surface 9019*d*2 of the light guide plate 9019 (on the right side in FIG. 33) with respect to the X-axis direction. The sealing member disposed end portion 9020EP1 and the first non-light entering adjacent end surface 9019*d*2 have a positional relationship to overlap each other with respect to the X-axis direction. The sealing member non-disposed end portion 9020EP2 (the bottom 9030*a* of the container 9030) is located inner than a second non-light entering adjacent end surface 9019*d*2 of the light guide plate 9019 (on the left side in FIG. 33) with respect to the X-axis direction. The sealing member non-disposed end portion 9020EP2 and the second non-light entering adjacent end surface 9019*d*2 have a positional relationship not to overlap each other with respect to the X-axis direction. The sealing member disposed end portion 9020EP1 of the main wavelength converting member 9020 includes the sealing member 9031. The sealing member non-disposed end portion 9020EP2 does not include the sealing member 9031 but include the bottom 9030*a* of the container 9030. Therefore, the ends of the main wavelength converting member 9020 with respect to the length direction include at least small regions in which the phosphor containing member 9029 (the phosphors) are not provided. At an edge of the sealing member non-disposed end portion 9020EP2, the region in which the phosphor containing member 9029 is not provided exist for a dimension of the sealing member 9031 with respect to the X-axis direction. The region is larger than the region of the sealing member non-disposed end portion 9020EP2 (the thickness of the bottom 9030*a*). To reduce the frame sizes of the liquid crystal display device 9010 and the backlight unit 9012, the regions of the main wavelength converting member 9020 in which the phosphor containing member 9029 is not provided are more likely to overlap the LEDs 9017 with respect to the X-axis direction. The blue light rays from the LEDs 9017 may enter the ends of the light entering end surface 9019*b* of the light guide plate 9019 in the length direction without the wavelength conversion by the phosphors in the phosphor containing member 9029. As a result, the light rays exiting from the ends of the light guide plate 9019 with respect to the X-axis direction may be bluish, that is, color unevenness may occur. Especially, at the edge portion of the sealing member disposed end portion 9020EP1, the region in which the phosphor containing member 9029 is not provided is larger. Therefore, the regions are more likely to overlap the LEDs 9017 with respect to the X-axis direction and thus the color unevenness may occur.

Figure 34:
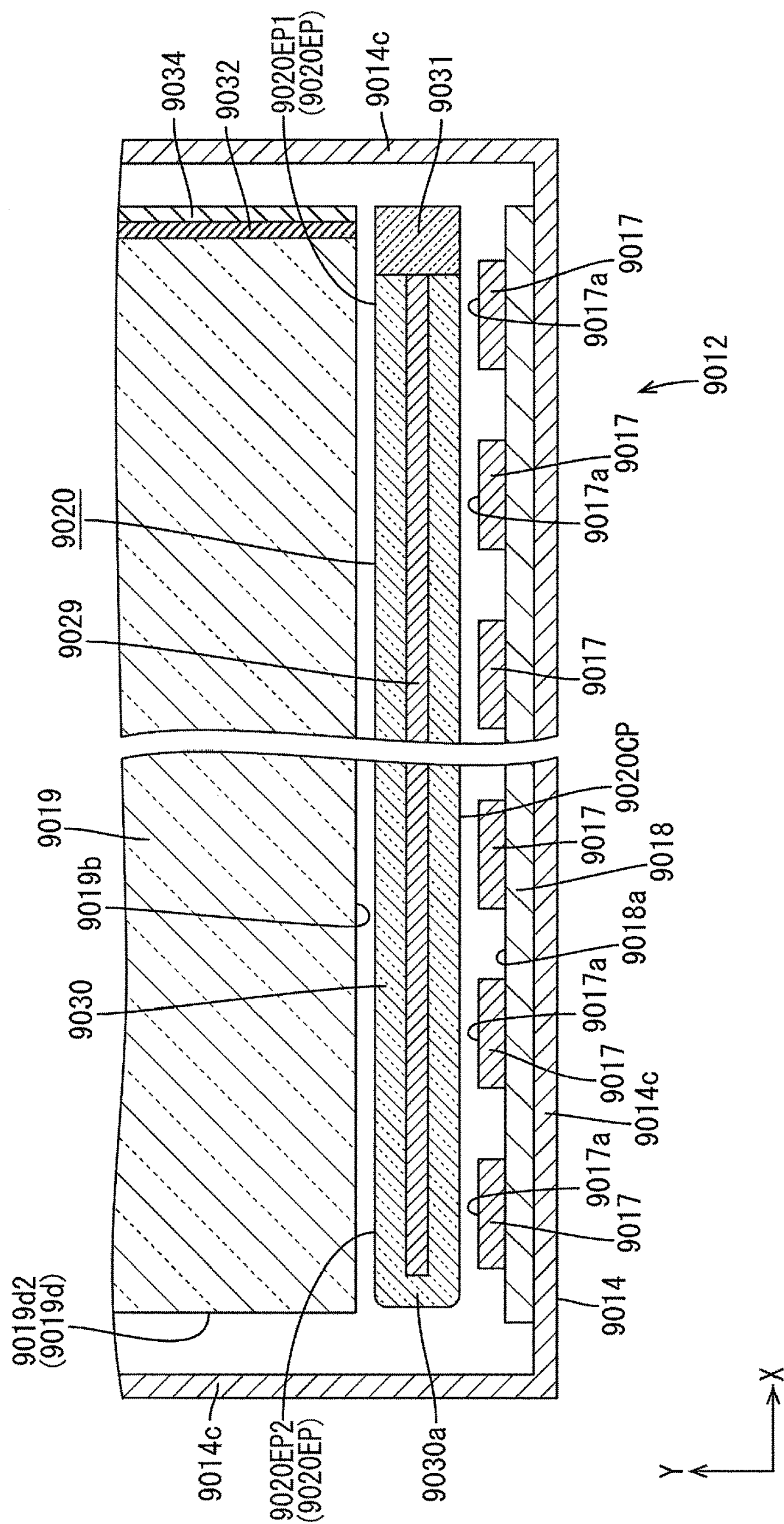
FIG. 34 is a magnified view of FIG. 33.

As illustrated in FIGS. 33 and 34, the backlight unit 9012 according to this embodiment includes a sub wavelength converting member 9032 (a sub wavelength converting sheet) disposed on the section of the light guide plate 9019 overlapping the end portion 9020EP of the main wavelength converting member 9020 with respect to the X-axis direction (the length direction of the light entering end surface 9019*b*). The sub wavelength converting member 9032 converts the wavelength of the light rays from the LEDs 9017. According to the configuration, even if the sections in which the phosphor containing member 9029 is not provided are created at ends of the main wavelength converting member 9020 in the length direction of the main wavelength converting member 9020 and the light rays that have passed the end portions 9020EP of the main wavelength converting member 9020 in the length direction may include the light rays without the wavelength conversion by the phosphors in the phosphor containing member 9029 resulting from the positional relationship between the regions and the LEDs 9017, that is, the overlap between the regions and the LEDs 9017 with respect to the length direction, the light rays without the wavelength conversion can be wavelength converted by the sub wavelength converting member 9032 provided to overlap the end portion 9020EP of the wavelength converting member 9020 of the light guide plate 9019 with respect to the length direction. According to the configuration, a difference in color is less likely to occur between the light rays exiting from the end portion of the light exiting plate surface 9019*a* of the light guide plate 9019 with respect to the length direction of the light entering end surface 9019*b* and the light rays exiting from the middle portion of the light exiting plate surface 9019*a* of the light guide plate 9019 with respect to the length direction of the light entering end surface 9019*b*. Even if the frame sizes are reduced, the color unevenness is less likely to occur in the light rays exiting from the light exiting plate surface 9019*a*.

Figure 35:
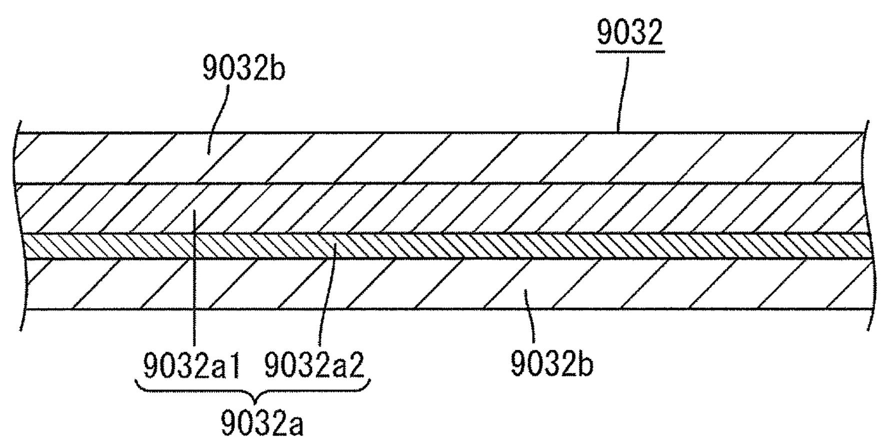
FIG. 35 is a cross-sectional view of a sub wavelength converting member.

The sub wavelength converting member 9032 will be described in detail. As illustrated in FIG. 35, the sub wavelength converting member 9032 includes a wavelength converting layer 9032*a* (a phosphor film) and a pair of protective layers 9032*b* (protective films). The sub wavelength converting member 9032 has a sheet-like overall shape. The wavelength converting layer 9032*a* contains the phosphors (wavelength converting substances) for converting the wavelength of the blue light rays that are not wavelength converted. The protective layers 9032*b* sandwich the wavelength converting layer 9032*a* from the front-rear direction to protect the wavelength converting layer 9032*a*. In the wavelength converting layer 9032*a*, red phosphors and green phosphors are dispersed. The red phosphors emit the red light rays (visible light rays in a specific wavelength region of red) when excited by the light rays in a single color of blue from the LEDs 9017 without the wavelength conversion. The green phosphor emit the green light rays (visible light rays in a specific wavelength region of green) when excited by the light rays in a single color of blue from the LEDs 9017 without the wavelength conversion. Namely, the sub wavelength converting member 9032 converts the blue light rays (the primary light rays) without the wavelength conversion into the secondary light rays (the green light rays and the red light rays) which exhibit the complementary color (yellow) of the color (blue) of the blue light rays. The wavelength converting layer 9032*a* includes a base 9032*a*1 (a phosphor base) and a phosphor layer 9032*a*2. The base 9032*a*1 is made of substantially transparent synthetic resin and formed in a film shape. The phosphor layer 9032*a*2 in which the red phosphors and the green phosphors are dispersed is applied to the base 9032*a*1. The red phosphors and the green phosphors dispersed in the phosphor layer 9032*a*2 are quantum dot phosphors. The quantum dot phosphors contained in the phosphor layer 9032*a*2 may be made of the same as or similar to the materials of the quantum dot phosphors contained in the phosphor containing member 9029 of the main wavelength converting member 9020. Therefore, optical characteristics (including main emission wavelengths) regarding the green light rays and the red light rays obtained through the wavelength conversion by the sub wavelength converting member 9032 are the same as or similar to the optical characteristics regarding the green light rays and the red light rays obtained through the wavelength conversion by the main wavelength converting member 9020. The protective layers 9032*b* are made of substantially transparent synthetic resin and formed in the film shape. The protective layers 9032*b* have high moisture proof properties.

As illustrated in FIG. 34, the sub wavelength converting member 9032 is disposed to overlap (or to contact) the non-light entering adjacent end surface 9012*d*2 adjacent to the light entering end surface 9019*b* among the non-light entering end surfaces 9019*d* of the peripheral end surfaces of the light guide plate 9019. Namely, the sub wavelength converting member 9032 may be defined as a "non-light entering end surface sub wavelength converting portion" disposed on the non-light entering adjacent end surface 9019*d*2 of the light guide plate 9019. The sub wavelength converting member 9032 formed in the sheet shape is disposed such that a plate surface thereof is parallel to the non-light entering adjacent end surface 9019*d*2 to cover substantially an entire area of the non-light entering adjacent end surface 9019*d*2. The light rays that have passed the end portion 9020EP of the main wavelength converting member 9020 in the X-axis direction tend to enter the end section of the light entering end surface 9019*b* of the light guide plate 9019 with respect to the X-axis direction and to travel toward the non-light entering adjacent end surface 9019*d*2. Therefore, even if the light rays without the wavelength conversion by the phosphors in the phosphor containing member 9029 are included in the light rays that have passed through the end portion 9020EP of the main light wavelength converting member 9020 in the length direction thereof, the blue light rays are converted into the green light rays and the red light rays by the phosphors contained in the sub wavelength converting member 9032 when the blue light rays reach the non-light entering adjacent end surface 9019*d*2. Therefore, the occurrence of the color unevenness can be properly reduced.

The light guide plate 9019 includes the non-light entering adjacent end surfaces 9019*d*2 adjacent to the light entering end surface 9019*b*. The sub wavelength converting member 9032 is attached to the non-light entering adjacent end surface 9019*d*2 that overlaps the sealing member disposed end portion 9020EP1 of the main wavelength converting member 9020 with respect to the X-axis direction (on the right side in FIG. 34). Namely, the sub wavelength converting member 9032 is not disposed on the non-light entering adjacent end surface 9019*d*2 disposed outer than the sealing member non-disposed end portion 9020EP2 with respect to the X-axis direction (on the left side in FIG. 34) in the pair of the non-light entering adjacent end surfaces 9019*d*2. The sub wavelength converting member 9032 is selectively disposed only on the non-light entering adjacent end surface 9019*d*2 that overlaps the sealing member disposed end portion 9020EP1 with respect to the X-axis direction. According to the configuration, even if a large amount of the blue light rays without the wavelength conversion by the phosphors is included in the light rays that have passed through the sealing member disposed end portion 9020EP1 due to the region of the sealing member disposed end portion 9020EP1 of the main wavelength converting member 9020 in which the phosphor containing member 9029 is not disposed larger than the sealing member non-disposed end portion 9020EP2, the light rays can be converted into the green light rays and the red light rays by the sub wavelength converting member 9032. According to the configuration, the occurrence of the color unevenness can be properly reduced. Furthermore, the sub wavelength converting member 9032 is not disposed in a section of the light guide plate 9019 outer than the sealing member non-disposed end portion 9020EP2 with respect to the length direction. This is preferable for reducing a cost regarding installation of the sub wavelength converting member.

Figure 36:
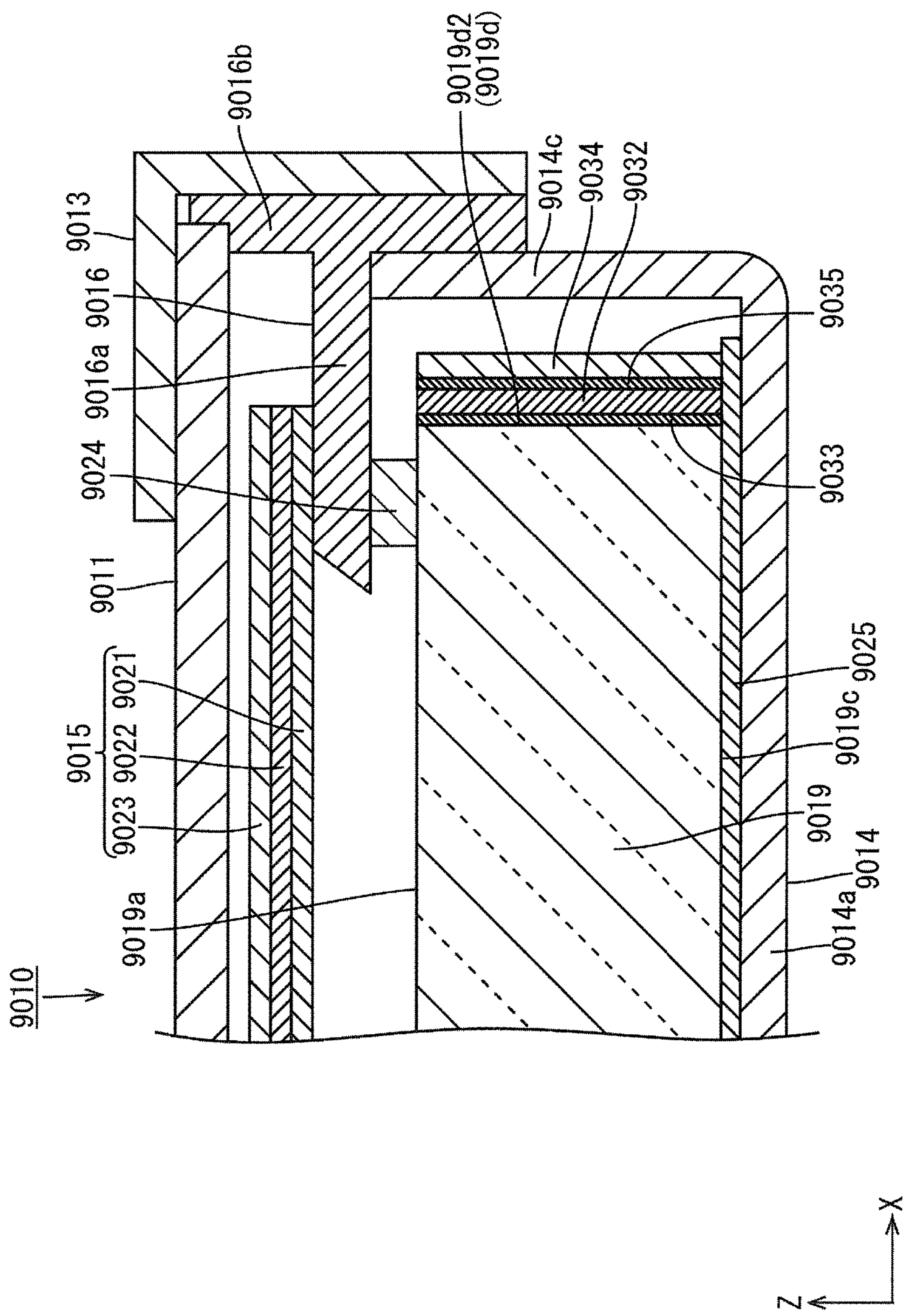
FIG. 36 is a magnified cross-sectional view illustrating a portion of a light guide plate including a non-light entering adjacent end surface and therearound.

As illustrated in FIG. 36, the sub wavelength converting member 9032 is bonded to the non-light entering adjacent end surface 9019$d$2 of the light guide plate 9019 with a light guide plate-side adhesive layer 9033 and integrated with the light guide plate 9019. Because an interface such as an air layer is less likely to be produced between the non-light entering adjacent end surface 9019$d$2 of the light guide plate 9019 and the sub wavelength converting member 9032, the light rays that have exited through the non-light entering adjacent end surface 9019$d$2 are less likely to be improperly refracted before reaching the sub wavelength converting member 9032. The light rays that have exited the light guide plate 9019 through the non-light entering adjacent end surface 9019$d$2 are more likely to properly pass through the sub wavelength converting member 9032. Therefore, high efficiency can be achieved in wavelength conversion. This configuration is preferable for reducing the color unevenness.

As illustrated in FIG. 36, an end surface reflection member 9034 (an end surface reflection sheet) is disposed on the outer side of the sub wavelength converting member 9032 (on the opposite side from the light guide plate 9019 side) to overlap (or contact) the sub wavelength converting member 9032. The end surface reflection member 9034 reflects the light rays that have passed through the wavelength converting member 9032. The end surface reflection member 9034 has the same configuration as the reflection sheet 9025 that is described earlier. The end surface reflection member 9034 is made of synthetic resin with a white surface having high light reflectivity (e.g., formed PET). The end surface reflection member 9034 is disposed to cover the entire area of the sub wavelength converting member 9032 from the outer side. According to the configuration, the light rays that have entered the light guide plate 9019 through the light entering end surface 9019$b$ and reached the non-light entering adjacent end surface 9019$d$2 pass through the sub wavelength converting member 9032 and are reflected by the end surface reflection member 9034. The light rays are returned to the light guide plate 9019 without exiting from the non-light entering adjacent end surface 9019$d$2 to the outside. According to the configuration, high efficiency can be achieved in use of the light rays that are obtained through the wavelength conversion by the sub wavelength converting member 9032. The sub wavelength converting member 9032 is bonded to the end surface reflection member 9034 with an end surface reflection member-side adhesive layer 9035. The sub wavelength converting member 9032 is integrated with the end surface reflection member 9034 with the end surface reflection member-side adhesive layer 9035. Because an interface such as an air layer is less likely to be produced between the sub wavelength converting member 9032 and the end surface reflection member 9034, the light rays that have passed through the sub wavelength converting member 9032 are less likely to be improperly refracted before reaching the end surface reflection member 9034. The light rays that have passed through the sub wavelength converting member 9032 are more properly reflected by the end surface reflection member 9034. Therefore, further higher light use efficiency can be achieved.

This embodiment has the configuration described above. Next, functions of this embodiment will be described. When the liquid crystal display device 9010 is turned on, driving of the liquid crystal panel 9011 is controlled by ta panel control circuit of a control circuit board that is not illustrated. Furthermore, driving power is supplied from a LED drive circuit board that is not illustrated to the LEDs 9017 on the LED board 9018 and driving of the LEDs 9017 is controlled. The light rays from the LEDs 9017 are directed by the light guide plate 9019 and applied to the liquid crystal panel 9011 via the optical members 9015. As a result, predefined images are displayed on the liquid crystal panel 9011.

When the LEDs 9017 are turned on, the blue light rays (the primary light rays) which have exited from the light emitting surface 9017$a$ of the LEDs 9017 enter the main wavelength converting member 9020 through the light entering surface 9020$a$ as illustrated in FIGS. 32 and 33. The blue light rays are converted into the green light rays and the red light rays (the secondary light rays) by the green phosphors and the red phosphors contained in the phosphor containing member 9029 in the container 9030. The green light rays and the red light rays obtained through the wavelength conversion and the blue light rays emitted by the LEDs 9017 form illumination light in substantially white. The green light rays and the red light rays obtained through the wavelength conversion by the phosphor containing member 9029 and the blue light rays that are not wavelength converted by the phosphor containing member 9029 exit the main wavelength converting member 9020 through the light exiting surface 9020$b$ and enter the light guide plate 9019 through the light entering end surface 9019$b$. The light rays that have entered through the light entering end surface 9019$b$ may be totally reflected at an interface with an external air layer or reflected by the reflection sheet 9025 while traveling through the light guide plate 9019. The light rays are reflected and scattered by the light reflecting portions of the light reflecting pattern. The light rays enter the light exiting plate surface 9019$a$ with angles smaller than the critical angle and thus exit through the light exiting plate surface 9019$a$. The light rays that have exited the light guide plate 9019 through the light exiting plate surface 9019$a$ are applied to the liquid crystal panel 9011 after optical effects are exerted thereon while passing through the optical members 9015.

The function of the main wavelength converting member 9020 will be described in detail. As illustrated in FIGS. 32 and 33, when the blue light rays emitted by the LEDs 9017 (the primary light rays) enter the main wavelength converting member 9020 through the light entering surface 9020$a$ and some of the blue light rays excite the green phosphors and the red phosphors dispersed in the phosphor containing member 9029 in the container 9030, the green light rays and the red light rays (the secondary light rays) are emitted by the green phosphors and the red phosphors. The green light rays and the red light rays obtained through the wavelength conversion and the blue light rays without the wavelength conversion exit the main wavelength converting member 9020 through the light exiting surface 9020$b$ and enter the light guide plate 9019 through the light entering end surface 9019$b$. The sealing member 9031 and the bottom 9030$a$ of the container 9030 exist at the ends of the end portions 9020EP of the main wavelength converting member 9020 in the length direction thereof. The green phosphors and the red phosphors in the phosphor containing member 9029 are not provided at the ends. When the frame sizes of the liquid crystal display device 9010 and the backlight unit 9012 are reduced, the sealing member 9031 and the bottom 9030$a$ that are the portions of the main wavelength converting member 9020 in which the green phosphors and the red phosphors are not provided are more likely to overlap the LEDs 9017 at the ends (end light sources) with respect to the arrangement direction of the LEDs 9017 on the LED board 9018 (the X-axis direction). Because of such a positional relationship, the light rays from the LEDs 9017 may enter the end sections of the light entering end surface 9019*b* of the light guide plate 9019 in the longitudinal direction without the wavelength conversion by the green phosphors and the red phosphors. Especially, the sealing member 31 at the sealing member disposed end portion 9020EP1 has the dimension in the X-axis direction larger than the bottom 9030*a* of the container 9030 at the sealing member non-disposed end portion 9020EP2. Therefore, the sealing member 31 is more likely to overlap the LED 9017 at the end with respect to the X-axis direction. Because of that, the blue light rays from the LED 9017 at the end are more likely to enter the end section of the light entering end surface 9019*b* of the light guide plate 9019 in the length direction opposed to the sealing member disposed end portion 9020EP1 without the wavelength conversion by the green phosphors and the red phosphors. Then bluish light rays may exit through some sections of the light exiting plate surface 9019*a*.

In this embodiment, as illustrated in FIGS. 34 and 36, the sub wavelength converting member 9032 including the phosphors (the green phosphors and the red phosphors) which wavelength convert the light rays from the LEDs 9017 is disposed at the non-light entering adjacent end surface 9019*d*2 that is the section of the light guide plate 9019 overlapping the end portion 9020EP of the main wavelength converting member 9020 in the length direction with respect to the X-axis direction. Therefore, even if the light rays without the wavelength conversion by the phosphors in the phosphor containing member 9029 are included in the light rays that have passed through the end portion 9020EP in the length direction of the main wavelength converting member 9020 as described above, the blue light rays without the wavelength conversion are converted into the green light rays and the red light rays by the phosphors in the sub wavelength converting member 9032 after the blue light rays have entered the light guide plate 9019 through the light entering end surface 9019*b* and reached the non-light entering adjacent end surface 9019*d*2. Furthermore, the sub wavelength converting member 9032 is selectively disposed only at the non-light entering adjacent end surface 9012*d*2 that overlaps the sealing member disposed end portion 9020EP1 with respect to the X-axis direction in the pair of the non-light entering adjacent end surfaces 9019*d*2. At the sealing member disposed end portion 9020EP1 of the main wavelength converting member 9020, even if a larger amount of the blue light rays without the wavelength conversion by the phosphors is includes in the light rays that have passed through the sealing member disposed end portion 9020EP1 resulting from the region in which the phosphor containing member 9029 is not provided larger than the sealing member non-disposed end portion 9020EP2, the light rays can be converted into the green light rays and the red light rays by the sub wavelength converting member 9032. According to the configuration, a difference in color is less likely to occur between the light rays exiting from the end sections of the light exiting plate surface 9019*a* of the light guide plate 9019 at the ends of the light entering end surface 9019*b* with respect to the length direction thereof and the light rays exiting from the middle section of the light exiting plate surface 9019*a* of the light guide plate 9019 at the middle section of the light entering end surface 9019*b* with respect to the length direction thereof. Therefore, even the frame sizes are reduced, the color unevenness is less likely to occur in the light rays exiting from the light exiting plate surface 9019*a*. Furthermore, the end surface reflection member 9034 is disposed to overlap the outer side of the sub wavelength converting member 9032. Therefore, the light rays that have entered the light guide plate 9019 through the light entering end surface 9019*b*, reached the non-light entering adjacent end surface 9019*d*2, and passed through the sub wavelength converting member 9032 can be reflected by the end surface reflection member 9034 and returned to the light guide plate 9019. The light rays that have been wavelength converted by the sub wavelength converting member 9032 are less likely to exit through the non-light entering adjacent end surface 9019*d*2. The light rays are returned to the light guide plate 9019 and exit through the light exiting plate surface 9019*a*. According to the configuration, high efficiency can be achieved in use of the light rays obtained through the wavelength conversion by the sub wavelength converting member 32.

<Ninth Embodiment>

A ninth embodiment of the present invention will be described with reference to FIGS. 37 and 38. In the ninth embodiment, the number of sub wavelength converting members 90132 is different. Configurations, functions, and effects similar to those of the eighth embodiment will not be described.

Figure 37:
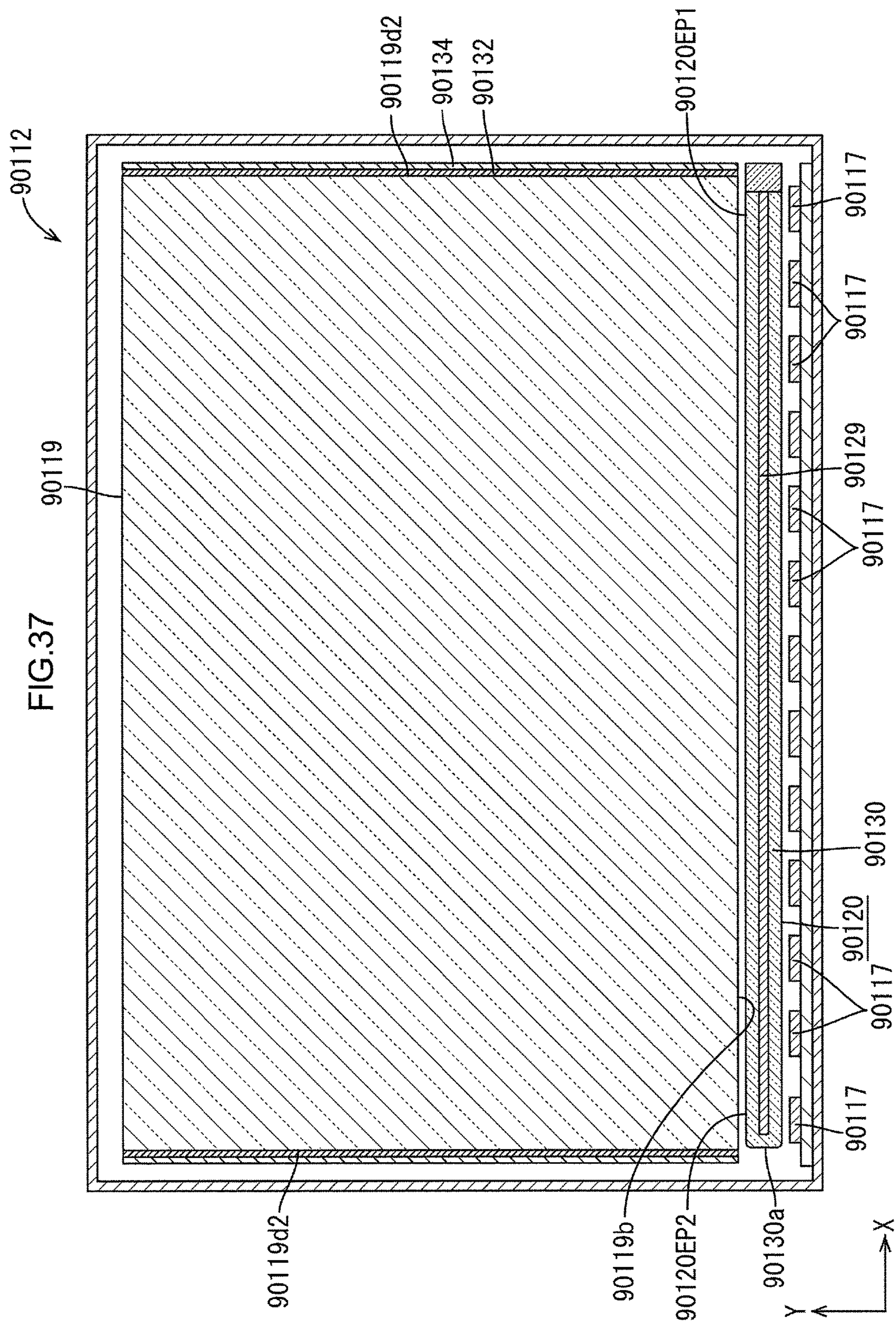
FIG. 37 is a cross-sectional plan view of a backlight unit according to a ninth embodiment.
Figure 38:
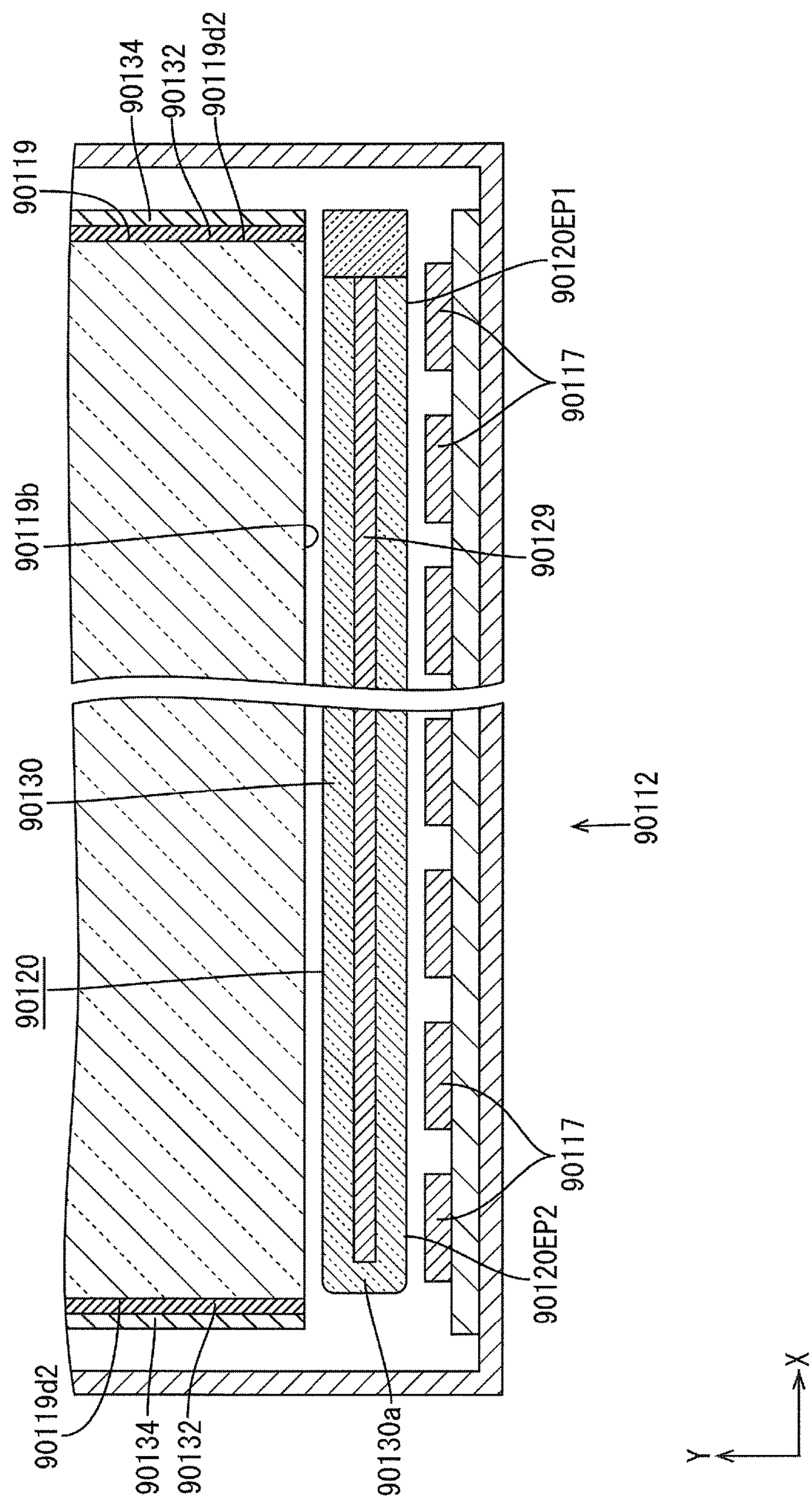
FIG. 38 is a magnified view of FIG. 37.

As illustrated in FIG. 37, a section of an LED 90117 (the end light source) located at an end of a main wavelength converting member 90120 at which a sealing member non-disposed end portion 90120EP2 among LEDs 90117 according to this embodiment overlaps a bottom 90130*a* of a container 90130 which is a region of the sealing member non-disposed end portion 90120EP2 of the main wavelength converting member 90120 in which a phosphor containing member 90129 is not provided with respect to the X-axis direction. Such an arrangement may be more preferable in comparison to that of the eighth embodiment when a frame size of a backlight unit 90112 is further reduced. In such an arrangement, as illustrated in FIG. 38, the sub wavelength converting member 90132 is disposed on a non-light entering adjacent end surface 90119*d*2 of a light guide plate 90119 overlapping a sealing member disposed end portion 90120EP1 with respect to the X-axis direction. Furthermore, the other sub wavelength converting member 90132 is disposed on the non-light entering adjacent end surface 90119*d*2 of the light guide plate 90119 located outer than the sealing member non-disposed end portion 90120EP2 with respect to the X-axis direction. Namely, the sub wavelength converting members 90132 are disposed over the non-light entering adjacent end surfaces 90119*d*2 on the outer sides, respectively. The sub wavelength converting members 90132 have a configuration similar to that in the eighth embodiment. The sub wavelength converting members 90132 cover entire areas of the non-light entering adjacent end surfaces 90119*d*2, respectively. End surface reflection members 90134 are disposed over outer surfaces of the sub wavelength converting members 90132, respectively.

The bottom 90130*a* of the container 90130 which is the region in which the phosphor containing member 90129 is not provided at the sealing member non-disposed end portion 90120EP2 of the main wavelength converting member 90120 overlaps the LED 90117 at the end with respect to the X-axis direction. According to such an arrangement, light rays that have passed through the sealing member non-disposed end portion 90120EP2 of the main wavelength converting member 90120 in the X-axis direction may include blue light rays without the wavelength conversion by the phosphors. Even in such a case, the blue light rays that have passed through the sealing member non-disposed end portion 90120EP2 without the wavelength conversion enter the light guide plate 90119 through the light entering end surface 90119*b* and reach the non-light entering adjacent end surface 90119*d*2 on the sealing member non-disposed end portion 90120EP2 side with respect to the X-axis direction. The blue light rays are converted into the green light rays and the red light rays by the sub wavelength converting member 90132 disposed on the non-light entering adjacent end surface 90119*d*2. Therefore, occurrence of color unevenness can be more properly reduced. Furthermore, the light rays that have passed through the sub wavelength converting members 90132 are reflected by the end surface reflection members 90134 to the light guide plate 90119. Therefore, high light use efficiency can be achieved. The contents or the concentrations of the phosphors in the sub wavelength converting members 90132 may be set different from each other. It is preferable to set the content and the concentration of the phosphors in the sub wavelength converting member 90132 that overlaps the sealing member disposed end portion 90120EP1 with respect to the X-axis direction higher than the content and the concentration of the phosphors in the sub wavelength converting member 90132 located outer than the sealing member non-disposed end portion 90120EP2 with respect to the X-axis direction.

In this embodiment, the sub wavelength converting members 90132 are disposed on the section of the light guide plate 90119 overlapping the sealing member disposed end portion 90120EP1 with respect to the length direction and on the section of the light guide plate 90119 located outer than the sealing member non-disposed end portion 90120EP2 with respect to the length direction. According to the configuration, edges of the sealing member non-disposed end portion 90120EP2 of the main wavelength converting member 90120 have regions in which the phosphors are not disposed. Even if the light rays that have passed the sealing member non-disposed end portion 90120EP2 of the main wavelength converting member 90120 in the length direction include the light rays without the wavelength conversion by the phosphors, the light rays can be wavelength converted by the sub wavelength converting member 90132. According to the configuration, the occurrence of the color unevenness can be further properly reduced.

<Tenth Embodiment>

A tenth embodiment of the present invention will be described with reference to FIG. 39. In the tenth embodiment, the number of main wavelength converting members 90220 is different from that of the eighth embodiment. Configuration, functions, and effects similar to those of the eighth embodiment will not be described.

Figure 39:
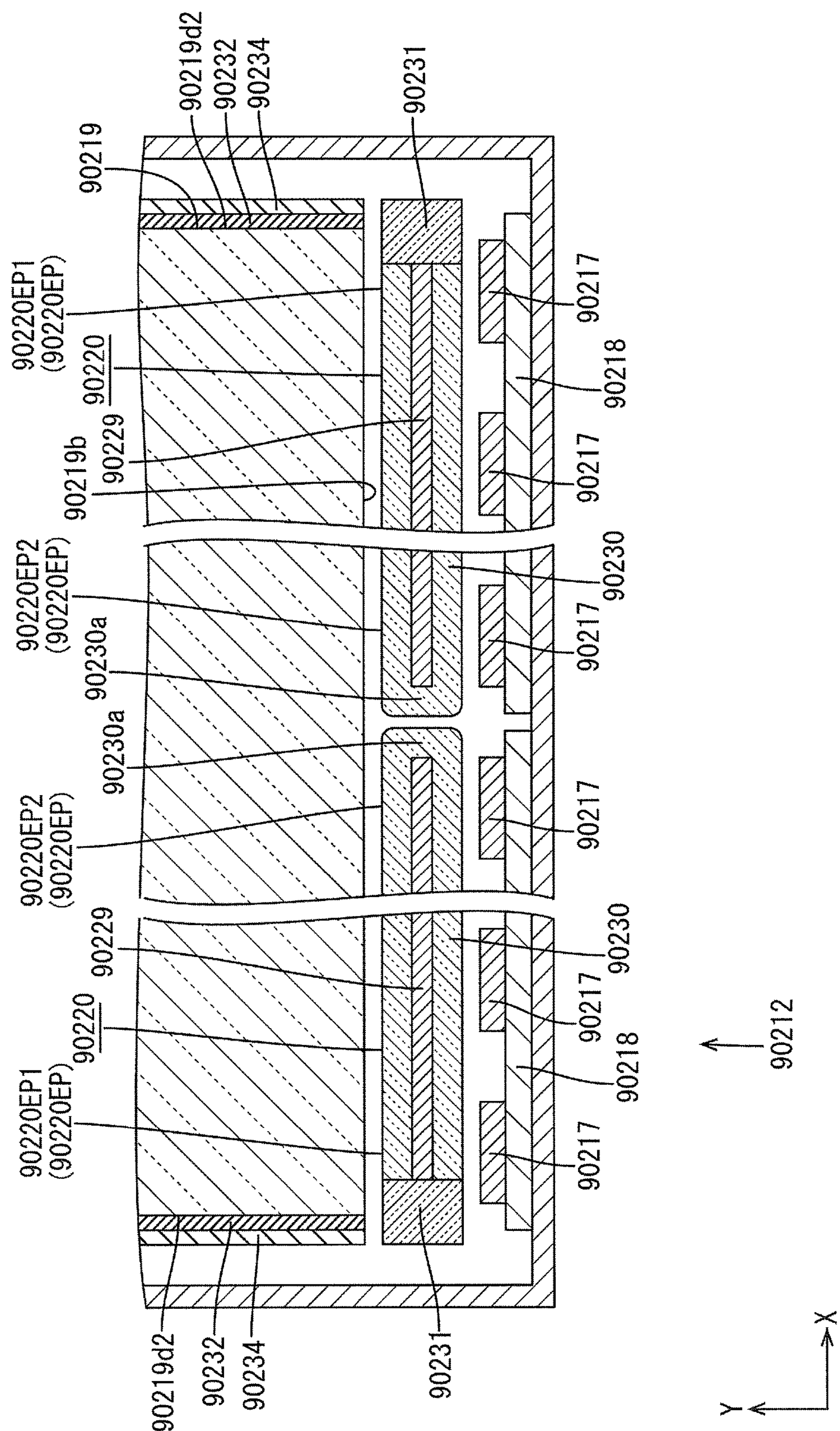
FIG. 39 is a magnified cross-sectional plan view of a backlight unit according to a tenth embodiment of the present invention.

As illustrated in FIG. 39, two main wavelength converting members 90220 according to this embodiment are disposed adjacent to each other along a length direction of a light entering end surface 90219*b* of a light guide plate 90219. The main wavelength converting members 90220 are linearly arranged along the X-axis direction in a space between LEDs 90217 and the light guide plate 90219 with axes of the main wavelength converting members 90220 substantially corresponding with each other. Such two main wavelength converting members 90220 are preferable for a backlight unit 90212 in a larger size. End portions 90220EP of the wavelength converting member 90220 not adjacent to each other are defined as sealing member disposed end portions 90220EP1. The sealing member disposed end portions 90220EP1 are disposed on outer sides with respect to the X-axis direction (a length direction of the light entering end surface 90219*b*) in the backlight unit 90212. End portions 90220EP of the wavelength converting members 90220 adjacent to each other are defined as sealing member non-disposed end portions 90220EP2. The sealing member non-disposed end portions 90220EP2 are disposed in the middle of the backlight unit 90212 with respect to the X-axis direction. The sealing member disposed end portions 90220EP1 of the main wavelength converting members 90220 project outer in the X-axis direction than non-light entering end surfaces 90219*d* of the light guide plate 90219 to overlap non-light entering adjacent end surfaces 90219*d*2 with respect to the X-axis direction. Sealing portions 90231 at the sealing member disposed end portions 90220EP1 of the main wavelength converting members 90220 partially overlap LEDs 90217 (end light sources) located at ends with respect to the X-axis direction in the backlight unit 90212. Bottoms 90230*a* of containers 90230 included in the sealing member non-disposed end portions 90220EP2 of the main wavelength converting members 90220 do not overlap LEDs 90217 in the middle with respect to the X-axis direction (middle light sources) in the backlight unit 90212. Two LED boards 90218 are disposed adjacent to each other along the length direction of the light entering end surface 90219*b* similar to the wavelength converting members 90220. Each LED board 90218 has a length about equal to the length of each main wavelength converting member 90220. The LED boards 90218 are opposed to the main wavelength converting members 90220, respectively. The light rays emitted by the LEDs 90217 mounted on the respective LED boards 90218 enter the main wavelength converting members 90220 that are opposed to the LED boards 90218.

Sub wavelength converting members 90232 are disposed on non-light entering adjacent end surfaces 90219*d*2 of the light guide plate 90219. The non-light entering adjacent end surfaces 90219*d*2 overlap the sealing member disposed end portions 90220EP1 with respect to the X-axis direction. The sealing member disposed end portions 90220EP1 are end portions 90220EP of the main wavelength converting members 90220 which are not adjacent to each other. Two sub wavelength converting members 90232 are disposed over the non-light entering adjacent end surfaces 90219*d*2 on the outer side, respectively, similar to the ninth embodiment. The sub wavelength converting members 90232 have the configuration similar to those of the eighth and the ninth embodiments. The sub wavelength converting members 90232 are disposed to cover entire areas of the non-light entering adjacent end surfaces 90219*d*2. In this embodiment, the sub wavelength converting members 90232 are made of the same material with the equal contents or the equal concentration of the phosphors. End surface reflection members 90234 are disposed over the outer surfaces of the sub wavelength converting members 90232. The sealing members 9031 are regions of the main wavelength converting members 90220 in which the phosphor containing members 90229 are not disposed at ends of the light entering end surface 90219*b* of the light guide plate 90219 in the length direction. Even if the sealing members 90231 and the LEDs 90217 at the ends (a pair of end light sources) have a positional relationship to overlap each other due to a decrease in frame size of the backlight unit 90212, the blue light rays that have passed through the sealing members 90231, entered the light guide plate 90219 through the light entering end surface 90291*b* without the wavelength conversion, and reached the non-light entering adjacent end surfaces 90219*d*2 are converted into the green light rays and the red light rays by the sub wavelength converting members 90232 disposed on the non-light entering adjacent end surfaces 90219*d*2. According to the configuration, the color unevenness is less likely to occur even if the frame size is reduced. The light rays that have passed through the sub wavelength converting members 90232 are reflected by the end surface reflection members 90234 to the light guide plate 90219. Therefore, high light use efficiency can be achieved.

<Eleventh Embodiment>

An eleventh embodiment of the present invention will be described with reference to FIGS. 40 and 41. The eleventh embodiment includes a light exiting plate surface sub wavelength converting member 9036 and a light exiting plate surface reflection member 9037 in addition to the configuration of the tenth embodiment. Configurations, functions, and effects similar to those of the tenth embodiment will not be described.

Figure 40:
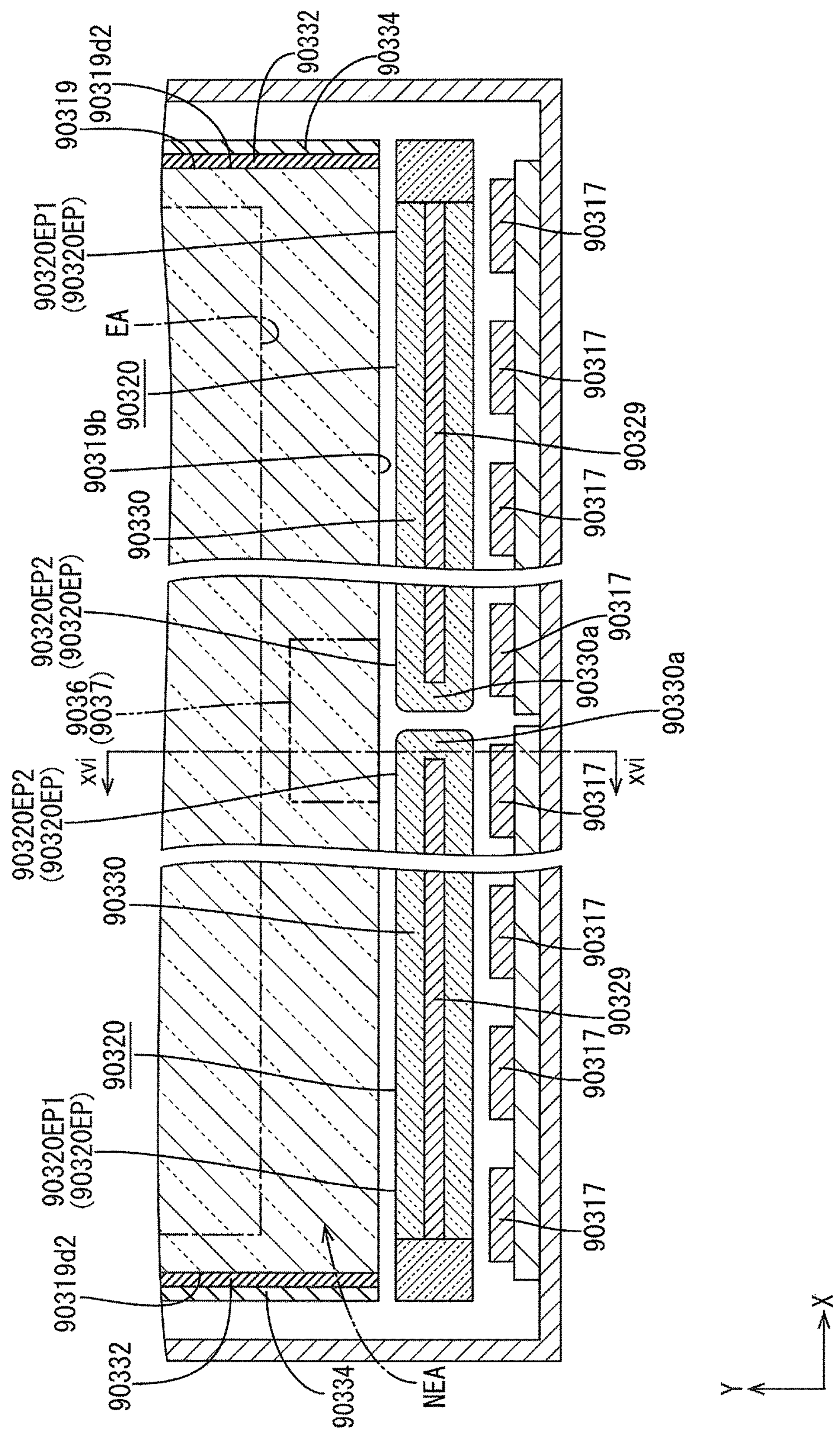
FIG. 40 is a magnified cross-sectional plan view of a backlight unit according to an eleventh embodiment of the present invention.

As illustrated in FIG. 40, among LEDs 90317 in this embodiment, two LEDs 90317 (middle light sources) in the middle of an arrangement direction of the LEDs 90317 (the X-axis direction) are opposed to sealing member non-disposed end portions 90320EP2 that are end portions 90320EP of two main wavelength converting members 90320. The end portions 90320EP are adjacent to each other. Two LEDs 90317 disposed in the middle are disposed to overlap bottoms 90330*a* of containers 90330 with respect to the X-axis direction, respectively. The bottom 90330*a* are regions of the sealing member non-disposed end portions 90320EP2 of the main wavelength converting members 90320 in which phosphor containing members 90329 are not disposed. Two LEDs 90317 are disposed at ends of two LED boards 90318 adjacent to each other to be opposed to the sealing member non-disposed end portions 90320EP2.

Figure 41:
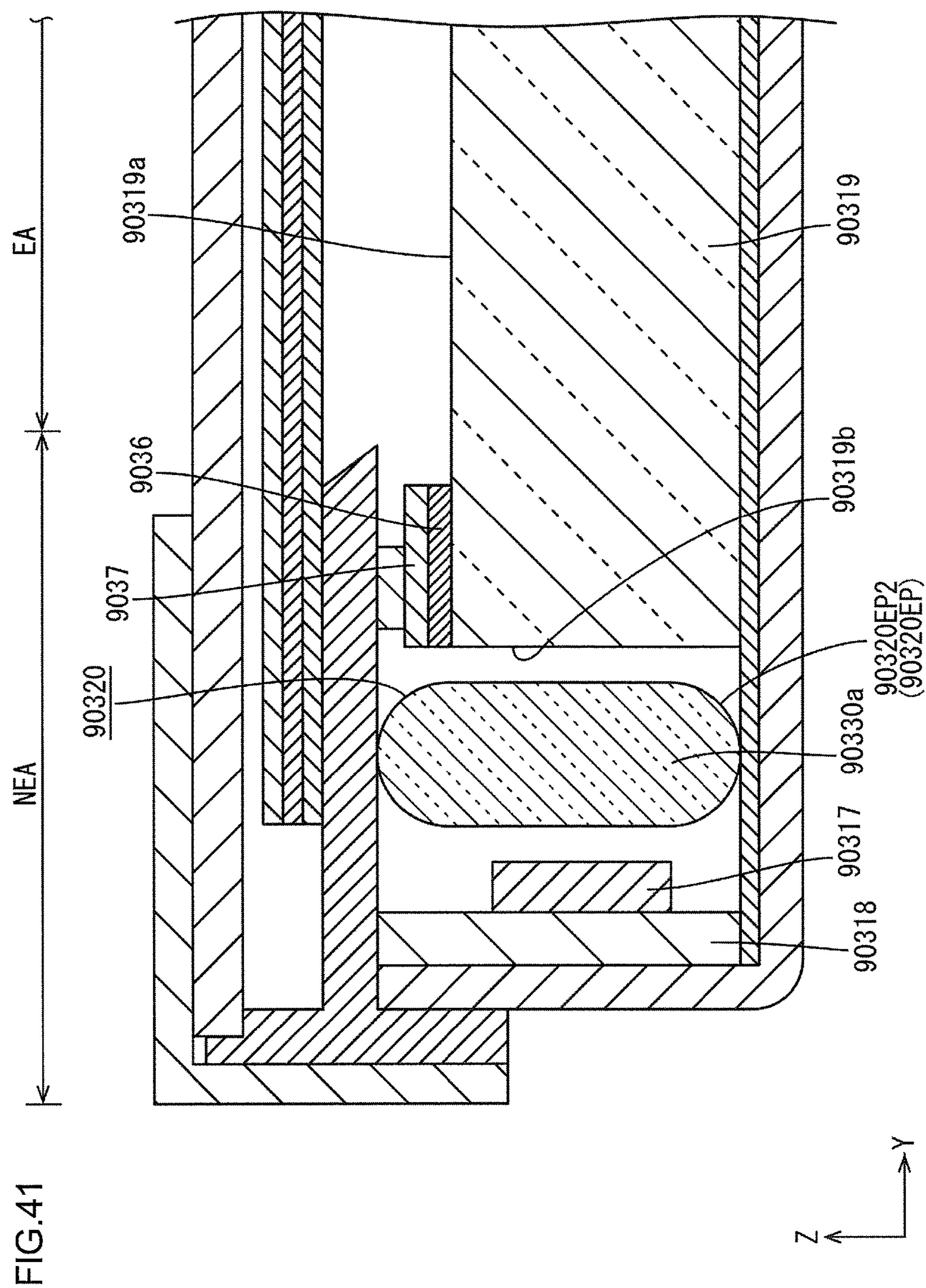
FIG. 41 is a cross-sectional view along line xvi-xvi in FIG. 39.

In such an arrangement, the light exiting plate surface sub wavelength converting member 9036 is disposed on a light exiting plate surface 90319*a* of a light guide plate 90319 as illustrated in FIGS. 40 and 41. The light exiting plate surface sub wavelength converting member 9036 has a forming area that overlaps an area across a gap between the sealing member non-disposed end portions 90320EP2 of the main wavelength converting members 90320 with respect to the X-axis direction. The light exiting plate surface sub wavelength converting member 9036 has a configuration similar to the configuration of sub wavelength converting members 90332 disposed over the non-light entering adjacent end surfaces 90319*d*2 of the light guide plate 90319. Namely, the light exiting plate surface sub wavelength converting member 9036 includes green phosphors that emit green light rays and red phosphors that emit red light rays when excited by blue light rays. The green phosphors and the red phosphors are quantum dot phosphors. In FIG. 40, the forming area of the light exiting plate surface sub wavelength converting member 9036 (the light exiting plate surface reflection member 9037) is indicated by a two-dot chain line.

Specifically, as illustrated in FIG. 40, the light exiting plate surface sub wavelength converting member 9036 is disposed in the middle of the light exiting plate surface 90319*a* with respect to the X-axis direction. The forming area with respect to the X-axis direction overlaps the area with respect to the X-axis direction from the sealing member non-disposed end portion 90320EP2 of a first main wavelength converting member 90320 to the sealing member non-disposed end portion 90320EP2 of a second main wavelength converting member 90320. The light exiting plate surface sub wavelength converting member 9036 has a horizontally-long rectangular shape in a plan view. A long dimension (a dimension in the X-axis direction) of the light exiting plate surface sub wavelength converting member 9036 is about equal to a sum of dimensions of the sealing member non-disposed end portions 90320EP2 in the X-axis direction and the gap between the adjacent sealing member non-disposed end portions 90320EP2. According to the configuration, the light rays that have passed through the sealing member non-disposed end portions 90320EP2 of the main wavelength converting members 90320, entered the light guide plate 90319 through a light entering end surface 90319*b*, and reached the light exiting plate surface 90319*a* are more likely to pass through the light exiting plate surface sub wavelength converting member 9036. Even if the blue light rays without the wavelength conversion by the phosphors are included in the light rays that have passed through the sealing member non-disposed end portions 90320EP2 of the wavelength converting members 90320, the blue light rays that have reached the light exiting plate surface 90319*a* are wavelength converted by the light exiting plate surface sub wavelength converting member 9036. Therefore, the occurrence of the color unevenness is properly reduced.

As illustrated in FIG. 41, the light exiting plate surface reflection member 9037 is disposed over the light exiting plate surface sub wavelength converting member 9036 on the front side (an outer side, an opposite side from the light guide plate 90319 side). The light exiting plate surface reflection member 9037 reflects the light rays that have passed through the light exiting plate surface sub wavelength converting member 9036. The light exiting plate surface reflection member 9037 is made of the same material as an end surface reflection member 90334, that is, the synthetic resin with the white surface having high light reflectivity (e.g., formed PET). The light exiting plate surface reflection member 9037 is disposed to cover an entire area of the light exiting plate surface sub wavelength converting member 9036 from the front side. As illustrated in FIG. 40, the light exiting plate surface sub wavelength converting member 9036 and the light exiting plate surface reflection member 9037 on top of each other are disposed in a non-effective emission area NEA when the light exiting plate surface 90319*a* of the light guide plate 90319 is divided into an effective emission area EA and the non-effective emission area NEA. The light rays exiting from the effective emission area EA are effectively used. The non-effective emission area NEA surrounds the effective emission area EA. In FIG. 40, a rectangle indicated by a chain line indicates an outline of the effective emission area EA and an area outside the chain line is the non-effective emission area NEA. The light rays that have passed through the sealing member non-disposed end portions 90320EP2 of the main wavelength converting members 90320, entered the light guide plate 90319 through the light entering end surface 90319*b*, and reached the light exiting plate surface 90319*a* are reflected by the light exiting plate surface reflection member 9037 after passing through the light exiting plate surface sub wavelength converting member 9036 and returned to the light guide plate 90319. According to the configuration, the light rays obtained through the wavelength conversion by the light exiting plate surface sub wavelength converting member 9036 are less likely to exit to the outside through the light exiting plate surface 90319*a*. The light rays exit through the light exiting plate surface 90319*a* after returned to the light guide plate 90319. Therefore, efficiency in use of the light rays obtained through the wavelength conversion by the light exiting plate surface sub wavelength converting member 9036. Furthermore, the light exiting plate surface sub wavelength converting member 9036 and the light exiting plate surface reflection member 9037 are disposed in the non-effective emission area NEA of the light exiting plate surface 90319*a*. The light rays exiting from the effective emission area EA are less likely to be blocked by the light exiting plate surface reflection member 9037.

As described above, in this embodiment, the main wavelength converting members 90320 are disposed in line in the length direction and the light exiting plate surface sub wavelength converting member 9036 (the sub wavelength converting member) is disposed to overlap the light exiting plate surface 90319*a* of the light guide plate 90319. The forming area of the light exiting plate surface sub wavelength converting member 9036 with respect to the length direction overlaps the area across the gap between the adjacent sealing member non-disposed end portions 90320EP2 of the end portions 90320EP of the main wavelength converting members 90320. The light rays that have passed through the sealing member non-disposed end portions 90320EP2 that are the end portions 90320EP of the main wavelength converting members 90320 adjacent to each other disposed in line along the length direction of the light entering end surface 90310*b* of the light guide plate 90319 pass through the light exiting plate surface sub wavelength converting member 9036 having the forming area with respect to the length direction of the light exiting plate surface 90319*a* overlapping the area across the gap between the sealing member non-disposed end portions 90320EP2 that are the end portions 90320EP of the main wavelength converting members 90320 adjacent to each other after entering through the light entering end surface 90319*b* and reaching the light exiting plate surface 90319*a*. Even if the light rays without the wavelength conversion by the phosphors are included in the light rays that have passed through the sealing member non-disposed end portions 90320EP2 that are the end portions 90320EP of the main wavelength converting members 90320 adjacent to each other, the light rays are wavelength converted by the light exiting plate surface sub wavelength converting member 9036 when they reach the light exiting plate surface 90319*a*. Therefore, the occurrence of the color unevenness can be properly reduced.

<Twelfth Embodiment>

A twelfth embodiment of the present invention will be described with reference to FIG. 12. The twelfth embodiment includes a reflection sheet 90425 and an end surface reflection member 90434 that are integrated, which is different from the eighth embodiment. Configuration, function, and effects similar to those of the eighth embodiment will not be described.

Figure 42:
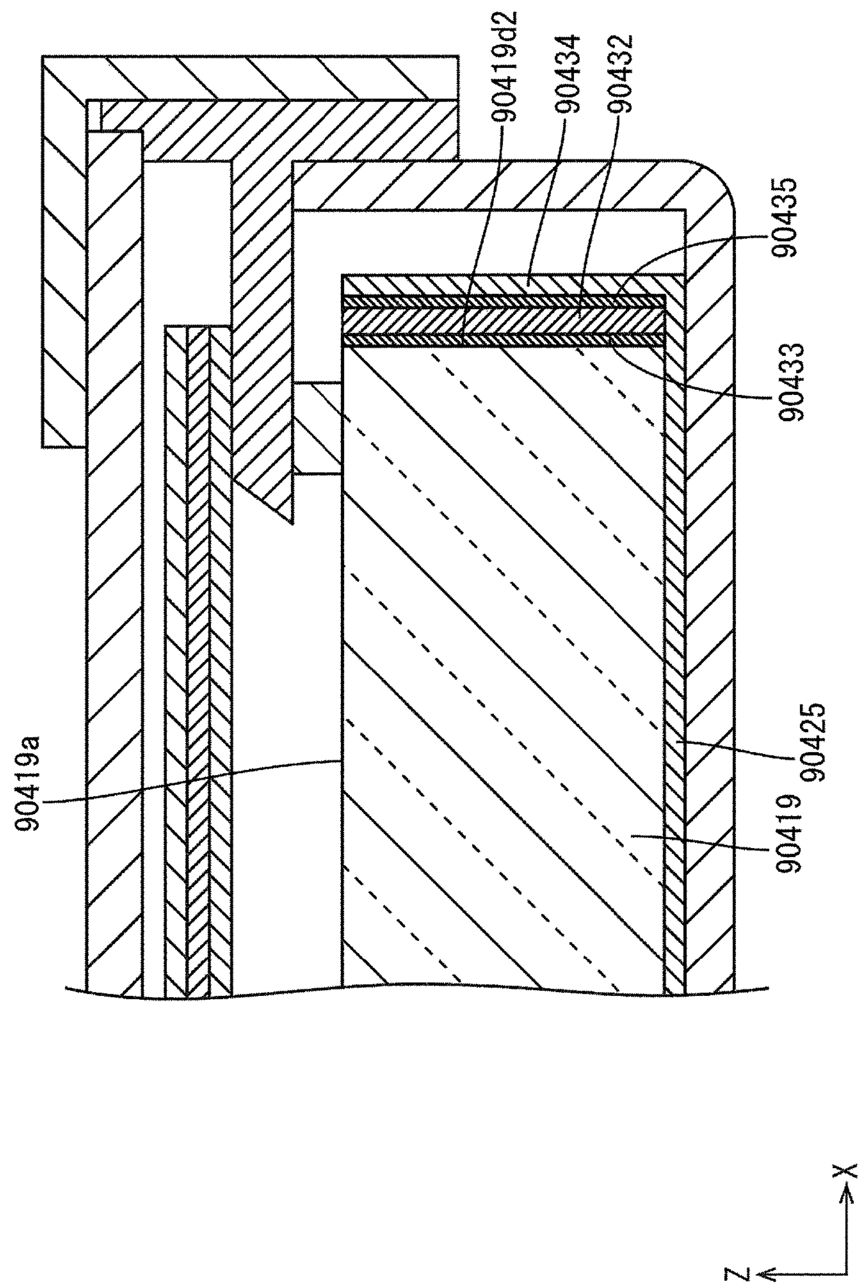
FIG. 42 is a magnified cross-sectional plan view of a backlight unit according to a twelfth embodiment of the present invention.

As illustrated in FIG. 42, the end surface reflection member 90434 is integrally formed with the reflection sheet 90425 in this embodiment. Namely, the end surface reflection member 90434 projects from an outer edge of the reflection sheet 90425 at substantially right angle toward the front side. The end surface reflection member 90434 is disposed over a sub wavelength converting member 90432 on the outer side (an opposite side from a non-light entering adjacent end surface 90419*d*2). The sub wavelength converting member 90432 is disposed over the non-light entering adjacent end surface 90419*d*2. When the reflection sheet 90425 is deployed (before the end surface reflection member 90434 is bent), a portion extends from the reflection sheet 90425 outer than the non-light entering adjacent end surface 90419*d*2 of a light guide plate 90419. This portion is defined as the end surface reflection member 90434. According to the configuration, the end surface reflection member 90434 and the reflection sheet 90425 can be provided as a single component. Therefore, the number of parts can be reduced. Furthermore, a gap is less likely to be provided between the end surface reflection member 90434 and the reflection sheet 90425. Therefore, the light rays are less likely to leak from the light guide plate 90419. The sub wavelength converting member 90432 is bonded to the end surface reflection member 90434 (the portion extending from the reflection sheet 90425) via an end surface reflection member-side adhesive layer 90435 and to the non-light entering adjacent end surface 90419*d*2 of the light guide plate 90419 via a light guide plate adhesive layer 90433.

As described above, this embodiment includes the reflection sheet 90425 (the reflection member) opposed to the plate surface of the light guide plate 90419 on an opposite side from a light exiting plate surface 90419*a* side and configured to reflect light rays. The end surface reflection member 90434 is integrally formed with the reflection sheet 90425. Because the end surface reflection member 90434 and the reflection sheet 90425 are provided as a single component, the number of parts can be reduced and the gap is less likely to be created between the end surface reflection member 90434 and the reflection sheet 90425 and thus the light rays are less likely to leak from the light guide plate 90419.

<Thirteenth Embodiment>

A thirteenth embodiment of the present invention will be described with reference to FIG. 43. The thirteenth embodiment includes a sub wavelength converting member 90532, which is different from the twelfth embodiment. Configurations, function, and effects similar to the twelfth embodiment will not be described.

Figure 43:
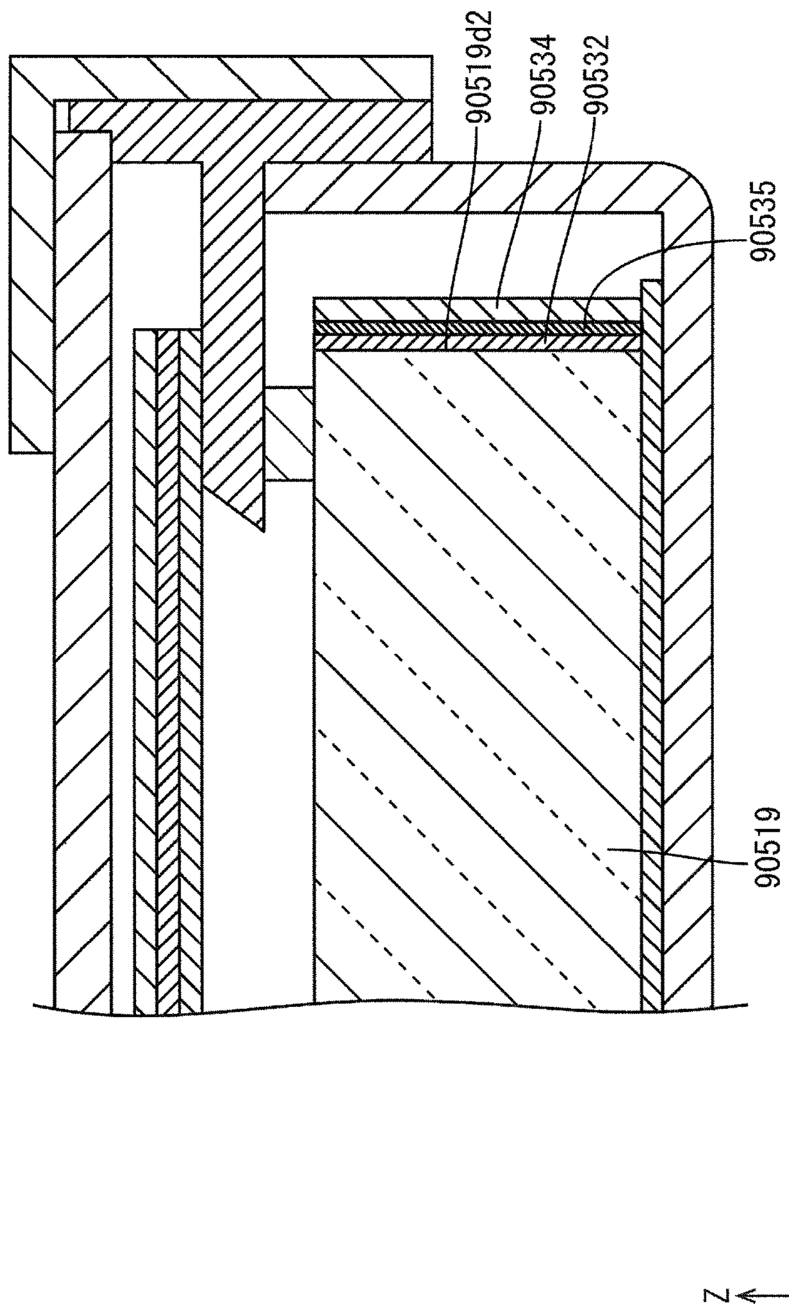
FIG. 43 is a magnified cross-sectional plan view of a backlight unit according to a thirteenth embodiment of the present invention.

As illustrated in FIG. 43, the sub wavelength converting member 90532 in this embodiment is directly applied to a non-light entering adjacent end surface 90519*d*2 of a light guide plate 90519 such that the sub wavelength converting member 90532 is integrally formed with the light guide plate 90519. The sub wavelength converting member 90532 is formed from phosphor paint (phosphor dispersion) including red phosphors and green phosphors dispersed in a binder. The red phosphors emit red light rays when excited by light rays in a single color of blue from the LEDs that are not illustrated. The green phosphors emit green light rays when excited by the blue light. Specifically, the phosphor paint is applied to a surface of the non-light entering adjacent end surface 90519*d*2 of the light guide plate 90519 with a substantially even film thickness. The sub wavelength converting member 90532 is integrally provided with the non-light entering adjacent end surface 90519*d*2 of the light guide plate 90519 without an interface such as light guide plate-side adhesive layer 9033 in the eighth embodiment (see FIG. 36) and the air layer. The sub wavelength converting member 90532 is bonded to an end surface reflection member 90534 via an end surface reflection member-side adhesive layer 90535. The following phosphors may be preferable for the phosphors contained in the phosphor paint of the sub wavelength converting member 90532.

<Fourteenth Embodiment>

A fourteenth embodiment will be described with reference to FIG. 44. The fourteenth embodiment includes a sub wavelength converting member 90632 arranged differently from the thirteenth embodiment. Configurations, functions, and effects similar to those of the thirteenth embodiment will not be described.

Figure 44:
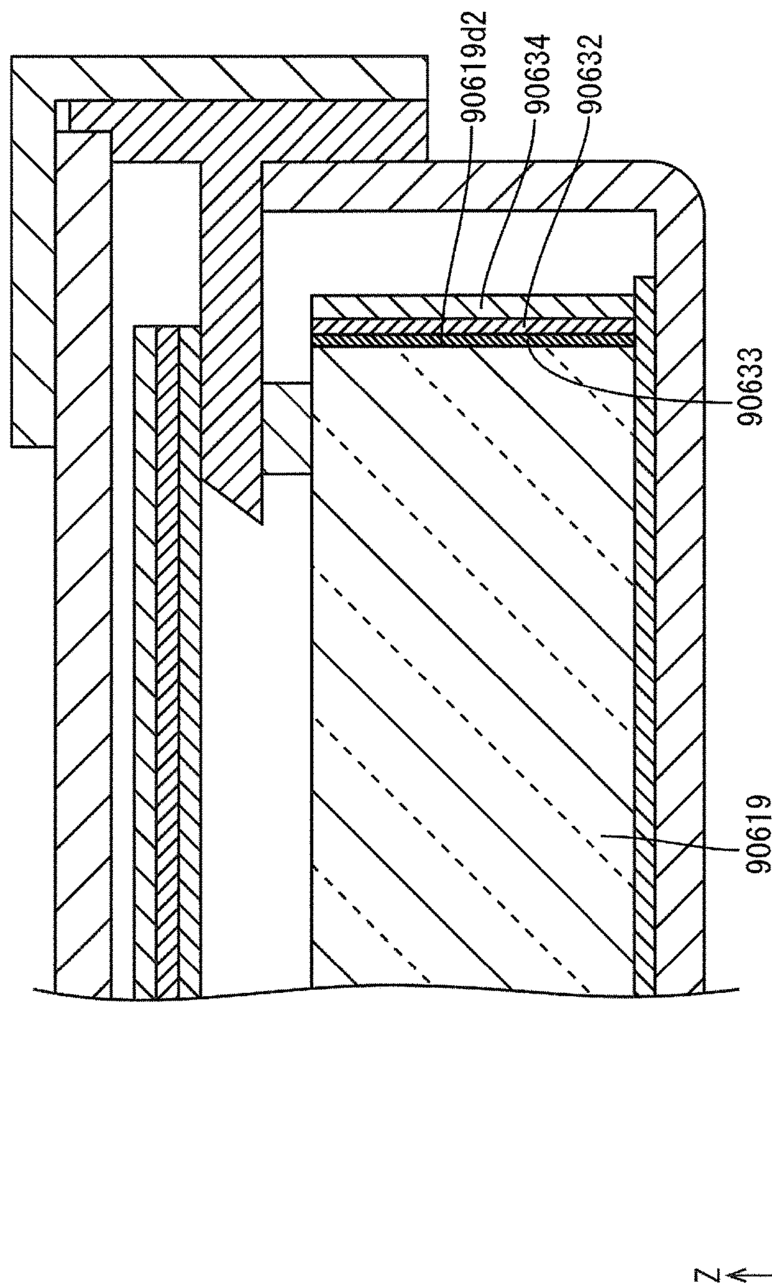
FIG. 44 is a magnified cross-sectional plan view of a backlight unit according to a fourteenth embodiment of the present invention.

As illustrated in FIG. 44, the sub wavelength converting member 90632 is integrally formed with an end surface reflection member 90634 by directly applying the sub wavelength converting member 90632 to the end surface reflection member 90634. Specifically, the phosphor paint of the sub wavelength converting member 90632 is applied to the surface of the end surface reflection member 90634 with a substantially even film thickness such that the sub wavelength converting member 90632 and the end surface reflection member 90634 are integrally provided without an interface such as the end surface reflection member-side adhesive layer 9035 in the eighth embodiment (see FIG. 36) and the air layer. The sub wavelength converting member 90632 is bonded to a non-light entering adjacent end surface 90619*d*2 of a light guide plate 90619 via a light guide plate adhesive layer 90633. According to the configuration, the sub wavelength converting member 90632 can be easily prepared in comparison to the thirteenth embodiment.

<Fifteenth Embodiment>

Figure 45:
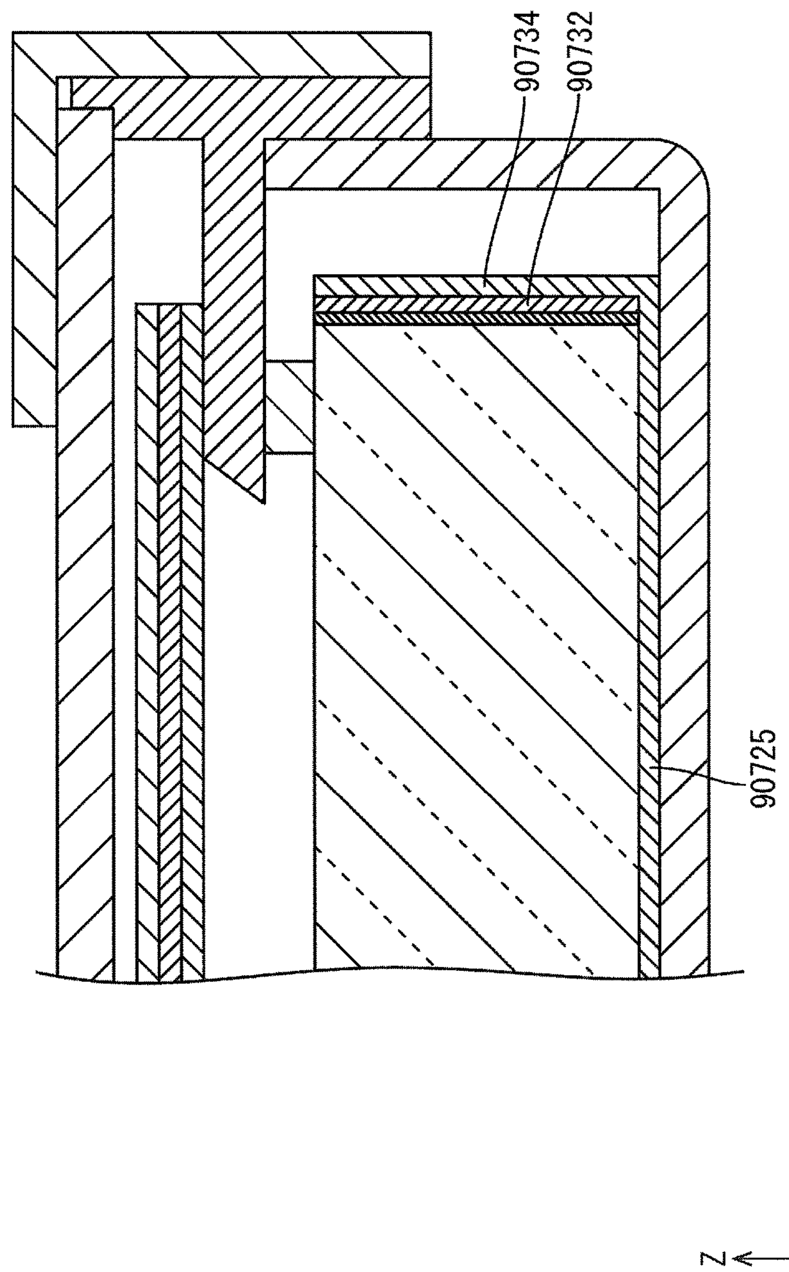
FIG. 45 is a magnified cross-sectional plan view of a backlight unit according to a fifteenth embodiment of the present invention.

A fifteenth embodiment of the present invention will be described with reference to FIG. 45. The fifteenth embodiment has a configuration that is a combination of the twelfth embodiment and the fourteenth embodiment. Configurations, functions, and effects similar to those of the twelfth embodiment and the fourteenth embodiment will not be described. As illustrated in FIG. 45, an end surface reflection member 90734 in this embodiment is integrally formed with a reflection sheet 90725. Furthermore, a sub wavelength converting member 90732 is directly applied to a surface of the reflection sheet 90725 to integrally form the sub wavelength converting member 90732 with the reflection sheet 90725.

<Sixteenth Embodiment>

Figure 46:
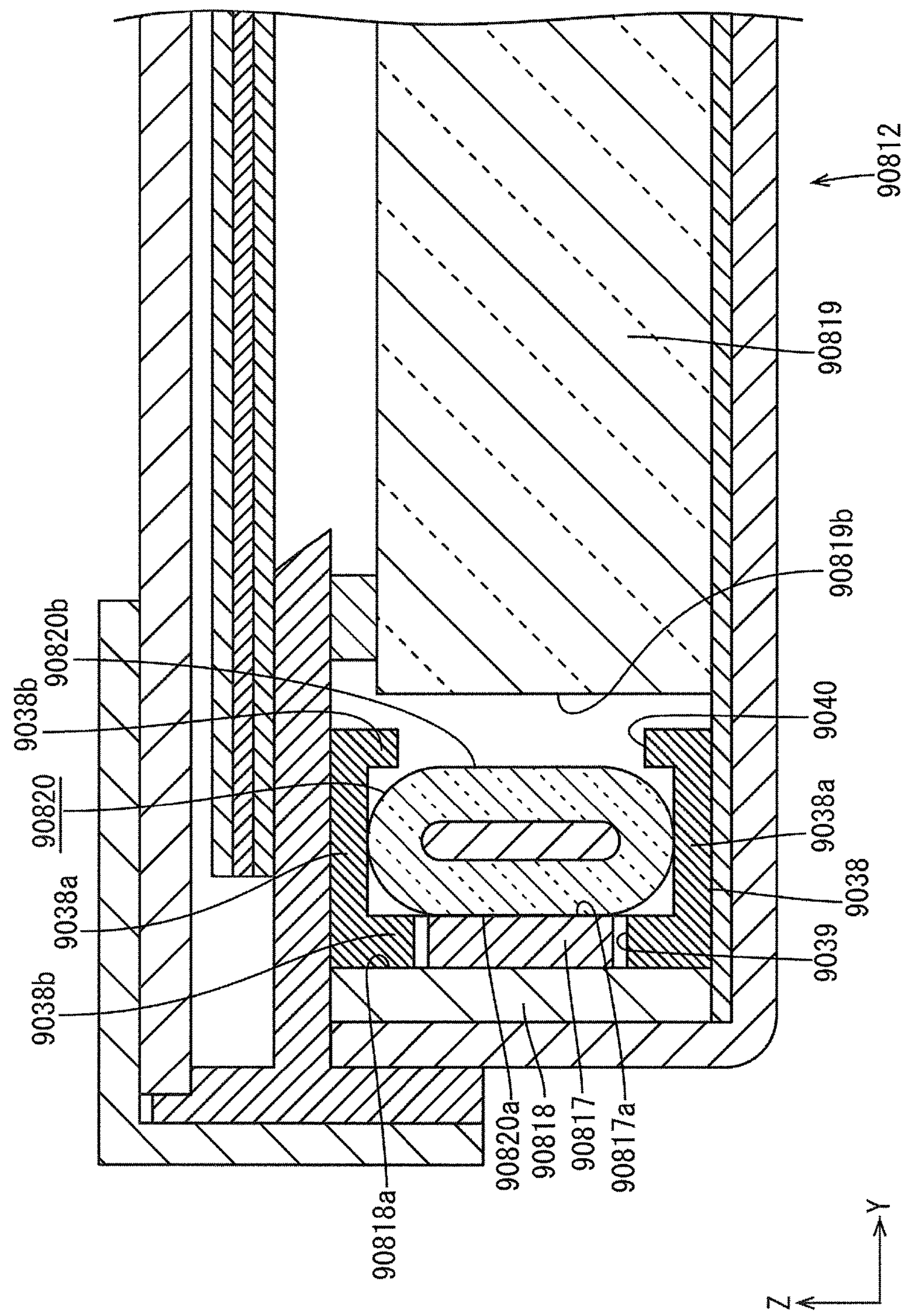
FIG. 46 is a magnified cross-sectional plan view of a backlight unit according to a sixteenth embodiment of the present invention.

A sixteenth embodiment of the present embodiment will be described with reference to FIGS. 46 to 48. The sixteenth embodiment includes a holding structure of a main wavelength converting member 90820 in addition to the configuration of the eighth embodiment. Configurations, functions, and effects similar to those of the eighth embodiment will not be described. As illustrated in FIG. 46, the main wavelength converting member 90820 in this embodiment is held by a holder 9038 at a position between LEDs 90817 and a light entering end surface 90819*b* of a light guide plate 90819 in a backlight unit 90812. The holder 9038 is made of white synthetic resin having high light reflectivity. The holder 9038 has a tubular shape to surround and hold the main wavelength converting member 90820 for a substantially entire length of the main wavelength converting member 90820. The holder 9038 includes a pair of first walls 9038*a* and a pair of second walls 9038*b*. The first walls 9038*a* sandwich the main wavelength converting member 90820 in the Z-axis direction, that is, from the upper side and the lower side in FIG. 46. The second walls 9038*b* sandwich the main wavelength converting member 90820 in the Y-axis direction, that is, from the right side and the left side in FIG. 46 (form the front side and the rear side). The walls 9038*a* and 9038*b* surround and hold the main wavelength converting member 90820 for the substantially entire length of the main wavelength converting member 90820.

Figure 47:
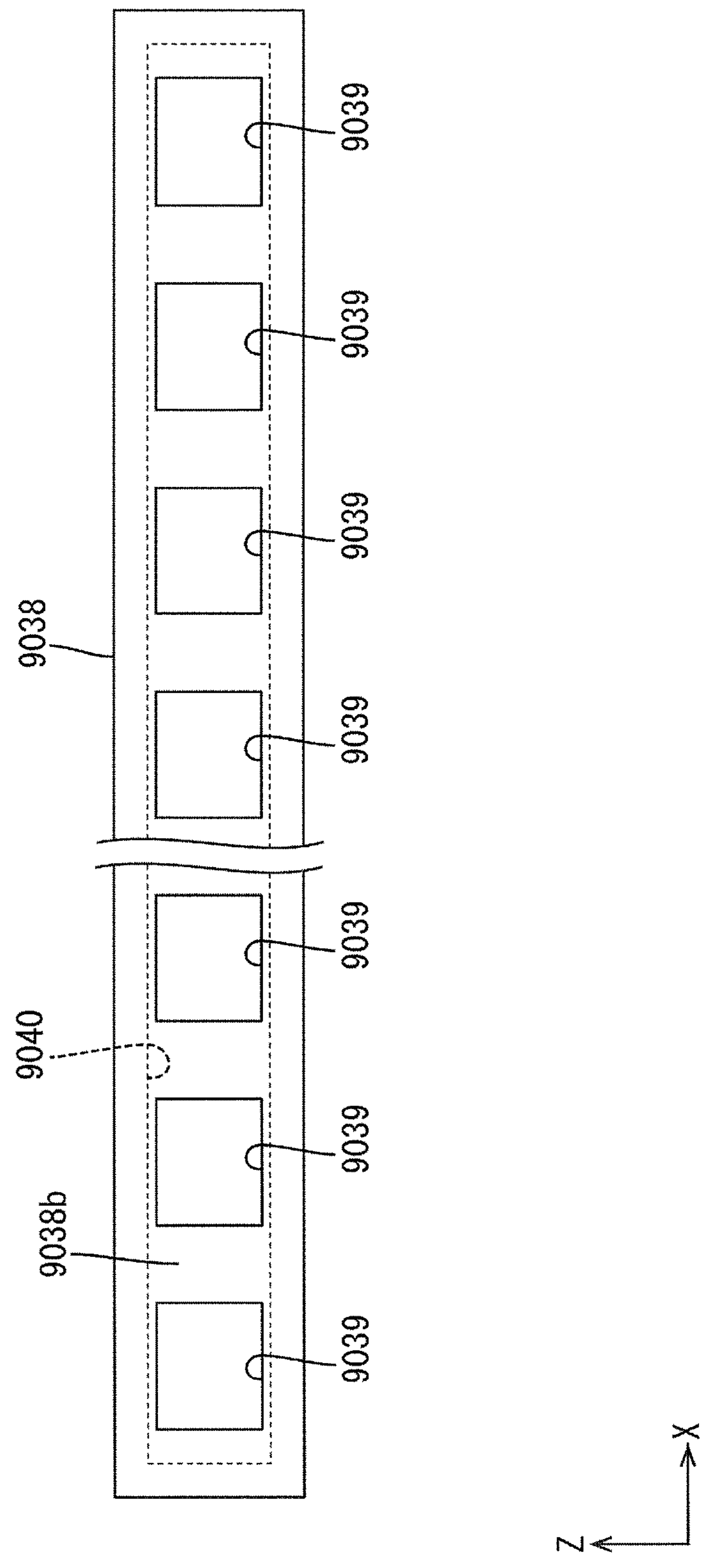
FIG. 47 is a plan view of a holder.

As illustrated in FIGS. 46 and 47, one of the second walls 9038*b* of the holder 9038 on the left side in FIG. 46 (on a LED board 90818 side) includes LED holding holes 9039 for holding the LEDs 90817. The LED holding holes 9039 are independent holes formed in the second wall 9038*b* for individually holding LEDs 90817 mounted on an LED board 90818. The LED holding holes 9039 (in the same number as the LEDS 90817) are arranged along the X-axis direction in the second wall 9038*b* at intervals equal to intervals of the LEDs 90817 on the LED board 90818. An outer surface of the second wall 9038*b* in which the LED holding holes 9039 are formed is in contact with a mounting surface 90818*a* of the LED board 90818 and fixed. The LEDs 90817 held in the LED holding holes 9039 are held such that light emitting surfaces 90817*a* thereof are almost in contact with a light entering surface 90820*a* of the main wavelength converting member 90820. According to the configuration, light rays emitted by the LEDs 90817 through the light emitting surfaces 90817*a* are efficiently directed to the main wavelength converting member 90820 through the light entering surface 90820*a*.

Figure 48:
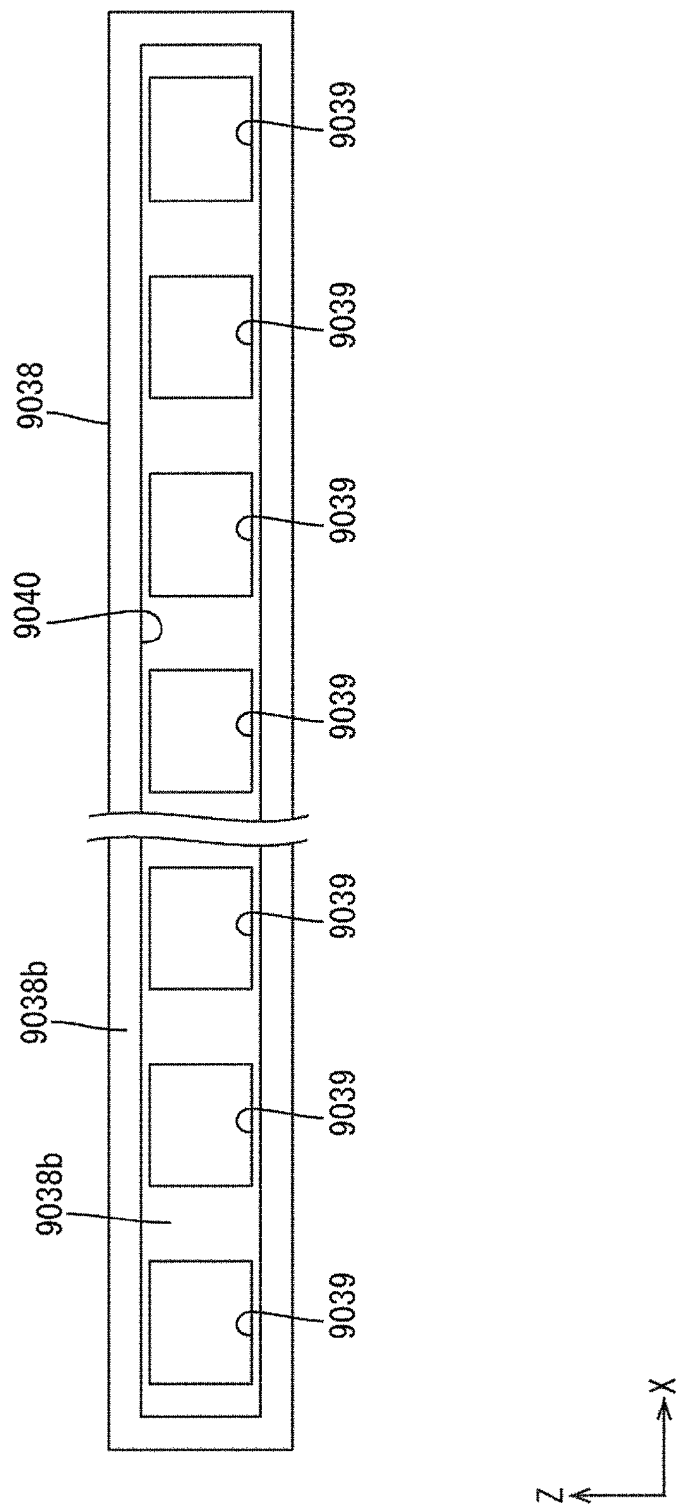
FIG. 48 is a rear view of the holder.

As illustrated in FIGS. 46 and 48, the other one of the second walls 9038*b* of the holder 9038 on the right side in FIG. 46 (on a light guide plate 9081 side) includes a light pass-through hole 9040. The light pass-through hole 9040 is passing light rays that have exited the main wavelength converting member 90820 through a light exiting surface 90820*b* to direct the light rays to the light entering end surface 90819*b* of the light guide plate 90819. The light pass-through hole 9040 formed in the second wall 9038*b* is an elongated hole that extends in the X-axis direction. A forming area is defined to cover forming areas of the entire LED holding holes 9039. According to the configuration, the light rays that have emitted by the LEDs 90817 and passed through the main wavelength converting member 90820 are efficiently directed to the light entering end surface 90819*b* of the light guide plate 90819. The second wall 9038*b* in which the light pass-through hole 9040 is formed is disposed such that the outer surface thereof is opposed to the light entering end surface 90819*b* with a predefined gap between the outer surface and the light entering end surface 90819*b* in the Y-axis direction. Therefore, if a temperature inside the backlight unit 90812 increases and the light guide plate 90819 is thermally expanded due to the increase in temperature, the light guide plate 90819 contacts the second wall 9038*b* in which the light pass-through hole 9040 is formed before contacting the main wavelength converting member 90820. Namely, a displacement of the light guide plate 90819 under the thermal expansion can be restricted by the second wall 9038*b* in which the light pass-through hole 9040 is formed. Therefore, a stress is less likely to be directly exerted on the main wavelength converting member 90820 and the LEDs 90817 by the light guide plate 90819.

<Seventeenth Embodiment>

A seventeenth embodiment of the present invention will be described with reference to FIG. 49. The seventeenth embodiment includes LEDs 90917, an LED board 90918, and a main wavelength converting member 90920 arranged differently from those of the eighth embodiment. Configuration, functions, and effects similar to those of the eighth embodiment will not be described.

Figure 49:
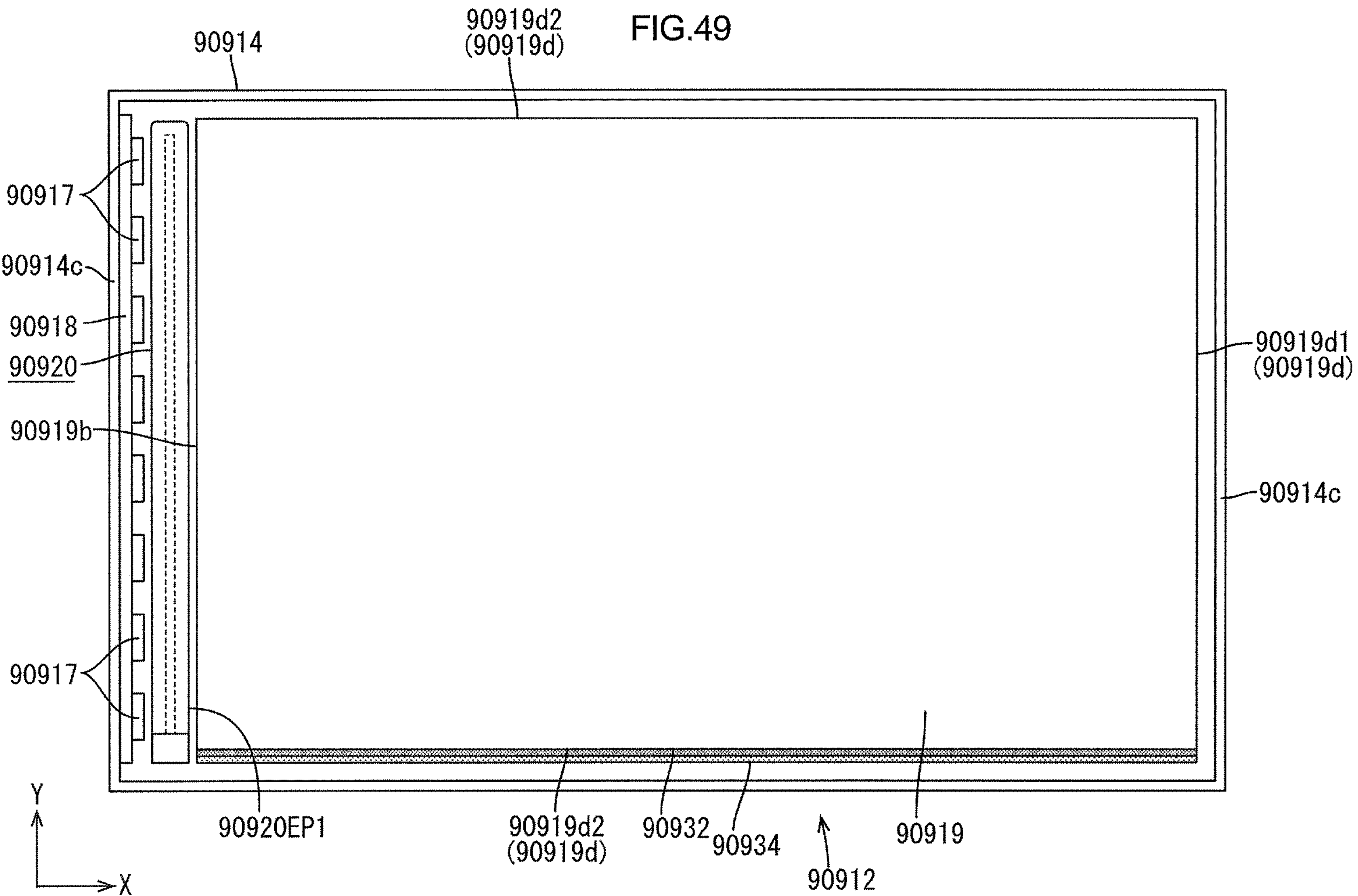
FIG. 49 is a cross-sectional plan view of a backlight unit according to a seventeenth embodiment of the present invention.

As illustrated in FIG. 49, in a backlight unit 90912 in this embodiment, the LEDs 90917, the LED board 90918, and the main wavelength converting member 90920 are disposed at an end of a chassis 90914 on one of short sides (on the left side in FIG. 49). Specifically, the LED board 90918 is attached to one of short side portions 90914*c* of the chassis 90914 (on the left side in FIG. 49). The LEDs 90917 mounted on the LED board 90918 and the main wavelength converting member 90920 are opposed to a first short end surfaces of peripheral end surfaces of a light guide plate 90919. The first short end surface of the peripheral end surfaces of the light guide plate 90919 is defined as a light entering end surface 90919*b* through which light rays from the LEDs 90917 and the main wavelength converting member enter. Other three end surfaces (a second short end surface and a pair of long end surfaces) are defined as non-light entering end surfaces 90919*d*. Among the non-light entering end surfaces 90919*d*, the second short end surface is defined as a non-light entering opposite end surface 90919*d*1 disposed on an opposite side from the light entering end surface 90919*b*. The long end surfaces are defined as non-light entering adjacent end surfaces 90919*d*2 adjacent to the light entering end surface 90919*b*.

A sub wavelength converting member 90932 and a end surface reflection member are disposed on one of the long end surfaces of the peripheral end surfaces of the light guide plate 90919, that is, on the non-light entering adjacent end surface 90919*d*2 that overlap a sealing member disposed end portion 90920EP1 of the main wavelength converting member 90920 with respect to the Y-axis direction (a length direction of the light entering end surface 90919*b*). This configuration can also enable the functions and produce the effects similar to those of the eighth embodiment.

<Eighteenth Embodiment>

An eighteenth embodiment of the present invention will be described with reference to FIG. 50. The eighteenth embodiment includes a double-side light entering type backlight unit 901012, which is different from the eighth embodiment. Configuration, functions, and effects similar to those of the eighth embodiment will not be described.

Figure 50:
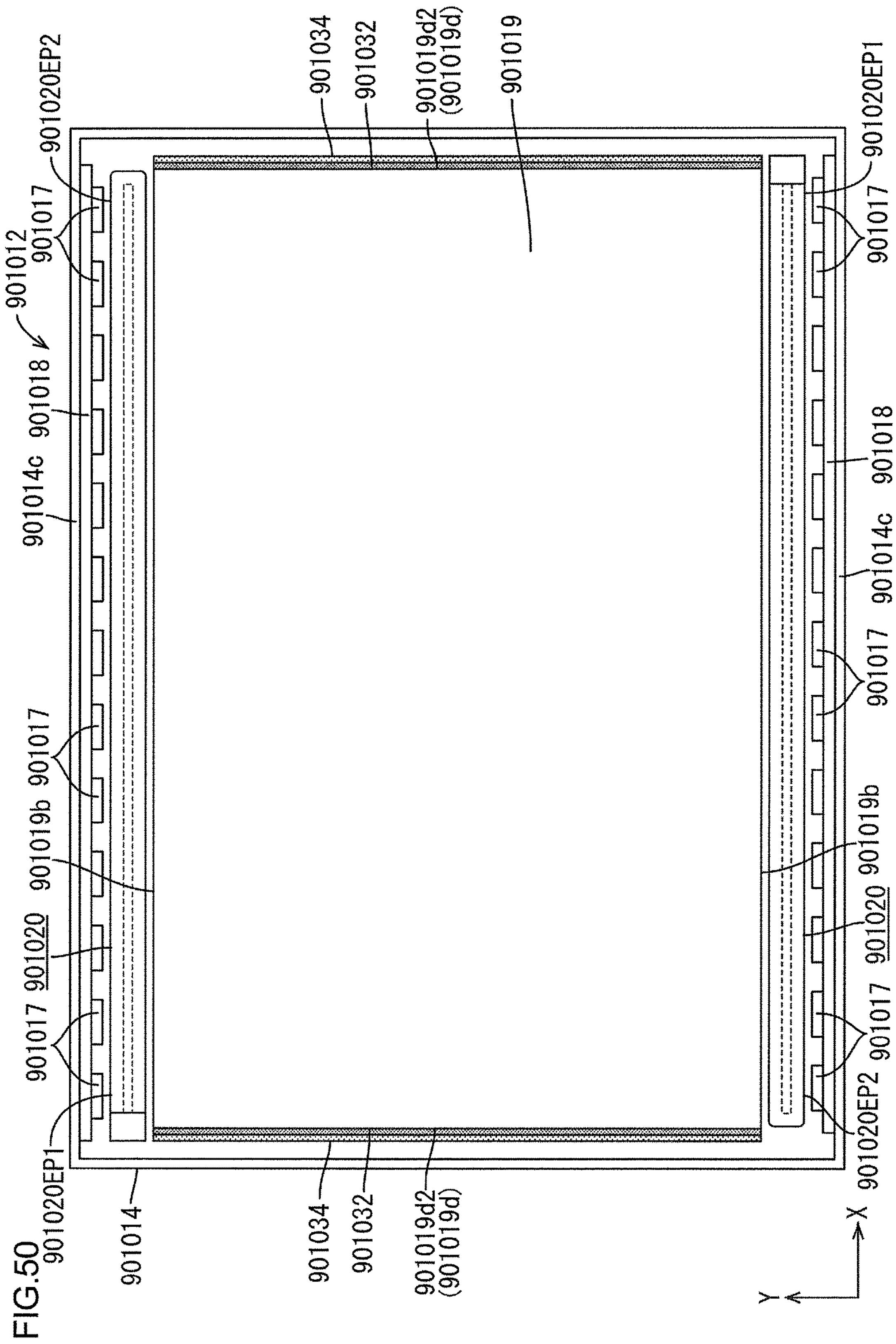
FIG. 50 is a cross-sectional plan view of a backlight unit according to an eighteenth embodiment of the present invention.

As illustrated in FIG. 50, in the backlight unit 901012 in this embodiment, LEDs 901017, LED boards 901018, and main wavelength converting members 901020 are disposed on long sides of a chassis 901014. Specifically, the LED boards 901018 are mounted to a first long side portion 901014*c* (on the lower side in FIG. 50) and to a second long side portion 901014*c* (on the upper side in FIG. 50) of the chassis 901014, respectively. The LEDs 901017 mounted on the LED boards 901018 and the main wavelength converting members 901020 are opposed to long end surfaces of peripheral end surfaces of a light guide plate 901019. In this embodiment, the long end surfaces of the peripheral end surfaces of the light guide plate 901019 are defined as light entering end surfaces 901019*b* through which light rays from the LEDs 901017 and the main wavelength converting members 901020 enter. Short end surfaces are defined as non-light entering end surfaces 901019*d*. The non-light entering end surfaces 901019*d* in this embodiment do not include the non-light entering opposite end surface 9019*d*1 as in the eighth embodiment (see FIG. 28). The non-light entering end surfaces 901019*d* include only a pair of non-light entering adjacent end surfaces 901019*d*2. In the backlight unit 901012 in this embodiment, the light guide plate 901019 is sandwiched between a set of the LED board 901018, the LEDs 901017, and the main wavelength converting member 901020 and a set of the LED board 901018, the LEDs 901017, and the main wavelength converting member 901020 from ends of the short dimension (the Y-axis direction). Namely, the backlight unit 901012 is a double-side light entering type backlight unit.

The main wavelength converting members 901020 include sealing member disposed end portions 901020EP1 that do not overlap each other with respect to the X-axis direction. The sealing member disposed end portion 901020EP1 of the first main wavelength converting member 901020 overlaps a sealing member non-disposed end portion 901020EP2 of the second main wavelength converting member 901020 with respect to the X-axis direction. The sealing member disposed end portion 901020EP1 of the second main wavelength converting member 901020 overlaps a sealing member non-disposed end portion 901020EP2 of the first main wavelength converting member 901020. Sub wavelength converting members 901032 and end surface reflection members 901034 are disposed on the non-light entering adjacent end surfaces 901019*d*2 that overlap the respective sealing member disposed end portions 901020EP1 of the main wavelength converting members 901020 with respect to the X-axis direction among the peripheral end surfaces of the light guide plate 901019. This configuration can also enable the functions and produce the effects similar to those of the eighth embodiment.

<Nineteenth Embodiment>

A nineteenth embodiment will be described with reference to FIG. 51. In the nineteenth embodiment, LEDs 901117, LED boards 901118, and main wavelength converting members 901120 arranged differently from the eighteenth embodiment. Configuration, functions, and effects similar to those of the eighteenth embodiment will not be described.

Figure 51:
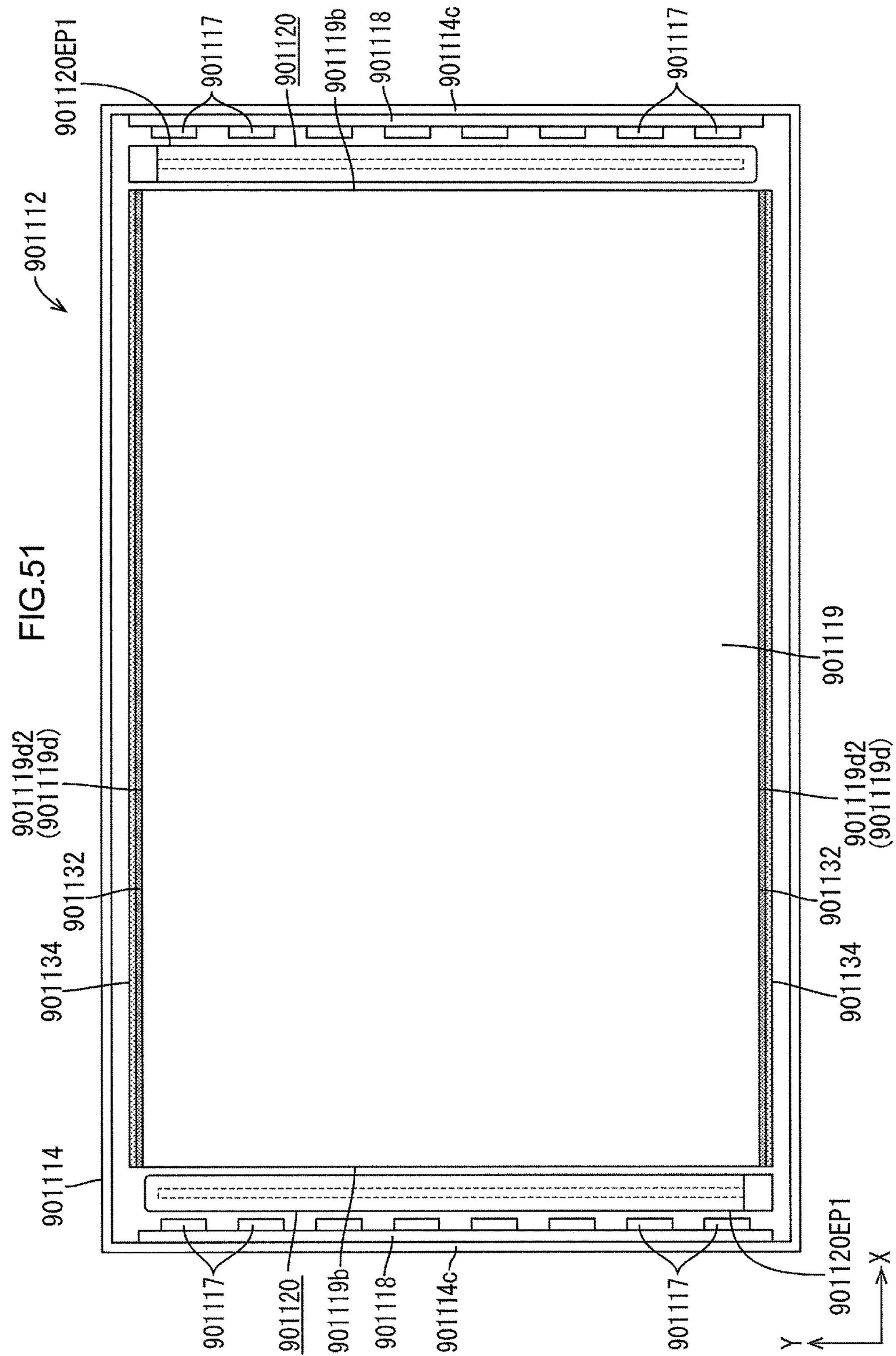
FIG. 51 is a cross-sectional plan view of a backlight unit according to a nineteenth embodiment of the present invention.

As illustrated in FIG. 51, in a backlight unit 901112 in this embodiment, LEDs 901117, LED boards 901118, and main wavelength converting members 901120 are disposed on short sides of a chassis 901114. Specifically, the LED boards 901118 are mounted to a first short side portion 901114*c* (on the left side in FIG. 51) and to a second short side portion 901114*c* (on the right side in FIG. 51) of the chassis 901114, respectively. The LEDs 901117 mounted on the LED boards 901118 and the main wavelength converting members 901120 are opposed to short end surfaces of peripheral end surfaces of a light guide plate 901119. In this embodiment, the short end surfaces of the peripheral end surfaces of the light guide plate 901119 are defined as light entering end surfaces 901119*b* through which light rays from the LEDs 901117 enter. Long end surfaces are defined as non-light entering end surfaces 901119*d* (non-light entering adjacent end surfaces 901119*d*2). In the backlight unit 901112 in this embodiment, the light guide plate 901119 is sandwiched between a set of the LED board 901118, the LEDs 901117, and the main wavelength converting member 901120 and a set of the LED board 901118, the LEDs 901117, and the main wavelength converting member 901120 from ends of the long dimension (the X-axis direction). Namely, the backlight unit 901112 is a double-side light entering type backlight unit.

The main wavelength converting members 901120 include sealing member disposed end portions 901120EP1 that do not overlap each other with respect to the Y-axis direction (a length direction of a light entering end surface 901119*b*). Sub wavelength converting members 901132 and end surface reflection members 901134 are disposed on the non-light entering adjacent end surfaces 901119*d*2 that overlap the respective sealing member disposed end portions 901120EP1 of the main wavelength converting members 901120 with respect to the Y-axis direction among the peripheral end surfaces of the light guide plate 901119. This configuration can also enable the functions and produce the effects similar to those of the eighth embodiment.

<Twentieth Embodiment>

A twentieth embodiment of the present invention will be described with reference to FIG. 52. The twentieth embodiment includes LEDs 901217, LED boards 901218, and main wavelength converting members 901220, the numbers of which are different from those of the eighteenth embodiment. Configurations, functions, and effects similar to those of the eighteenth embodiment will not be described.

Figure 52:
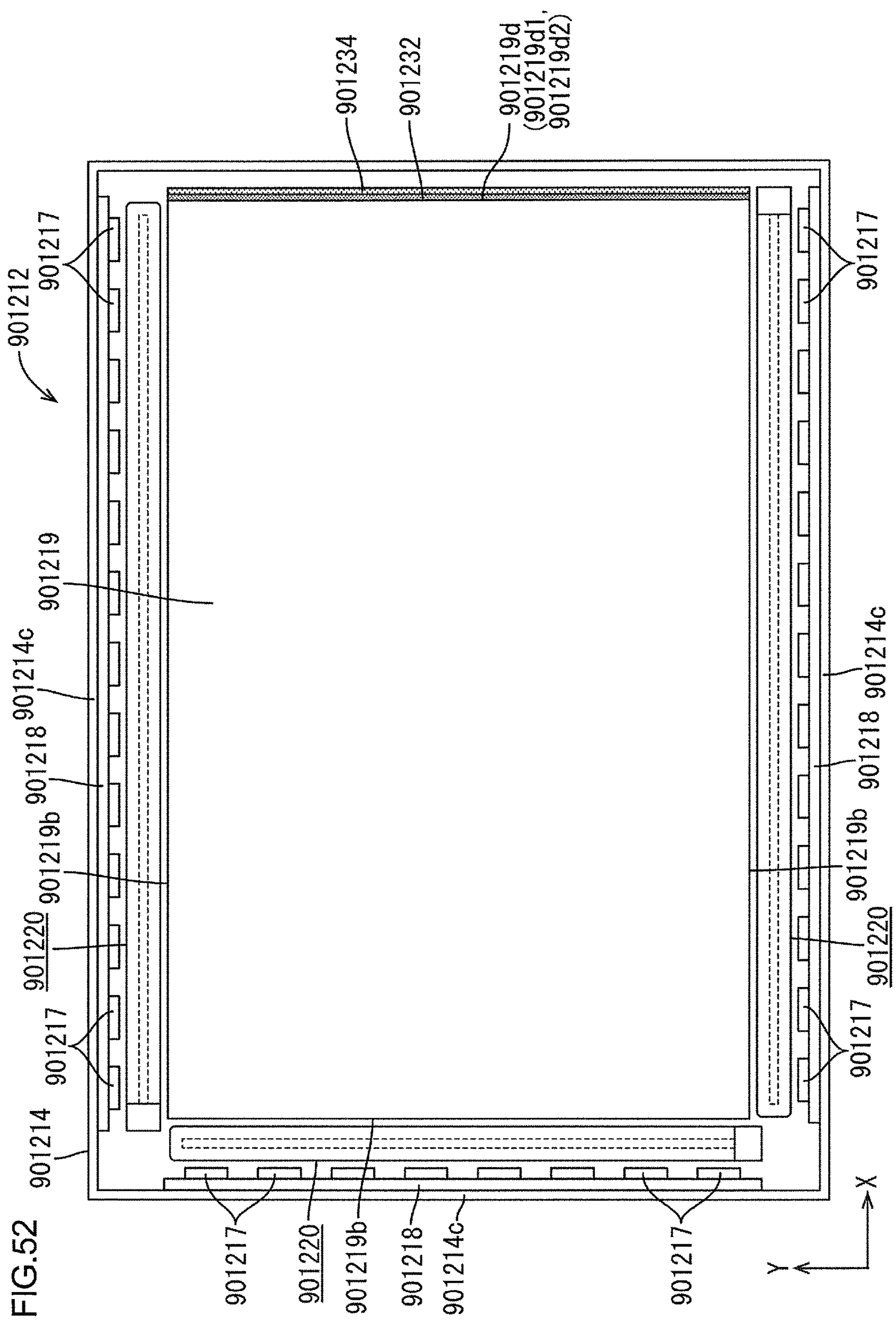
FIG. 52 is a cross-sectional plan view of a backlight unit according to a twentieth embodiment of the present invention.

As illustrated in FIG. 52, in a backlight unit 901212 in this embodiment, the LEDs 901217, the LED boards 901218, and the main wavelength converting members 901220 are disposed on long sides and a short side (on the left side in FIG. 52) of a chassis 901214. Specifically, the LED boards 901218 are mounted to a first long side portion 901214*c* (on the lower side in FIG. 52), a second long side portion 901214*c* (on the upper side in FIG. 52), a first short side portion 901214*c* of the chassis 901214. The LEDs 901217 mounted on the LED boards 901218 and the main wavelength converting members 901220 are opposed to long end surfaces and a first short end surface among peripheral end surfaces of the light guide plate 901219. The long end surfaces and the first short end surface among the peripheral end surfaces of the light guide plate 901219 are defined as light entering end surfaces 901219*b* through which light rays from the LEDs 901217 enter. A second short end surface is defined as a non-light entering end surface 901219*d*. The non-light entering end surface 901219*d* in this embodiment may be referred to as a non-light entering opposite end surface 901219*d*1 relative to the short light entering end surface 901219*b*. The non-light entering end surface 901219*d* may be referred to as a non-light entering adjacent end surface 901219*d*2 relative to the long light entering end surfaces 901219*b*. The backlight unit 901212 in this embodiment is a triple-side light entering type backlight unit in which light rays are emitted by the LEDs 901217 mounted on three LED boards 901218 disposed along three sides of the light guide plate 901219, respectively, and enter the light guide plate 901219. A sub wavelength converting members 901232 and end surface reflection members 901234 are disposed on the non-light entering end surfaces 901219*d* among the peripheral end surfaces of the light guide plate 901219. This configuration can also enable the functions and produce the effects similar to those of the eighth embodiment.

<Twenty-First Embodiment>

A twenty-first embodiment will be described with reference to FIGS. 53 and 54. The twenty-first embodiment includes a sub wavelength converting member 901332 arranged differently from the eighth embodiment. Configurations, functions, and effects similar to those of the eighth embodiment will not be described.

Figure 53:
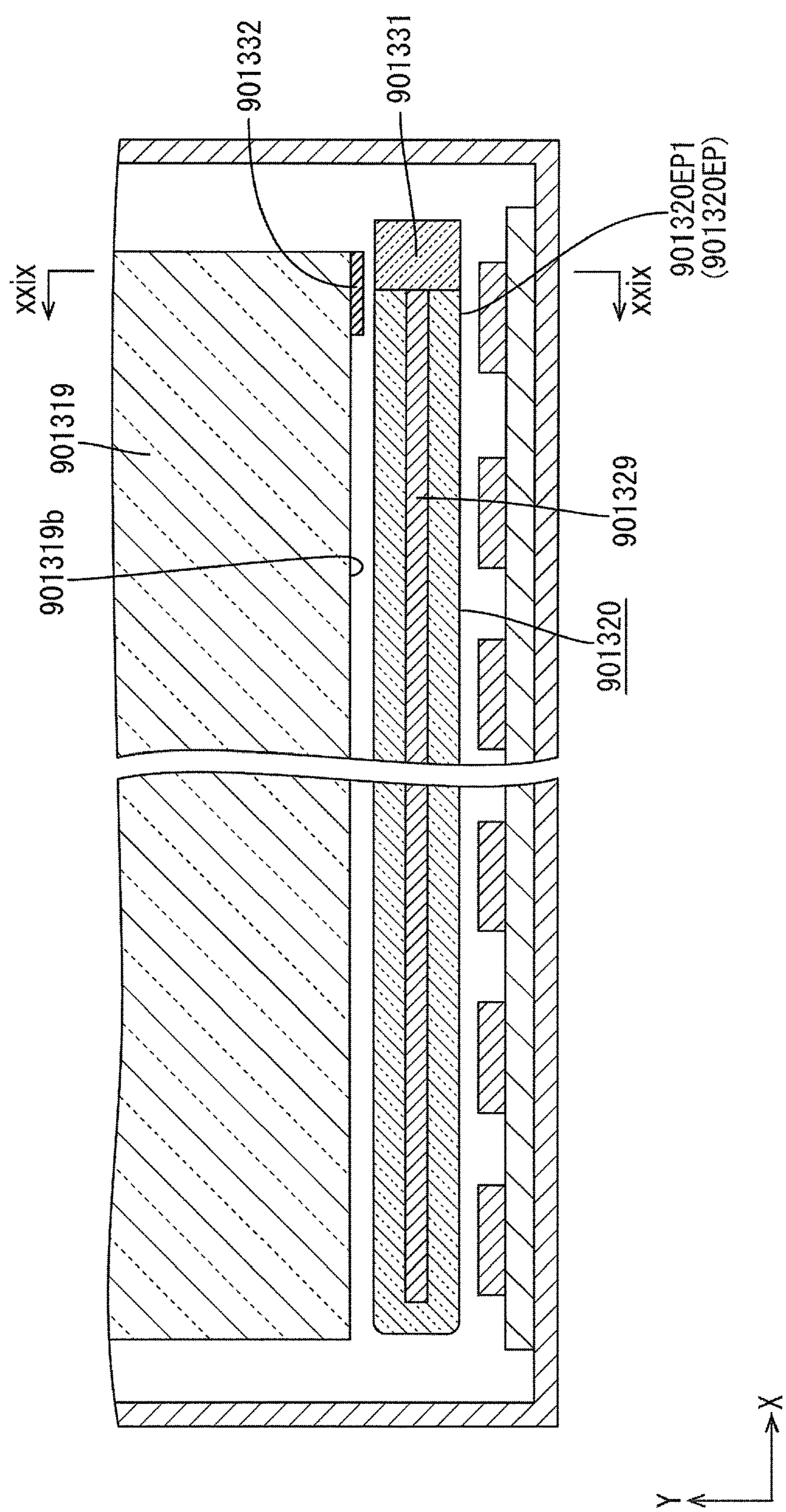
FIG. 53 is a magnified cross-sectional plan view of a backlight unit according to a twenty-first embodiment of the present invention.
Figure 54:
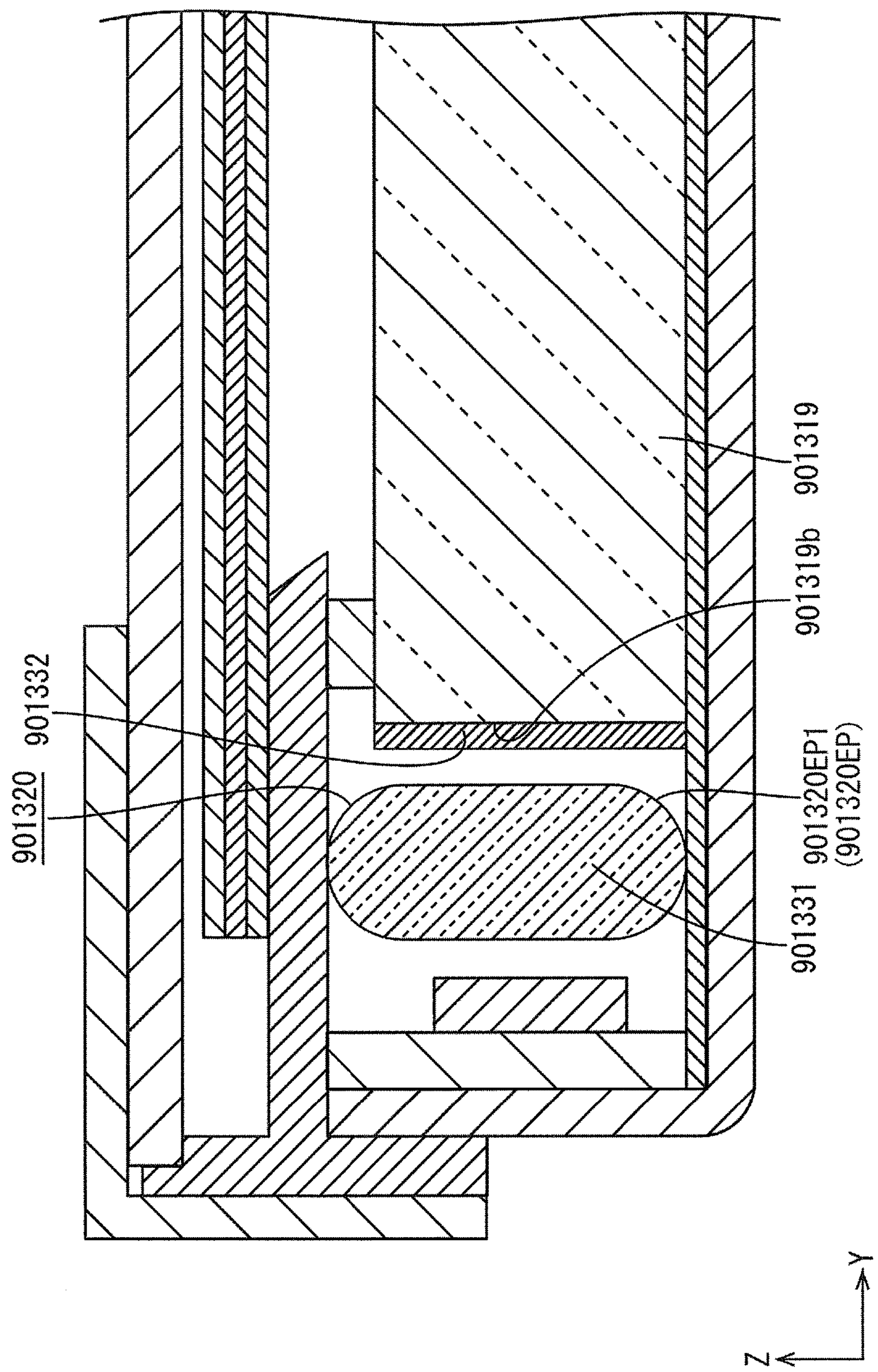
FIG. 54 is a cross-sectional view along line xxix-xxix.

AS illustrated in FIGS. 53 and 54, the sub wavelength converting member 901332 in this embodiment is disposed on a light entering end surface 901319*b* of a light guide plate 901319. The sub wavelength converting member 901332 is disposed over an end section of the light entering end surface 901319*b* at an end with respect to a length direction (the X-axis direction) on an outer side (a main wavelength converting member 901320 side). The end section of the light entering end surface 901319*b* with respect to the length direction and the sub wavelength converting member 901332 disposed over the send section overlap a sealing member disposed end portion 901320EP that is an end portion 901320EP of the main wavelength converting member 901320 with respect to the length direction. A sealing member disposed end portion 901320EP1 of the main wavelength converting member 901320 includes a sealing member that is a portion in which a phosphor containing member 901329 is not disposed. Therefore, light rays that have passed through the sealing member disposed end portion 901320EP1 and reached the end section of the light entering end surface 901319*b* may include a large number of blue light rays without the wavelength conversion. Even so, the light rays that travel to the end section of the light entering end surface 901319*b* pass through the sub wavelength converting member 901332 disposed in the end section. Therefore, the blue light rays without the wavelength conversion are converted into green light rays and red light rays by the sub wavelength converting member 901332. According to the configuration, the light rays entering the end section of the light entering end surface 901319*b* are less likely to become bluish and thus occurrence of color unevenness can be properly reduced. The sub wavelength converting member 901332 is disposed to overlap not only a sealing member 901331 with respect to the X-axis direction but also an end of the phosphor containing member 901329 with respect to the X-axis direction. Therefore, even if the light rays that have passed through the sealing member 901331 include light rays that are refracted and travel at angles, the light rays can be wavelength converted. This embodiment does not include the end surface reflection member 9034 included in the eighth embodiment.

<Twenty-Second Embodiment>

A twenty-second embodiment will be described with reference to FIG. 55. The twenty-second embodiment includes sub wavelength converting members 902432, the number of which is different from that of the twenty-first embodiment. Configurations, functions, and effects similar to those of the twenty-first embodiment will not be described.

Figure 55:
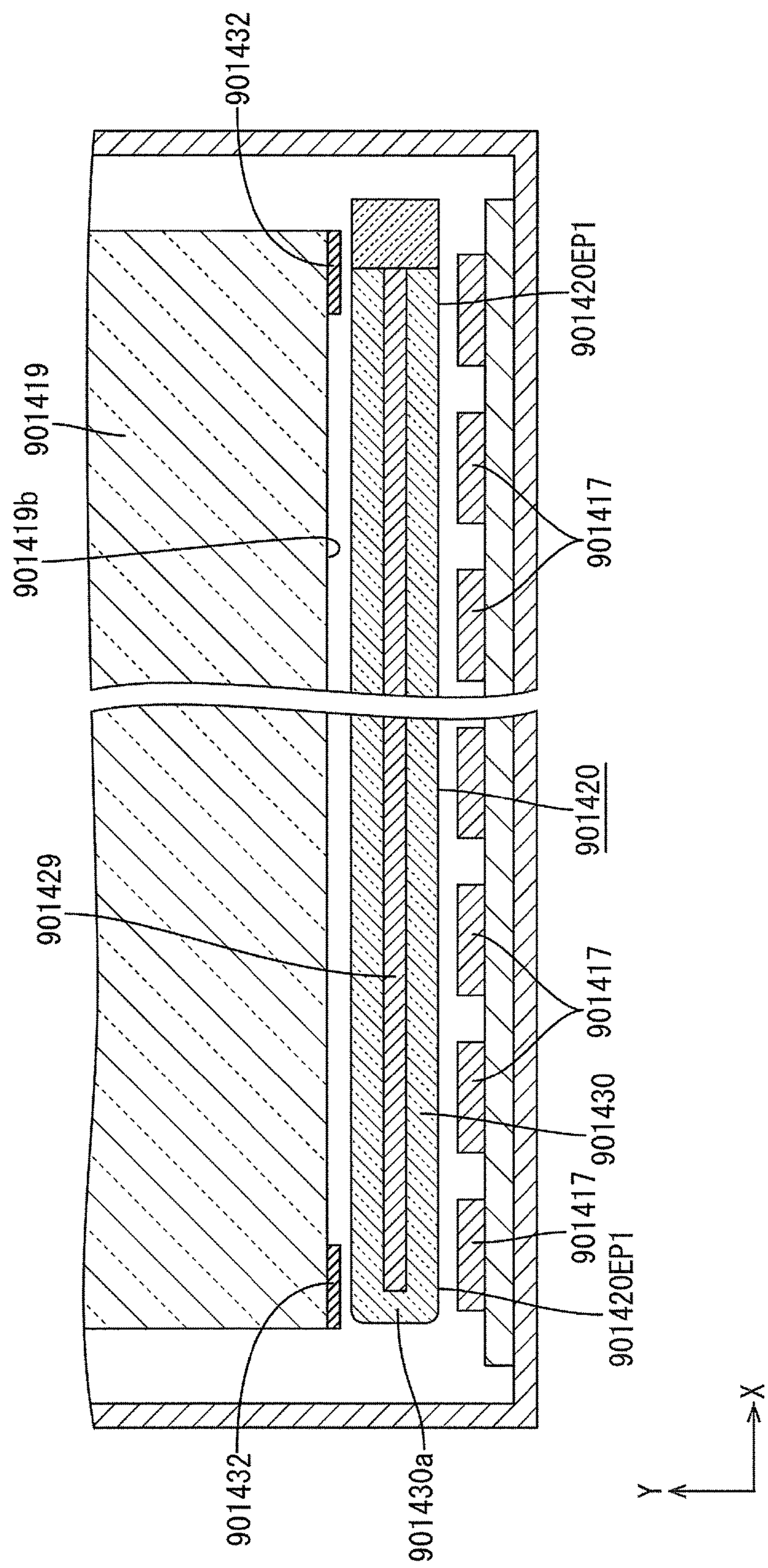
FIG. 55 is a magnified cross-sectional plan view of a backlight unit according to a twenty-second embodiment of the present invention.

As illustrated in FIG. 55, an LED 901417 (an end light source) at an end where a sealing member non-disposed end portion 901420EP2 of a main wavelength converting member 901420 is disposed among LEDs 901417 in this embodiment partially overlap a bottom 901430*a* of a container 901430 with respect to the X-axis direction. The bottom 901430*a* is a section of the sealing member non-disposed end portion 901420EP2 of the main wavelength converting member 901420 in which a phosphor containing member 901429 is not disposed. This arrangement is similar to that in the ninth embodiment. In such an arrangement, sub wavelength converting members 901432 are disposed in an end section of a light entering end surface 901419*b* of a light guide plate 901419 overlapping a sealing member disposed end portion 901420EP1 with respect to the X-axis direction and in an end section overlapping the sealing member non-disposed end portion 901420EP with respect to the X-axis direction. Namely, the sub wavelength converting members 901432 are disposed on the outer side of the light guide plate 901419 (on a main wavelength converting member 901420 side) to overlap the end sections of the light entering end surface 901419*b* with respect to the length direction.

The bottom 901430*a* of the container 901430, which is the section of the sealing member non-disposed end portion 901420EP2 of the main wavelength converting member 901420 in which the phosphor containing member 901429 is not disposed overlaps the LED 901417 at the end with respect to the X-axis direction. According to the configuration, light rays that have passed through the sealing member non-disposed end portion 901420EP2 of the main wavelength converting member 901420 in the X-axis direction may include blue light rays without the wavelength conversion by the phosphors. Even so, the light rays that have passed through the sealing member non-disposed end portion 901420EP2 pass through the sub wavelength converting member 901432 disposed thereat. Therefore, the blue light rays without the wavelength conversion are converted into the green light rays and the red light rays. The light rays entering the end sections of the light entering end surface 901419*b* are less likely to become bluish and thus the occurrence of color unevenness is properly reduced.

<Twenty-Third Embodiment>

A twenty-third embodiment will be described with reference to FIG. 56. The twenty-third embodiment includes LED boards 901518, the number of which is different from that of the tenth embodiment. Configurations, functions, and effects similar to those of the tenth embodiment will not be described.

Figure 56:
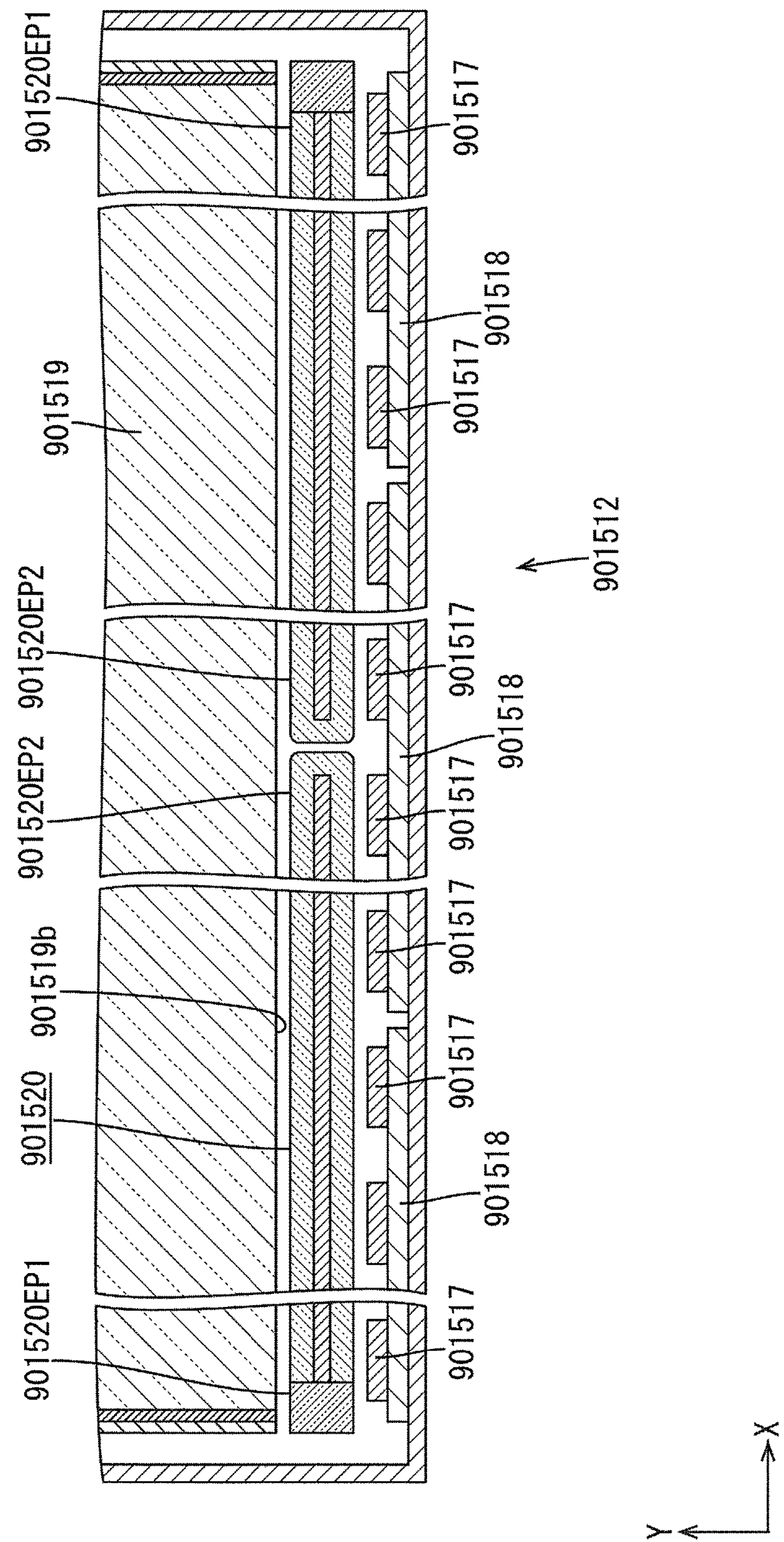
FIG. 56 is a magnified cross-sectional plan view of a backlight unit according to a twenty-third embodiment of the present invention.

As illustrated in FIG. 56, three LED boards 901518 are arranged adjacent to one another along a length direction of a light entering end surface 901519*b* of a light guide plate 901519 (the X-axis direction). The LED boards 901518 have a length smaller than a length of main wavelength converting members 901520. Some of LEDs 901517 mounted on the LED boards 901518 at ends with respect to the X-axis direction (the LEDs 901517 at ends with respect to the X-axis direction in a backlight unit 901512) are disposed to overlap sealing member disposed end portions 901520EP1 of the main wavelength converting members 901520 with respect to the X-axis direction. Some of the LEDs 901517 mounted on the LED board 901518 in the middle with respect to the X-axis direction (the LEDs 901517 in the middle with respect to the X-axis direction in the backlight unit 901512) are disposed to overlap sealing member non-disposed end portions 901520EP2 of the main wavelength converting members 901520 with respect to the X-axis direction. This configuration is preferable for a backlight unit 901412 that is large in size.

<Other Embodiments>

The present invention is not limited to the above embodiments described in the above sections and the drawings. For example, the following embodiments may be included in technical scopes of the present invention.

(1) In the above embodiments, one of the long end surfaces is defined as the light entering surface. However, the present invention is not limited to such a configuration. For example, two long end surfaces may be defined as light entering surfaces. Alternatively, one or two short end surfaces may be defined as light entering surfaces.

(2) In the above embodiments, the dots of the light reflecting and scattering pattern have the round shapes in a plan view. However, the present invention is not limited to the round shapes. The dots may be formed in other shapes, such as polygonal shapes, oval shapes, and irregular shapes.

(3) In the above embodiments, the LEDs configured to emit the light rays in a single color of blue are used for the light sources that emit the primary light rays. However, LEDs configured to emit light rays in a color other than blue may be used for the light sources. For example, LEDs configured to emit magenta light rays as primary light rays may be used. In this case, a phosphor tube (a wavelength converting member, a wavelength converting portion) containing green phosphors may be used so that a lighting unit emit white light. In this case, complementary color dots that exhibit green may be used.

(4) Other than above (3), LEDs configured to emit purple light rays as primary light rays may be used for light sources. In this case, a phosphor tube (a wavelength converting member, a wavelength converting portion) containing yellow phosphors and green phosphors with a predefined content ratio may be used. According to the configuration, the lighting unit can emit white light. In this case, complementary color dots that exhibit a complementary color of violet may be used.

(5) Other than above (3) and (4), LEDs configured to cyan light rays as primary light rays may be used for light sources. In this case, a phosphor tube (a wavelength converting member, a wavelength converting red phosphors may be used so that a lighting unit emits white light. In this case, complementary color dots that exhibit a complementary color of cyan (red) may be used.

(6) The quantum dot phosphors used as the phosphors included in the phosphor tube (the wavelength converting member, the wavelength converting portion) may be core-shell type phosphors or core type quantum dot phosphors each having a single internal composition.

(7) In each of the above embodiments, the quantum dot phosphors are included in the phosphor tube (the wavelength converting member, the wavelength converting portion). However, phosphor tubes including other types of phosphors may be used. For example, a phosphor tube (a wavelength converting member, a wavelength converting portion) including sulfide phosphors may be used. Specifically, $SrGa_2S_4:Eu^{2+}$ may be used for the green phosphors and (Ca, Sr, Ba)$S:Eu^{2+}$ may be used for the red phosphors.

(8) Other than above (7), (Ca, Sr, Ba)$_3SiO_4:Eu^{2+}$, β-SiAlON:$Eu^{2+}$, or $Ca_3Sc_2Si_3O_{12}:Ce^{3+}$ may be used for the green phosphors contained in the phosphor tube (the wavelength converting member). (Ca, Sr, Ba)$_2SiO_5N_8Eu^{2+}$ or $CaAlSiN_3:Eu^{2+}$ may be used for the red phosphors contained in the phosphor tube (the wavelength converting member). (Y, Gd)$_3$(Al, Ga)$_5O_{12}:Ce^{3+}$ (so-called YAG:$Ce^{3+}$), α-SiAlON:$Eu^{2+}$, or (Ca, Sr, Br)$_3SiO_4:Eu^{2+}$ may be used for the yellow phosphors contained in the phosphor tube (the wavelength converting member). Other than the above, a complex fluoride fluorescent material (e.g., manganese-activated potassium fluorosilicate ($K_2TiF_6$)) may be used for the phosphors contained in the phosphor tube (the wavelength converting member).

(9) Other than above (7) and (8), organic phosphors may be used for the phosphors contained in the phosphor tube (the wavelength converting member, the wavelength converting portion). The organic phosphors may be low molecular organic phosphors including triazole or oxadiazole as a basic skeleton.

(10) Other than above (7), (8), and (9), phosphors configured to convert wavelengths through energy transfer via dressed photons (near-field light) may be used for the phosphors contained in the phosphor tube (the wavelength converting member, the wavelength converting portion). Preferable phosphors of this kind may be phosphors including zinc oxide quantum dots (ZnO-QD) with diameters from 3 nm to 5 nm (preferably about 4 nm) and DCM pigments dispersed in the zinc oxide quantum dots.

(11) In each of the above embodiments, InGaN is used for the material of the LED components in the LEDs. However, GaN, AlGaN, GaP, ZnSe, ZnO, or AlGaInP may be used for the material of the LED components.

(12) In each of the above embodiments, for the phosphors contained in the phosphor tube (the wavelength converting member, the wavelength converting portion), the green phosphors and the red phosphors are used. The green phosphors emit the green light rays (the secondary light rays) when excited by the blue light rays (the primary light rays). The red phosphors emit the red light rays (the secondary light rays) when excited by the blue light rays (the primary light rays). The present invention is not limited to those. For example, yellow phosphors that emit yellow light rays as secondary light rays when excited by the blue light rays that are the primary light rays. The wavelength converting members according to the present invention can have any configurations as long as they contain at least the green phosphors that emit the green light rays as the secondary light rays when excited by the blue light rays that are the primary light rays, the red phosphors that emit the red light rays as the secondary light rays when excited by the blue light rays that are the primary light rays, or the yellow phosphors that emit the yellow light rays as the secondary light rays when excited by the blue light rays that are the primary light rays. Examples of the yellow phosphors include (Y, Gd)$_3$(Al, Ga)$_5O_{12}:Ce^{3+}$ (so-called YAG:$Ce^3$), α-SiAlON:$Eu^{2+}$, and (Ca, Sr, Br)$_3SiO_4:Eu^{2+}$.

(13) In the above embodiments, the complementary color members 23 containing the phosphors having the wavelength converting functions and complementary color members 23A configured to selectively absorb the primary light rays are separately used. However, the present invention is not limited to such a configuration. For example, the complementary color members 23 and the complementary color members 23A may be used in combination.

(14) In each of the above embodiments, the sealing member disposed end portion of the main wavelength converting member projects outer than the non-light entering end surface of the light guide plate in the length direction of the light entering end surface. However, the sealing member disposed end portion of the main wavelength converting member may be located inner than the non-light entering end surface of the light guide plate in the X-axis direction (so that the sealing member disposed end portion does not to overlap). In this case, if a sub wavelength converting member is disposed on the non-light entering end surface of the light guide plate, the sub wavelength converting member is located outer than the sealing member disposed end portion in the length direction of the light entering end surface.

(15) In each of the above embodiments, the sealing member non-disposed end portion of the main wavelength converting member is located inner than the non-light entering end surface of the light guide plate (so that the sealing member non-disposed end portion does not overlap). However, the sealing member non-disposed end portion of the main wavelength converting member may project outer than the non-light entering end surface of the light guide plate in the X-axis direction. In this case, if a sub wavelength converting member is disposed on the non-light entering end surface of the light guide plate, the sub wavelength converting member is located to overlap the sealing member non-disposed end portion in the length direction of the light entering end surface.

(16) The positional relationship among the sealing member disposed end portion and the sealing member non-disposed end portion of the main wavelength converting member and the LEDs with respect to the length direction of the light entering end surface may be altered as appropriate from each of the above embodiments.

(17) In each of the eighth to the twentieth embodiment and the twenty-third embodiment, the sub wavelength converting member and the end surface reflection member are disposed for the entire area (the entire length and the entire height) of the non-light entering end surface of the light guide plate. However, the sub wavelength converting member and the end surface reflection member may be disposed a section of the non-light entering end surface of the light guide plate in the length direction and the height direction. In this case, it is preferable to dispose the sub wavelength converting member and the end surface reflection member in a section of the non-light entering end surface closer to the LEDs. Alternatively, the sub wavelength converting member and the end surface reflection member may be disposed to overlap corners of the peripheral end surface of the light guide plate. The end surface reflection member may be omitted.

(18) In each of the eighth to the twentieth embodiment and the twenty-third embodiment, the sub wavelength converting member and the end surface reflection member have substantially the same size. However, the sub wavelength converting member and the end surface reflection member may have different sizes. In this case, the sub wavelength converting member may be larger in size than the end surface reflection member or the end surface reflection member may be larger in size than the sub wavelength converting member.

(19) In the eleventh embodiment, the light exiting plate surface sub wavelength converting member and the light exiting surface end surface reflection member disposed on the light exiting plate surface of the light guide plate have substantially the same size. However, the light exiting plate surface sub wavelength converting member and the light exiting surface end surface reflection member may have different sizes. In this case, the light exiting plate surface sub wavelength converting member may be large in size than the light exiting surface end surface reflection member or the light exiting surface end surface reflection member may be larger in size than the light exiting plate surface sub wavelength converting member. When the light exiting plate surface sub wavelength converting member is larger than the light exiting surface end surface reflection member, the light exiting plate surface sub wavelength converting member may be disposed to partially overlap the effective emission area.

(20) The positional relationship among the sub wavelength converting member disposed on the light entering end surface, the sealing member disposed end portion and the sealing member non-disposed end portion of the main wavelength converting member, and the LEDs with respect to the length direction of the light entering end surface may be altered from the twenty-first embodiment or the twenty-second embodiment.

(21) The configuration of the eleventh embodiment in which the light exiting plate surface sub wavelength converting member and the light exiting plate surface end surface reflection member are disposed on the light exiting plate surface may be applied to each of the eighth to the twentieth embodiment and the twenty-third embodiment replacing the sub wavelength converting member and the end surface reflection member. Specifically, the light exiting plate surface sub wavelength converting member and the light exiting plate surface end surface reflection member may be disposed in a section of the light exiting plate surface of the light guide plate overlapping one or both of the sealing member disposed end portion and the sealing member non-disposed end portion of the main wavelength converting member with respect to the length direction of the light entering end surface.

(22) The arrangement of the main wavelength converting member and the configuration of the eleventh embodiment in which the light exiting plate surface sub wavelength converting member and the light exiting plate surface end surface reflection member are disposed on the light exiting plate surface may be combined with the configuration of each of the twenty-first embodiment and the twenty-second embodiment.

(23) The configuration of the twenty-first embodiment in which the sub wavelength converting member is disposed on the light entering end surface may be combined with the configuration of the eighth embodiment.

(24) The configuration of the twenty-second embodiment in which the sub wavelength converting members are disposed on the light entering end surface may be combined with the configuration of each of the ninth to the eleventh embodiments. Specifically, to combine the eleventh embodiment with the twenty-second embodiment, it is preferable to dispose the sub wavelength converting members at ends in the length direction of the light entering end surface and in the middle in the length direction of the light entering end surface.

(25) The configuration of the twenty-third embodiment may be combined with the configuration of each of the eleventh and the twenty-second embodiment.

(26) The holding structure of the main wavelength converting member in the sixteenth embodiment may be combined with the configuration of each of the ninth to the fifteenth embodiments and the seventeenth to the twenty-third embodiments.

(27) Other than above (22) to (26), the configurations of the embodiments may be combined with one another as appropriate.

(28) Other than the above embodiments, three or more main wavelength converting members may be arranged along the length direction of the light entering end surface.

(29) In each of the above embodiments, the main wavelength converting member has a single-end sealing structure in which only one end is sealed. However, the present invention can be applied to main wavelength converting members having a double-end sealing structure in which both ends are sealed with sealing members.

(30) Each of the above embodiments (except for the twenty first and the twenty-second embodiments) includes the end surface reflection member. However, the end surface reflection member may be omitted and at least the side portion of the chassis may be provided in white having high light reflectivity to reflect the light rays that have passed the sub wavelength converting member by the side portion to return the light rays to the light guide plate. Namely, by disposing the side portion of the chassis having the light reflectivity to overlap the sub wavelength converting member on the outer side (an opposite side from the non-light entering end surface side), the end surface reflection member can be omitted. In this case, it is preferable to dispose the side portion having the light reflectivity in contact with the sub wavelength converting member.

EXPLANATION OF SYMBOLS

10: Liquid crystal display device (Display device)
12: Lighting unit (Backlight unit)
13: Bezel
14: Chassis
15: Optical member
16: Frame
17: LED (Light source)
170: LED array (Light source array)
18: LED board
19: Light guide plate
19*a*: Light exiting surface
19*b*: Back surface
19*c*: Light entering surface
20: Reflection sheet (Reflecting member)
21: Elastic member
220: Light reflecting and scattering pattern
22: Dot
22*a*: Complementary color dot
22*b*: White dot
30: Phosphor tube (Wavelength converting member)
31: Wavelength converting portion
32: Holding portion
34, 35: Sealing end (Non-wavelength converting portion)

The invention claimed is:

1. A lighting device comprising:

a light source array comprising a plurality of light sources configured to emit primary light rays in a predefined wavelength range and arranged in line; and at least one wavelength converting member disposed along a length direction of the light source array to he opposed to the light source array, the at least one wavelength converting member comprising:

a wavelength converting portion containing phosphors configured to emit secondary light rays in a wavelength range different from the wavelength range when excited by blue light rays;

a holding portion holding the wavelength converting portion to surround the wavelength converting portion and having light transmissivity and an elongated shape; and a non-wavelength converting portion formed at an end of the holding portion with respect to a longitudinal direction of the holding portion and configured to pass the primary light rays emitted by the light sources; and a light guide plate, wherein the at least one wavelength converting member is disposed between the light guide plate and the light source array, the light guide plate comprises:

a light entering surface through which light rays enter, the light rays including the primary light rays and the secondary light rays converted from the primary light rays emitted by the light sources and traveling through the at least one wavelength converting member from a light source side to a light guide plate side;

a light exiting surface through which the light rays exit;

an opposite surface disposed on an opposite side from the light exiting surface; and a light reflecting and scattering pattern having light reflectivity and a light scattering property, the light reflecting and scattering pattern including a plurality of dots formed to be two-dimensionally dispersed on the opposite surface, some of the dots being complementary color dots disposed along a light emitting direction of the light source on a light guide plate side of the non-wavelength converting portion and configured to absorb the primary light rays and exhibit a complementary color of a reference color exhibited by the primary light rays.

2. The lighting device according to claim 1, wherein the light reflecting and scattering pattern is defined such that a density per unit area on the opposite surface gradually increases as a distance from the light entering surface increases.

3. The lighting device according to claim 1, wherein the wavelength converting portion of the at least one wavelength converting member includes the phosphors dispersed in a transparent resin, the holding portion of the at least one wavelength converting member is a tube with closed ends, and the non-wavelength converting portion of the at least one wavelength converting member is at least one of the closed ends of the tube.

4. The lighting device according to claim 1, wherein the non-light converting portion that is the end of the at least one wavelength converting member is disposed closer to an adjacent end surface of the light guide plate adjacent to the light entering surface, the complementary color dots are formed on the opposite surface along an adjacent end portion of the light guide plate including the adjacent end surface, the at least one wavelength converting member includes wavelength converting members, the wavelength converting members are disposed in line in a longitudinal direction in a space between the light source array and the light entering surface, and the complementary color dots are formed on the opposite surface across the opposite surface along a light emitting direction of the light sources from a section in which the wavelength converting members are adjacent to each other.

5. A display device comprising:

a lighting device according to claim 1; and a display panel configured to display an image using light from the lighting device.

6. A television device comprising the display device according to claim 5.

7. A lighting device comprising:

a light source array comprising a plurality of light sources configured to emit primary light rays in a predefined wavelength range and arranged in line; and at least one wavelength converting member disposed along a length direction of the light source array to be opposed to the light source array, the at least one wavelength converting member comprising:

a wavelength converting portion containing phosphors configured to secondary light rays in a wavelength range different from the wavelength range when excited by blue light rays;

a holding portion holding the wavelength converting portion to surround the wavelength converting portion and having light transmissivity and an elongated shape; and a non-wavelength converting portion formed at an end of the holding portion with respect to a longitudinal direction of the holding portion and configured to pass the primary light rays emitted by the light sources; and a light guide plate, wherein the at least one wavelength converting member is disposed between the light guide plate and the light source array, the light guide plate comprises:

a light entering surface through which light rays enter, the light rays including the primary light rays and the secondary light rays converted from the primary light rays emitted by the light sources and traveling through the at least one wavelength converting member from a light source side to a light guide plate side;

a light exiting surface through which the light rays exit; and an opposite surface disposed on an opposite side from the light exiting surface, and. the lighting device further comprises:

a reflection member disposed to cover the opposite surface and configured to reflect light rays; and a complementary color member configured to exhibit a complementary color of a reference color exhibited by the primary light rays and disposed between the opposite surface and the reflection member to overlap a section of the opposite surface extending from the non-wavelength converting portion in a light emitting direction of the light sources.

8. The lighting device according to claim 7, wherein the wavelength converting portion of the at least one wavelength converting member includes the phosphors dispersed in a transparent resin, the holding portion of the at least one wavelength converting member is a tube with closed ends, and the non-wavelength converting portion of the at least one wavelength converting member is at least one of the closed ends of the tube.

9. The lighting device according to claim 7, wherein the non-light converting portion that is the end of the at least one wavelength converting member is disposed closer to an adjacent end surface of the guide plate adjacent to the light entering surface, and the complementary color member is disposed between the opposite surface and the reflection member along an adjacent end portion of the light guide plate including the adjacent end surface.

10. The lighting device according to claim 7, wherein the at least one wavelength converting member includes wavelength converting members, the wavelength converting members are disposed in line in a longitudinal direction in a space between the light source array and the light entering surface, and the complementary color member is disposed between the opposite surface and the reflection member across the opposite surface along a light emitting direction of the light sources from a section in which the wavelength converting members are adjacent to each other.

11. The lighting device according to claim 1, wherein the phosphors contained in the wavelength converting portion are quantum dot phosphors.

* * * * *